US011362757B2

(12) United States Patent
Kimura et al.

(10) Patent No.: US 11,362,757 B2
(45) Date of Patent: Jun. 14, 2022

(54) APPARATUS INCLUDING A TRANSMISSION PROCESSING UNIT THAT GENERATES TRANSMISSION SIGNAL SEQUENCES OF MULTIPLE POWER LAYERS

(71) Applicant: Sony Corporation, Tokyo (JP)

(72) Inventors: Ryota Kimura, Tokyo (JP); Hiroaki Takano, Saitama (JP); Ryo Sawai, Tokyo (JP); Shinichiro Tsuda, Tokyo (JP)

(73) Assignee: SONY CORPORATION, Tokyo (JP)

( * ) Notice: Subject to any disclaimer, the term of this patent is extended or adjusted under 35 U.S.C. 154(b) by 15 days.

(21) Appl. No.: 16/879,776

(22) Filed: May 21, 2020

(65) Prior Publication Data

US 2020/0287652 A1 Sep. 10, 2020

Related U.S. Application Data

(63) Continuation of application No. 15/552,609, filed as application No. PCT/JP2016/050035 on Jan. 4, 2016, now abandoned.

(30) Foreign Application Priority Data

Mar. 26, 2015 (JP) .............................. JP2015-064714

(51) Int. Cl.
*H04W 4/00* (2018.01)
*H04J 99/00* (2009.01)
(Continued)

(52) U.S. Cl.
CPC ............. *H04J 15/00* (2013.01); *H03M 13/27* (2013.01); *H04L 1/0041* (2013.01);
(Continued)

(58) Field of Classification Search
None
See application file for complete search history.

(56) References Cited

U.S. PATENT DOCUMENTS

2002/0051433 A1 5/2002 Affes et al.
2002/0115464 A1* 8/2002 Hwang ................. H04W 52/40
455/436
(Continued)

FOREIGN PATENT DOCUMENTS

CN 104321990 A 1/2015
EP 1335512 A2 8/2003
(Continued)

OTHER PUBLICATIONS

Tong J et al: "Performance analysis of superposition coded modulation", Physical Communication, Elsevier, Amsterdam, NL, vol. 3, No. 3, Sep. 1, 2010 (Sep. 1, 2010), pp. 147-155, XP027194084, ISSN: 1874-4907 [retrieved on Aug. 28, 2009] * sections 1, 2.1 and 4.3.3 * * figure Ib *.

(Continued)

*Primary Examiner* — Gerald A Smarth
(74) *Attorney, Agent, or Firm* — Xsensus LLP

(57) ABSTRACT

An apparatus including: a first transmission processing unit that generates transmission signal sequences of multiple power layers that are to be multiplexed using power allocation; and a second transmission processing unit that processes a transmission signal sequence of a power layer using an interleaver, a scrambler, or a phase coefficient corresponding to the power layer for each of one or more of the multiple power layers. The apparatus improves accuracy of decoding of a desired signal when multiplexing/multiple access is performed using power allocation.

18 Claims, 40 Drawing Sheets

(51) Int. Cl.
H04L 27/01 (2006.01)
H03M 13/27 (2006.01)
H04L 1/00 (2006.01)
H04W 84/04 (2009.01)

(52) U.S. Cl.
CPC .......... *H04L 1/0071* (2013.01); *H04L 27/01* (2013.01); *H04W 84/042* (2013.01)

(56) References Cited

U.S. PATENT DOCUMENTS

| | | | |
|---|---|---|---|
| 2003/0039217 A1* | 2/2003 | Seo | H04W 52/286 370/318 |
| 2004/0018850 A1* | 1/2004 | Ishiguro | H04W 52/325 455/522 |
| 2006/0067421 A1 | 3/2006 | Walton et al. | |
| 2007/0195907 A1 | 8/2007 | Wang et al. | |
| 2007/0250638 A1 | 10/2007 | Kiran | |
| 2007/0286238 A1 | 12/2007 | Wang | |
| 2008/0225965 A1 | 9/2008 | Pi et al. | |
| 2008/0310531 A1 | 12/2008 | Bai et al. | |
| 2008/0316950 A1 | 12/2008 | Damnjanovic | |
| 2009/0034629 A1 | 2/2009 | Suh et al. | |
| 2009/0227278 A1* | 9/2009 | Cho | H04L 1/0028 455/522 |
| 2009/0318183 A1* | 12/2009 | Hugl | H04W 52/42 455/522 |
| 2010/0014486 A1 | 1/2010 | Kishiyama et al. | |
| 2010/0029319 A1* | 2/2010 | Higuchi | H04W 52/48 455/522 |
| 2010/0029320 A1 | 2/2010 | Malladi et al. | |
| 2010/0091718 A1 | 4/2010 | Ho et al. | |
| 2010/0128805 A1* | 5/2010 | Tanno | H04J 11/0069 375/260 |
| 2010/0167779 A1 | 7/2010 | Kapoor et al. | |
| 2013/0142158 A1 | 6/2013 | Hamaguchi et al. | |
| 2013/0145239 A1 | 6/2013 | Pi et al. | |
| 2013/0195008 A1 | 8/2013 | Pelletier et al. | |
| 2014/0119352 A1 | 5/2014 | Matsumoto et al. | |
| 2015/0171983 A1 | 6/2015 | Kusashima | |
| 2015/0215874 A1* | 7/2015 | Chen | H04W 16/14 455/522 |
| 2017/0033901 A1* | 2/2017 | Tavildar | H04L 45/245 |

FOREIGN PATENT DOCUMENTS

| | | |
|---|---|---|
| JP | 9-18443 A | 1/1997 |
| JP | 2003-78419 A | 3/2003 |
| JP | 2003-229835 A | 8/2003 |
| JP | 2010/521916 A | 6/2010 |
| JP | 2010-278974 A | 12/2010 |
| JP | 2012/253600 A | 12/2012 |
| JP | 2013-247513 A | 12/2013 |
| WO | 2008/023598 A1 | 2/2008 |
| WO | 2013176042 A1 | 11/2013 |
| WO | 2014/119419 A1 | 8/2014 |

OTHER PUBLICATIONS

Li Ping et al: "Recent Progress in Interleave-Divi si on Multiple-Access (I DMA)", Military Communications Conference, 2007. MILCOM 2007. IEEE, IEEE, Piscataway, NJ, USA, Oct. 29, 2007 (Oct. 29, 2007), pp. 1-7, XP031232684, ISBN: 978-1-4244-1512-0 * p. 2-p. 3 *.
Peng Wang et al: "Optimized Power Allocation for Multiple Access Systems with Practical Coding and Iterative Multi-User Detection", 4th International Symposium on Turbo Codes 6 Related Topics; 6th International ITG-Conference on Source and Channel Coding, Apr. 7, 2006 (Apr. 7, 2006), pp. 1-6, XP055514961, * sections 2.1 and 3.4 * * figure 1; table 1 *.
Pascal Scalart et al: "Performance Analysis of a COFDM/FM In-band Digital Audio Broadcasting System", IEEE Transactions on Broadcasting, IEEE Service Center, Piscataway, NJ, US, vol. 43, No. 2, Jun. 1, 1997 (Jun. 1, 1997), pp. 191-198, XPO11OO6O70, ISSN: 0018-9316, DOI: 10.1109/11.598369 * sections I , I I * * figures 1,2*.
Samsung: "LTE System Performance Improvement by Unicast/ MBMS Superposition and Interference Cancellation", 3GPP Draft; RI-061702, 3RD Generation Partnership Project (3GPP), Mobile Competence Centre ; 650, Route Des Lucioles ; F-06921 Sophia-Antipolis Cedex ; FRANCE vol. RAN WG1, No. Cannes, France; Jun. 27, 2006-Jun. 30, 2006 Jun. 20, 2006 (Jun. 20, 2006), XP050951122, Retrieved from the Internet: URL: http://www.3gpp.org/ftp/tsg_ran/WGI_RL 1/TSGR1_AH/LTE_AH_0606/Docs/ [retrieved on Jun. 20, 2006] * section 2.2 *.
Rong Zhang et al: "A Unified Treatment of Superposition Coding Aided Communications: Theory and Practice", IEEE Communications Surveys and Tutorials, Institute of Electrical and Electronics Engineers, US, vol. 13, No. 3, Jul. 1, 2011 (Jul. 1, 2011), pp. 503-520, XP011353714, ISSN: 1553-877X, D0I: 10.1109/SURV. 2011.061610.00102 * section 11-A; figure 2(b) *.
Extended European Search Report dated Mar. 27, 2019, issued in corresponding European Patent Application No. 16768078.4.
Chinese Office Action issued by SIPO in corresponding Application No. 201680016730.8, dated Oct. 16, 2018, with English translation (28 pages).
Mark S. K. Lau and Wuyi Yue—Optimal Discrete Transmitted-Power Allocation of IDMA Systems, Mem. Konan Univ., Sci. & Eng. Ser., 54(1) 1-17 (Apr. 14, 2007), 17 pages.
Singapore Search Report issued in Application No. 11201706862R, dated Sep. 14, 2018, 10 pages.
Partial European Search Report issued in Application No. 16768078. 4, dated Oct. 26, 2018, 16 pages.
Jun Tong et al., Performance Analysis of Superposition Coded Modulation—Physical Communication 3 (2010) 147-155.
Li Ping et al., Recent Progress in Interleave-Decision Multiple-Access (IDMA), (2007) 7 pages.
Peng Wang et al., Optimized Power Allocation for Multiple Access Systems with Practical Coding and Iterative Multi-User Detection, Turbo-Coding 2006—Apr. 3-7, 2006—Munich 6 pages.
Pascal Scalart et al., Performance Analysis of a COFDM/FM In-band Digital Audio Broadcasting System, IEEE Transactions on Broadcasting, vol. 43, No. 2, Jun. 1997, pp. 191-198.
Kenichi Higuchi, Non-orthogonal Multiple Access (NOMA) with Successive Interference Cancellation for Future Radio Access, IEICE Trans. Commun., vol. E98-B, No. Mar. 3, 2015 pp. 403-414.
S. Vanka et al., Superposition Coding Strategies: Design and Experimental Evaluation, IEEE Transactions on Wireless Communications, vol. 11, No. 7, Jul. 2012 pp. 2628-2639.
Peter Adam Hoeher et al., Multi-Layer Interleave-Division Multiple Access for 3GPP Long Term Evolution, IEEE Communications Society subject matter experts for publication in the ICC 2007 proceedings, pp. 5508-5513.
Mark S.K. Lau, et al., "Optimal Discrete Transmitted-Power Allocation of IDMA Systems," Memoirs of Konan University, Science and Engineering Series, vol. 54, No. 1, 2007, (19 pages).
Issei Wakai, et al., "Phase Rotation Multiplexing and Its Performance by MLD for Non-Orthogonal Multiple Access," 2015 IEICE, Mar. 10-13, 2015, (5 pages) (with English translation).
Atsushi Harada, et al., "Performance Evaluation of SIC Receiver for Downlink NOMA with Open-Loop SU-MIMO," 2014 IEICE, Sep. 23-26, 2014 (4 pages) (with English translation).
International Search Report dated Feb. 16, 2016 in PCT/JP2016/ 050035 filed Jan. 4, 2016.

* cited by examiner

APPARATUS INCLUDING A TRANSMISSION PROCESSING UNIT THAT GENERATES TRANSMISSION SIGNAL SEQUENCES OF MULTIPLE POWER LAYERS

CROSS-REFERENCE TO RELATED APPLICATIONS

The present application is a continuation of U.S. application Ser. No. 15/552,609, filed Aug. 22, 2017, which is based on PCT filing PCT/JP2016/050035, filed Jan. 4, 2016, which claims priority to JP 2015-064714, filed Mar. 26, 2015, the entire contents of each are incorporated herein by reference.

TECHNICAL FIELD

The present invention relates to an apparatus.

BACKGROUND ART

Non-orthogonal multiple access (NOMA) has been attracting attention as a radio access technology (RAT) for a fifth generation (5G) mobile communication system following Long Term Evolution (LTE)/LTE-Advanced (LTE-A). In orthogonal frequency-division multiple access (OFDMA) and single-carrier frequency-division multiple access (SC-FDMA), which are adopted in LTE, radio resources (e.g., resource blocks) are allocated to users without overlap. These schemes are called orthogonal multiple access. In contrast, in non-orthogonal multiple access, radio resources are allocated to users with overlap. In non-orthogonal multiple access, signals of users interfere with each other, but a signal for each user is taken out by a high-accuracy decoding process at the reception side. Non-orthogonal multiple access, in theory, achieves higher cell communication capability than orthogonal multiple access.

One of radio access technologies classified into non-orthogonal multiple access is superposition coding (SPC) multiplexing/multiple access. SPC is a scheme in which signals to which different levels of power are allocated are multiplexed on at least partly overlapping radio resources in frequency and time. At the reception side, interference cancellation and/or iterative detection is performed for reception/decoding of signals multiplexed on the same radio resource.

For example, PTLs 1 and 2 disclose, as SPC or a technology equivalent to SPC, techniques for setting an amplitude (or power) that allows appropriate demodulation/decoding. Moreover, for example, PTL 3 discloses a technique for enhancing successive interference cancellation (SIC) for reception of multiplexed signals.

CITATION LIST

Patent Literature

Patent Literature 1: JP 2003-78419A
Patent Literature 2: JP 2003-229835A
Patent Literature 3: JP 2013-247513A

DISCLOSURE OF INVENTION

Technical Problem

For example, fading (e.g., fading of frequency selectivity and/or time selectivity) is equally generated in multiple power layers multiplexed using SPC. Accordingly, accuracy of decoding of signals (interference signal and desired signal) of the multiple power layers decreases with respect to specific radio resources (e.g., frequency resources and/or time resources). Further, interference cancellation accuracy also decreases, and thus residual interference increases due to a decrease in accuracy of decoding of an interference signal with respect to the specific radio resources. As a result, it may be difficult to correctly decode a desired signal because residual interference increases and accuracy of decoding of the desired signal decreases with respect to the specific radio resources.

Accordingly, it is desirable to provide a system capable of improving accuracy of decoding of a desired signal when multiplexing/multiple access is performed using power allocation.

Solution to Problem

According to the present disclosure, there is provided an apparatus including: a first transmission processing unit that generates transmission signal sequences of multiple power layers that are to be multiplexed using power allocation; and a second transmission processing unit that processes a transmission signal sequence of a power layer using an interleaver, a scrambler, or a phase coefficient corresponding to the power layer for each of one or more of the multiple power layers.

In addition, according to the present disclosure, there is provided an apparatus including: an acquisition unit that acquires a deinterleaver, a descrambler or a phase coefficient corresponding to each of at least one power layer among multiple power layers that are to be multiplexed using power allocation; and a reception processing unit that performs a reception process using the deinterleaver, the descrambler or the phase coefficient corresponding to each of the at least one power layer.

Advantageous Effects of Invention

According to the above-described present disclosure, it is possible to improve decoding accuracy when multiplexing/multiple access is performed using power allocation. Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
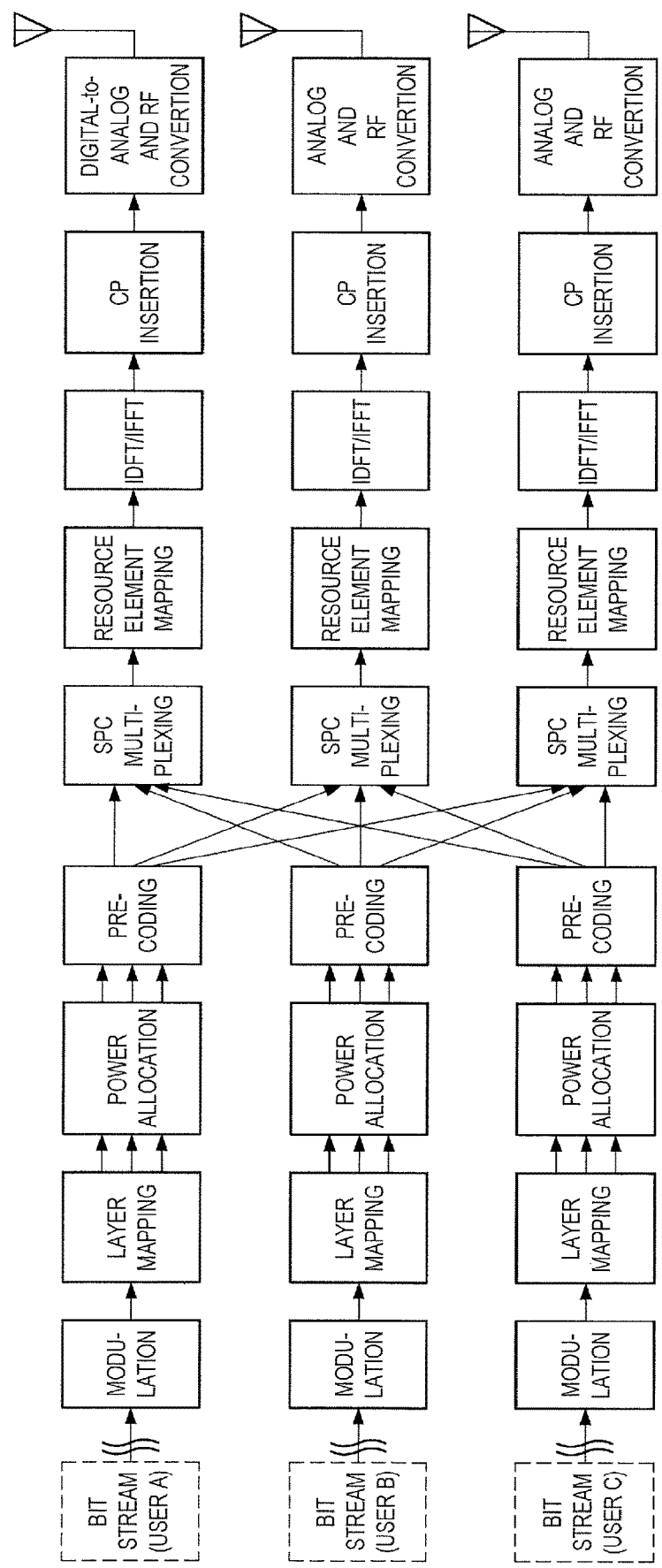
FIG. 1 is a first explanatory diagram for explaining an example of a process in a transmission device that supports SPC.

Hereinafter, (a) preferred embodiment(s) of the present disclosure will be described in detail with reference to the appended drawings. In this specification and the appended drawings, structural elements that have substantially the same function and structure are denoted with the same reference numerals, and repeated explanation of these structural elements is omitted.

Furthermore, in this specification and the appended drawings, elements having substantially the same functional configuration may be discriminated by putting different letters after the same reference numeral. For example, elements having substantially the same functional configuration are discriminated as terminal devices 200A, 200B and 200C as necessary. However, when it is unnecessary to specially discriminate between multiple elements having substantially the same functional configuration, only the same reference numeral is attached thereto. For example, when it is unnecessary to specially discriminate between the terminal devices 200A, 200B, and 200C, the terminal devices are simply called a terminal device 200.

Note that description will be provided in the following order.

1. SPC
2. Technical problem
3. Schematic configuration of communication system
4. Configuration of each device
4.1. Configuration of base station
4.2. Configuration of terminal device
5. First Embodiment
5.1. Technical features
5.2. Process flow
5.3. First modified example
5.4. Second modified example 6. Second Embodiment
6.1. Technical features
6.2. Process flow
6.3. Modified example
7. Application
7.1. Application example with regard to base station
7.2. Application example with regard to terminal device
8. Conclusion

1. SPC

Figure 2:
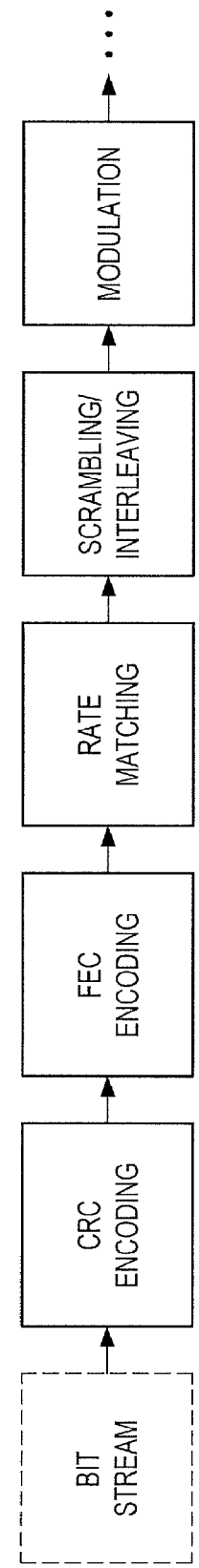
FIG. 2 is a second explanatory diagram for explaining an example of a process in a transmission device that supports SPC.
Figure 3:
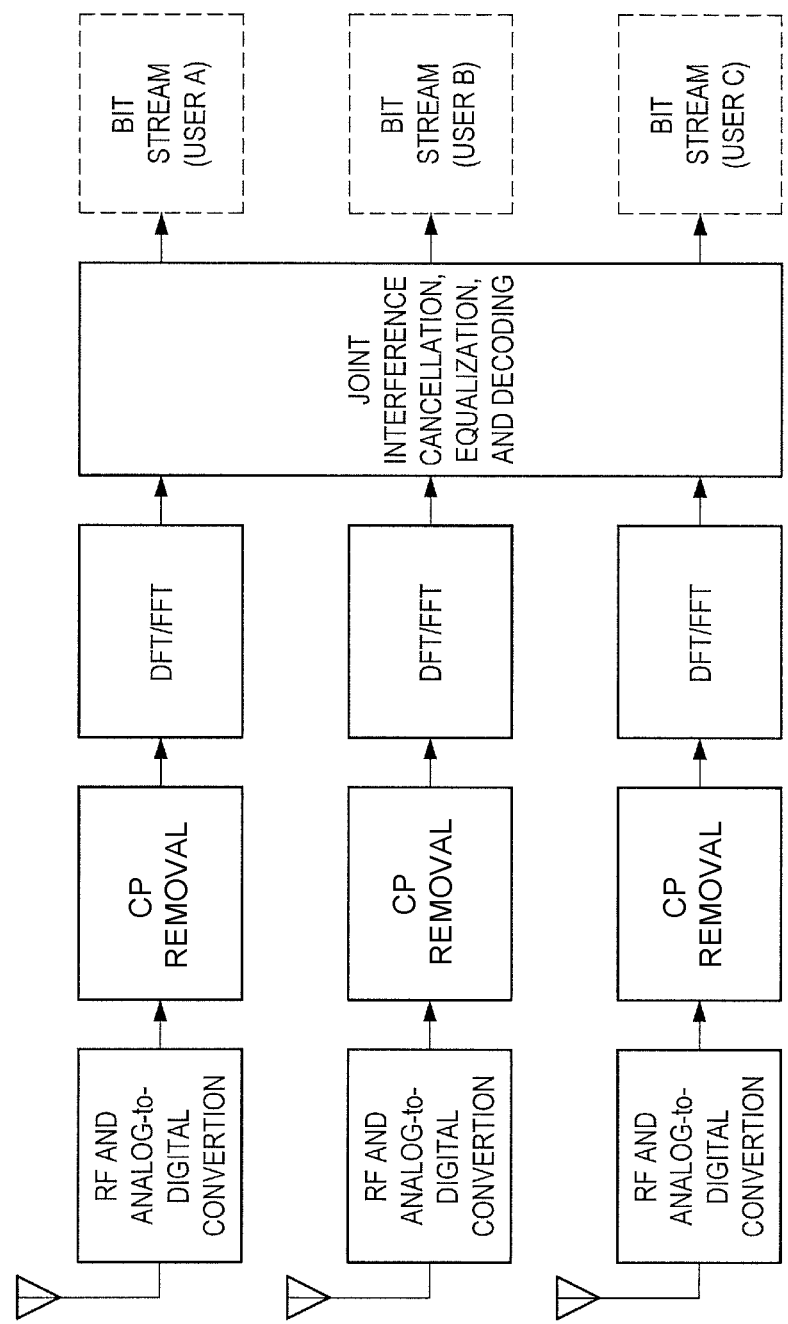
FIG. 3 is an explanatory diagram for explaining an example of a process in a reception device that performs interference cancellation.

Firstly described with reference to FIGS. 1 to 3 are processes and signals of SPC.

(1) Process in Each Device

(a) Process in Transmission Device

FIGS. 1 and 2 are explanatory diagrams for explaining an example of a process in a transmission device that supports SPC. According to FIG. 1, for example, bit streams (e.g., transport blocks) of a user A, a user B, and a user C are processed. For each of these bit streams, some processes (e.g., cyclic redundancy check (CRC) encoding, forward error correction (FEC) encoding, rate matching, and scrambling/interleaving, as illustrated in FIG. 2) are performed and then modulation is performed. Further, layer mapping, power allocation, precoding, SPC multiplexing, resource element mapping, inverse discrete Fourier transform (IDFT)/inverse fast Fourier transform (IFFT), cyclic prefix (CP) insertion, digital-to-analog and radio frequency (RF) conversion, and the like are performed.

In particular, in power allocation, power is allocated to signals of the user A, the user B, and the user C, and in SPC multiplexing, the signals of the user A, the user B, and the user C are multiplexed.

(b) Process in Reception Device

FIG. 3 is an explanatory diagram for explaining an example of a process in a reception device that performs interference cancellation. According to FIG. 3, for example, RF and analog-to-digital conversion, CP removal, discrete Fourier transform (DFT)/fast Fourier transform (FFT), joint interference cancellation, equalization, decoding, and the like are performed. This provides bit streams (e.g., transport blocks) of the user A, the user B, and the user C.

(2) Transmission Signals and Reception Signals

(a) Downlink

Next, downlink transmission signals and reception signals when SPC is adopted will be described. Assumed here is a multi-cell system of heterogeneous network (HetNet), small cell enhancement (SCE), or the like.

An index of a cell to be in connection with a target user u is denoted by i, and the number of transmission antennas of a base station corresponding to the cell is denoted by $N_{TX,i}$. Each of the transmission antennas may also be called a transmission antenna port. A transmission signal from the cell i to the user u can be expressed in a vector form as below.

$$s_{i,u} = \begin{bmatrix} s_{i,u,0} \\ \vdots \\ s_{i,u,N_{TX,i}-1} \end{bmatrix} = W_{i,u} P_{i,u} x_{i,u} \quad [\text{Math. 1}]$$

$$W_{i,u} = \begin{bmatrix} w_{i,u,0,0} & \cdots & w_{i,u,0,N_{SS,u}-1} \\ \vdots & \ddots & \vdots \\ w_{i,u,N_{TX,i}-1,0} & \cdots & w_{i,u,N_{TX,i}-1,N_{SS,u}-1} \end{bmatrix} \quad [\text{Math. 2}]$$

$$P_{i,u} = \begin{bmatrix} P_{i,u,0,0} & \cdots & P_{i,u,0,N_{SS,u}-1} \\ \vdots & \ddots & \vdots \\ P_{i,u,N_{SS,u}-1,0} & \cdots & P_{i,u,N_{SS,u}-1,N_{SS,u}-1} \end{bmatrix} \quad [\text{Math. 3}]$$

$$x_{i,u} = \begin{bmatrix} x_{i,u,0} \\ \vdots \\ x_{i,u,N_{SS,u}-1} \end{bmatrix} \quad [\text{Math. 4}]$$

In the above expressions, $N_{SS,u}$ denotes the number of spatial transmission streams for the user u. Basically, $N_{SS,u}$ is a positive integer equal to or less than $N_{TX,i}$. A vector $x_{i,u}$ is a spatial stream signal to the user u. Elements of this vector basically correspond to digital modulation symbols of phase shift keying (PSK), quadrature amplitude modulation (QAM), or the like. A matrix $W_{i,u}$ is a precoding matrix for the user u. An element in this matrix is basically a complex number, but may be a real number.

A matrix $P_{i,u}$ is a power allocation coefficient matrix for the user u in the cell i. In this matrix, each element is preferably a positive real number. Note that this matrix may be a diagonal matrix (i.e., a matrix whose components excluding diagonal components are zero) as below.

$$P_{i,u} = \begin{bmatrix} P_{i,u,0,0} & 0 & \cdots & 0 \\ 0 & P_{u,i,1,1} & \ddots & \vdots \\ \vdots & \ddots & \ddots & 0 \\ 0 & \cdots & \cdots & P_{i,u,N_{SS,u}-1,N_{SS,u}-1} \end{bmatrix} \quad [\text{Math. 5}]$$

If adaptive power allocation for a spatial stream is not performed, a scalar value $P_{i,u}$ may be used instead of the matrix $P_{i,u}$.

As well as the user u, another user v is present in the cell i, and a signal $s_{i,v}$ of the other user v is also transmitted on the same radio resource. These signals are multiplexed using SPC. A signal $s_i$ from the cell i after multiplexing is expressed as below.

$$s_i = \sum_{u' \in U_i} s_{i,u'} \quad [\text{Math. 6}]$$

In the above expression, $U_i$ denotes a set of users for which multiplexing is performed in the cell i. Also in a cell j (a cell that serves as an interference source for the user u) other than a serving cell of the user u, a transmission signal $s_j$ is generated similarly. Such a signal is received as interference at the user side. A reception signal $r_u$ of the user u can be expressed as below.

$$r_u = \begin{bmatrix} r_{u,0} \\ \vdots \\ r_{u,N_{RX,u}-1} \end{bmatrix} = \sum_{i'} H_{u,i'} s_{i'} + n_u \quad [\text{Math. 7}]$$

-continued $$H_{u,i} = \begin{bmatrix} h_{u,i,0,0} & \cdots & h_{u,i,0,N_{TX,i}-1} \\ \vdots & \ddots & \vdots \\ h_{u,i,N_{RX,u}-1,0} & \cdots & h_{u,i,N_{RX,u}-1,N_{TX,i}-1} \end{bmatrix}$$ [Math. 8]

$$n_u = \begin{bmatrix} n_{u,0} \\ \vdots \\ n_{u,N_{RX,u}-1} \end{bmatrix}$$ [Math. 9]

In the above expressions, a matrix $H_{u,i}$ is a channel response matrix for the cell i and the user u. Each element of the matrix $H_{u,i}$ is basically a complex number. A vector n, is noise included in the reception signal $r_u$ of the user u. For example, the noise includes thermal noise and interference from another system. The average power of the noise is expressed as below.

$$\sigma_{n,u}^2$$ [Math. 10]

The reception signal $r_u$ can also be expressed by a desired signal and another signal as below.

$$r_u = H_{u,i}s_{i,u} + H_{u,i}\sum_{v \in U_i, v \neq u} s_{i,v} + \sum_{j \neq i} H_{u,j} \sum_{v \in U_j} s_{j,v} + n_u$$ [Math. 11]

In the above expression, the first term of the right side denotes a desired signal of the user u, the second term, interference in the serving cell i of the user u (called intra-cell interference, multi-user interference, multi-access interference, or the like), and the third term, interference from a cell other than the cell i (called inter-cell interference).

When orthogonal multiple access (e.g., OFDMA or SC-FDMA) or the like is adopted, the reception signal can be expressed as below.

$$r_u = H_{u,i}s_{i,u} + \sum_{j \neq i} H_{u,j}s_{j,v} + n_u$$ [Math. 12]

In orthogonal multiple access, no intra-cell interference occurs, and moreover, in the other cell j, a signal of the other user v is not multiplexed on the same radio resource.

(b) Uplink

Next, uplink transmission signals and reception signals when SPC is adopted will be described. Assumed here is a multi-cell system of HetNet, SCE, or the like. Note that the signs used for downlink will be further used as signs denoting signals and the like.

A transmission signal that the user u transmits in the cell i can be expressed in a vector form as below.

$$s_{i,u} = \begin{bmatrix} s_{i,u,0} \\ \vdots \\ s_{i,u,N_{TX,u}-1} \end{bmatrix} = W_{i,u}P_{i,u}x_{i,u}$$ [Math. 13]

$$W_{i,u} = \begin{bmatrix} w_{i,u,0,0} & \cdots & w_{i,u,0,N_{SS,u}-1} \\ \vdots & \ddots & \vdots \\ w_{i,u,N_{TX,u}-1,0} & \cdots & w_{i,u,N_{TX,u}-1,N_{SS,u}-1} \end{bmatrix}$$ [Math. 14]

$$P_{i,u} = \begin{bmatrix} P_{i,u,0,0} & \cdots & P_{i,u,0,N_{SS,u}-1} \\ \vdots & \ddots & \vdots \\ P_{i,u,N_{SS,u}-1,0} & \cdots & P_{i,u,N_{SS,u}-1,N_{SS,u}-1} \end{bmatrix}$$ [Math. 15]

$$x_{i,u} = \begin{bmatrix} x_{i,u,0} \\ \vdots \\ x_{i,u,N_{SS,u}-1} \end{bmatrix}$$ [Math. 16]

In the above expressions, the number of transmission antennas is the number of transmission antennas of the user, $N_{TX,u}$. As in downlink, a matrix $P_{i,u}$, which is a power allocation coefficient matrix for the user u in the cell i, may be a diagonal matrix.

In uplink, there is no case where a signal of a user and a signal of another user are multiplexed in the user; thus, a reception signal of a base station of the cell i can be expressed as below.

$$r_i = \begin{bmatrix} r_{i,0} \\ \vdots \\ r_{i,N_{RX,i}-1} \end{bmatrix} = \sum_{i'} \sum_{u' \in U_{i'}} H_{i',u'}s_{i',u'} + n_i$$ [Math. 17]

$$H_{i,u} = \begin{bmatrix} h_{i,u,0,0} & \cdots & h_{i,u,0,N_{TX,u}-1} \\ \vdots & \ddots & \vdots \\ h_{i,u,N_{RX,i}-1,0} & \cdots & h_{i,u,N_{RX,i}-1,N_{TX,u}-1} \end{bmatrix}$$ [Math. 18]

$$n_i = \begin{bmatrix} n_{i,0} \\ \vdots \\ n_{i,N_{RX,i}-1} \end{bmatrix}$$ [Math. 19]

It should be noted that in uplink, unlike in downlink, a base station needs to obtain all signals from a plurality of users in a cell by decoding. Note also that a channel response matrix differs depending on a user.

When a focus is put on a signal transmitted by the user u, among uplink signals in the cell i, a reception signal can be expressed as below.

$$r_{i,u} = \begin{bmatrix} r_{i,u,0} \\ \vdots \\ r_{i,u,N_{RX,i}-1} \end{bmatrix} = H_{i,u}s_{i,u} + \sum_{v \in U_i, v \neq u} H_{i,v}s_{i,v} + \sum_{j \neq i} \sum_{v \in U_j} H_{i,v}s_{j,v} + n_i$$ [Math. 20]

In the above expression, the first term of the right side denotes a desired signal of the user u, the second term, interference in the serving cell i of the user u (called intra-cell interference, multi-user interference, multi-access interference, or the like), and the third term, interference from a cell other than the cell i (called inter-cell interference).

When orthogonal multiple access (e.g., OFDMA or SC-FDMA) or the like is adopted, the reception signal can be expressed as below.

$$r_{i,u} = H_{i,u}s_{i,u} + \sum_{j \neq i} H_{i,v}s_{j,v} + n_i$$ [Math. 21]

In orthogonal multiple access, no intra-cell interference occurs, and moreover, in the other cell j, a signal of the other user v is not multiplexed on the same radio resource.

2. TECHNICAL PROBLEM

Next, a technical problem according to an embodiment of the present disclosure will be described with reference to FIGS. 4 to 6.

For example, fading (e.g., fading of frequency selectivity and/or time selectivity) is equally generated in multiple power layers multiplexed using SPC. Accordingly, accuracy of decoding of signals of the multiple power layers (an interference signal and a desired signal) decreases with respect to specific radio resources (e.g., frequency resources and/or time resources). Further, accuracy of interference cancellation also decreases, and thus residual interference increases due to a decrease in accuracy of decoding of an interference signal with respect to the specific radio resources. As a result, it may be difficult to correctly decode a desired signal because residual interference increases and accuracy of decoding of the desired signal decreases with respect to the specific radio resources. A specific example with respect to this fact will be described below with reference to FIGS. 4 to 6.

Figure 4:
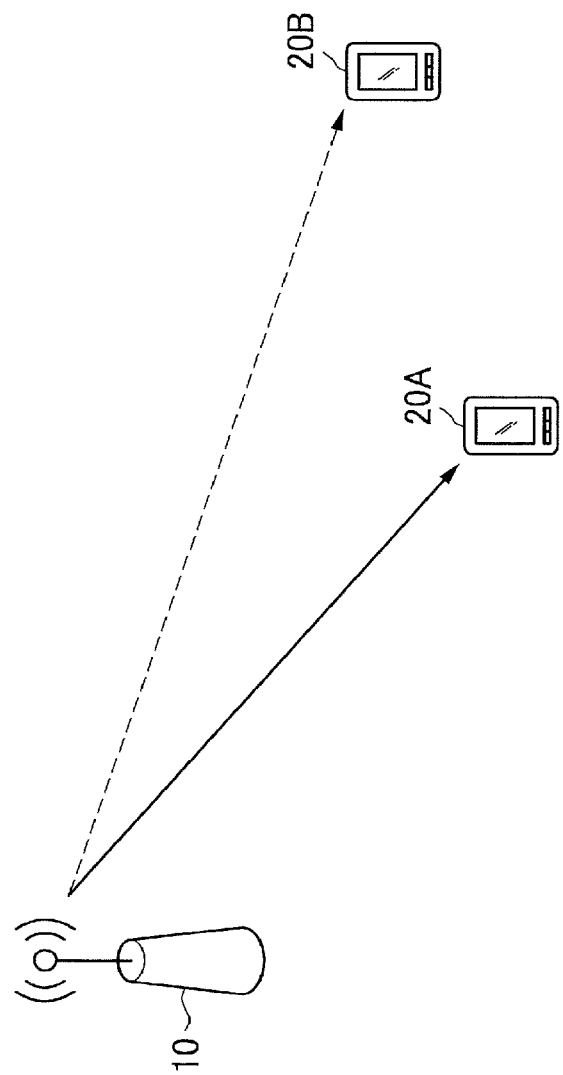
FIG. 4 is a first explanatory diagram for explaining an example of multiplexing using SPC.
Figure 5:
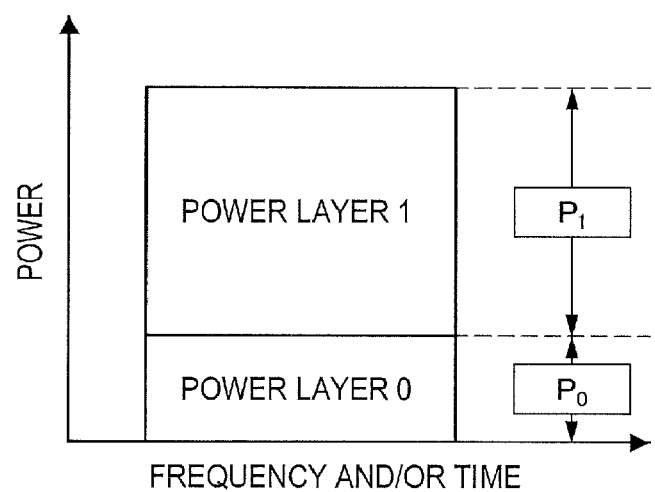
FIG. 5 is a second explanatory diagram for explaining an example of multiplexing using SPC.

FIGS. 4 and 5 are explanatory diagrams for explaining an example of multiplexing using SPC. Referring to FIG. 4, a base station 10, a terminal device 20A, and a terminal device 20B are illustrated. For example, the base station 10 multiplexes a power layer 0 and a power layer 1, transmits a signal to the terminal device 20A using the power layer 0, and transmits a signal to the terminal device 20B using the power layer 1. In addition, referring to FIG. 5, power $P_0$ allocated to the power layer 0 (a power layer corresponding to the terminal device 20A) and power $P_1$ allocated to the power layer 1 (a power layer corresponding to the terminal device 20B) are illustrated. For example, in this manner, lower power is allocated to the power layer 0 corresponding to the terminal device 20A (i.e., a terminal device having low path loss) closer to the base station 100. In addition, higher power is allocated to the power layer 1 corresponding to the terminal device 20B (i.e., a terminal device having high path loss) farther away from the base station 100. Further, the terminal device 20A may be a terminal device included in a main lobe of a directional beam, and the terminal device 20B may be a terminal device separated from the main lobe of the directional beam.

Figure 6:
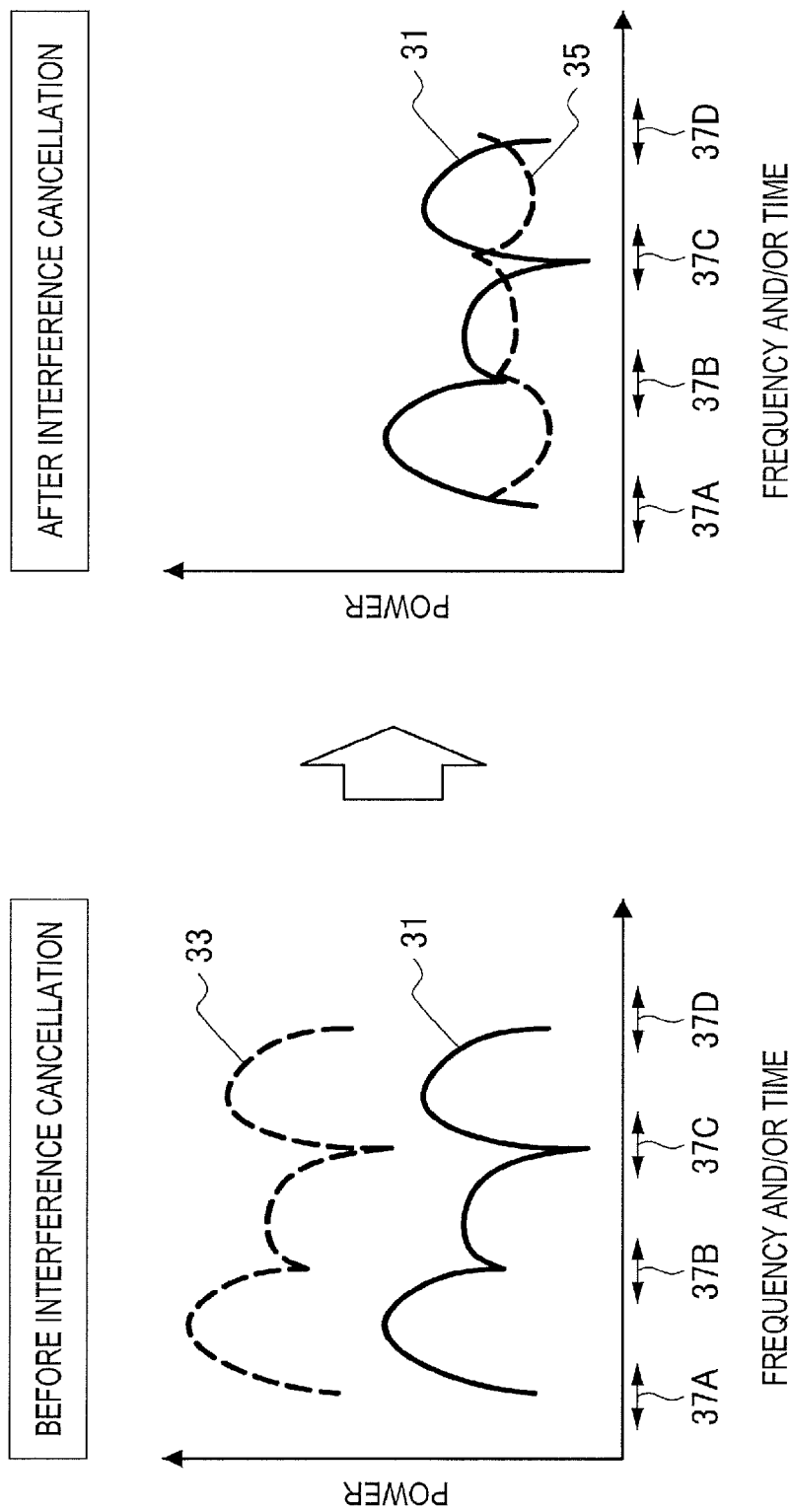
FIG. 6 is an explanatory diagram for explaining an example of fading and residual interference.

FIG. 6 is an explanatory diagram for explaining an example of fading and residual interference. Referring to FIG. 6, received power 31 of the power layer 0 in the terminal device 20A (i.e., received power of a desired signal) and received power 33 of the power layer 1 in the terminal device 20A (i.e., received power of an interference signal) are illustrated. In the power layer 0 and the power layer 1, significant fading is generated in radio resources 37A, 37B, 37C and 37D. Accordingly, with respect to the radio resources 37A, 37B, 37C and 37D, a burst error is generated during decoding of a signal (i.e., interference signal) of the power layer 1 and accuracy of decoding of the signal of the power layer 1 decreases. Furthermore, interference cancellation accuracy also decreases, and thus residual interference 35 increases due to the decrease in the accuracy of decoding of the signal of power layer 1 with respect to the radio resources 37A, 37B, 37C and 37D. In addition, accuracy of decoding of a signal (i.e., desired signal) of the power layer 0 decreases like the signal (i.e., interference signal) of the power layer 1 with respect to the radio resources 37A, 37B, 37C and 37D. As a result, it may be difficult to correctly decode the signal (i.e., desired signal) of the power layer 0 because the residual interference 35 increases and the accuracy of decoding of the signal (i.e., desired signal) of the power layer 0 decreases with respect to the radio resources 37A, 37B, 37C and 37D.

Accordingly, it is desirable to provide a system capable of improving decoding accuracy when multiplexing/multiple access using power allocation is performed.

3. SCHEMATIC CONFIGURATION OF SYSTEM

Figure 7:
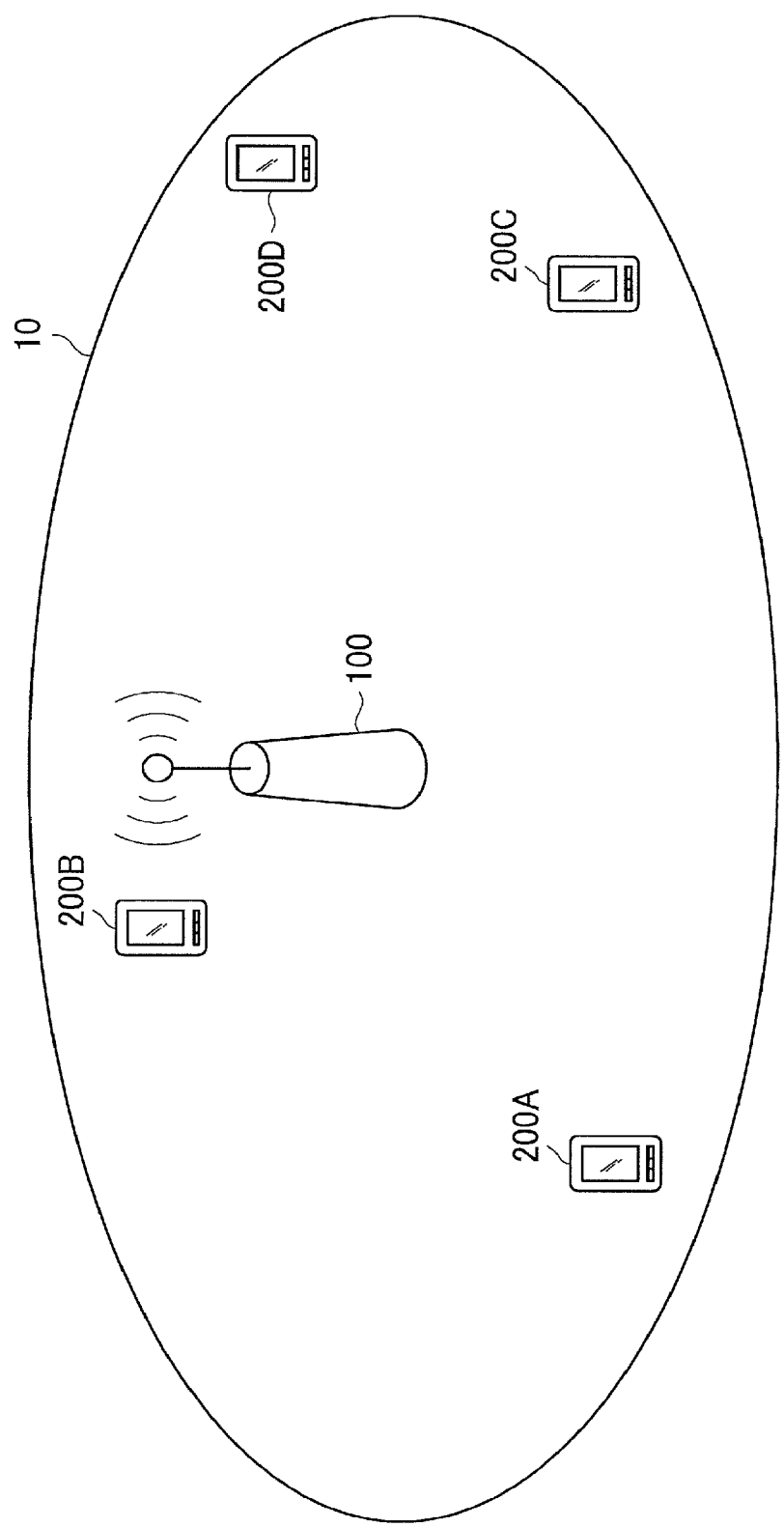
FIG. 7 is an explanatory diagram illustrating an example of a schematic configuration of a system according to an embodiment of the present disclosure.

Now, a schematic configuration of a system 1 according to an embodiment of the present disclosure will be described with reference to FIG. 7. FIG. 7 is an explanatory diagram illustrating an example of the schematic configuration of the system 1 according to an embodiment of the present disclosure. According to FIG. 7, the system 1 includes a base station 100 and a terminal device 200. Here, the terminal device 200 is also called a user. The user may also be called a user equipment (UE). Here, the UE may be a UE defined in LTE or LTE-A, or may generally refer to communication equipment.

(1) Base Station 100

The base station 100 is a base station of a cellular system (or mobile communication system). The base station 100 performs radio communication with a terminal device (e.g., the terminal device 200) located in a cell 101 of the base station 100. For example, the base station 100 transmits a downlink signal to the terminal device, and receives an uplink signal from the terminal device.

(2) Terminal Device 200

The terminal device 200 can perform communication in a cellular system (or mobile communication system). The terminal device 200 performs radio communication with a base station (e.g., the base station 100) of the cellular system. For example, the terminal device 200 receives a downlink signal from the base station, and transmits an uplink signal to the base station.

(3) Multiplexing/Multiple Access

In particular, in the embodiment of the present disclosure, the base station 100 performs radio communication with a plurality of terminal devices by non-orthogonal multiple access. More specifically, the base station 100 performs radio communication with a plurality of terminal devices by multiplexing/multiple access using power allocation. For example, the base station 100 performs radio communication with the plurality of terminal devices by multiplexing/ multiple access using SPC.

For example, the base station 100 performs radio communication with the plurality of terminal devices by multiplexing/multiple access using SPC in downlink. Specifically, for example, the base station 100 multiplexes signals to the plurality of terminal devices using SPC. In this case, for example, the terminal device 200 removes one or more other data signals, as interference, from a multiplexed signal including a desired signal (that is, a signal to the terminal device 200), and decodes the desired signal.

Note that the base station 100 may perform radio communication with the plurality of terminal devices by multiplexing/multiple access using SPC in uplink, instead of or together with downlink. In this case, the base station 100 may decode a multiplexed signal including signals transmitted from the plurality of terminal devices into the signals.

4. CONFIGURATION OF EACH DEVICE

Now, configurations of the base station 100 and the terminal device 200 according to an embodiment of the present disclosure will be described with reference to FIGS. 8 and 9.

4.1. Configuration of Base Station

First, an example of the configuration of the base station 100 according to an embodiment of the present disclosure will be described with reference to FIG. 8. FIG. 8 is a block diagram illustrating the example of the configuration of the base station 100 according to an embodiment of the present disclosure. According to FIG. 8, the base station 100 includes an antenna unit 110, a radio communication unit 120, a network communication unit 130, a storage unit 140, and a processing unit 150.

(1) Antenna Unit 110

The antenna unit 110 radiates signals output by the radio communication unit 120 out into space as radio waves. In addition, the antenna unit 110 converts radio waves in the space into signals, and outputs the signals to the radio communication unit 120.

(2) Radio Communication Unit 120

The radio communication unit 120 transmits and receives signals. For example, the radio communication unit 120 transmits a downlink signal to a terminal device, and receives an uplink signal from a terminal device.

(3) Network Communication Unit 130

The network communication unit 130 transmits and receives information. For example, the network communication unit 130 transmits information to other nodes, and receives information from other nodes. For example, the other nodes include another base station and a core network node.

(4) Storage Unit 140

The storage unit 140 temporarily or permanently stores a program and various data for operation of the base station 100.

(5) Processing Unit 150

The processing unit 150 provides various functions of the base station 100. The processing unit 150 includes a first transmission processing unit 151, a second transmission processing unit 153, a third transmission processing unit 155, and a notification unit 157. Further, the processing unit 150 may further include other components in addition to these components. That is, the processing unit 150 may perform operations in addition to operations of these components.

Operations of the first transmission processing unit 151, the second transmission processing unit 153, the third transmission processing unit 155 and the notification unit 157 will be described below in detail.

4.2. Configuration of Terminal Device

First, an example of the configuration of the terminal device 200 according to an embodiment of the present disclosure will be described with reference to FIG. 9. FIG. 9 is a block diagram illustrating the example of the configuration of the terminal device 200 according to an embodiment of the present disclosure. According to FIG. 9, the terminal device 200 includes an antenna unit 210, a radio communication unit 220, a storage unit 230, and a processing unit 240.

(1) Antenna Unit 210

The antenna unit 210 radiates signals output by the radio communication unit 220 out into space as radio waves. In addition, the antenna unit 210 converts radio waves in the space into signals, and outputs the signals to the radio communication unit 220.

(2) Radio Communication Unit 220

The radio communication unit 220 transmits and receives signals. For example, the radio communication unit 220 receives a downlink signal from a base station, and transmits an uplink signal to a base station.

(3) Storage Unit 230

The storage unit 230 temporarily or permanently stores a program and various data for operation of the terminal device 200.

(4) Processing Unit 240

The processing unit 240 provides various functions of the terminal device 200. The processing unit 240 includes an information acquisition unit 241 and a reception processing unit 243. Note that the processing unit 240 may further include a structural element other than these structural elements. That is, the processing unit 240 may perform operation other than the operation of these structural elements.

Operations of the information acquisition unit 241 and the reception processing unit 243 will be described below in detail.

5. FIRST EMBODIMENT

Next, a first embodiment will be described with reference to FIGS. 10 to 34.

5.1. Technical Feature

First, technical features of the first embodiment will be described with reference to FIGS. 10 to 16.

(1) Power Layer Interleaving

The base station 100 (the first transmission processing unit 151) generates transmission signal sequences of multiple power layers that have been multiplexed using power allocation. In addition, for each of one or more of the multiple power layers, the base station 100 (the second transmission processing unit 153) processes a transmission signal sequence of a power layer using an interleaver corresponding to the power layer. More specifically, the base station 100 (the second transmission processing unit 153) interleaves the transmission signal sequence of the power layer using the interleaver corresponding to the power layer.

The terminal device 200 (the information acquisition unit 241) acquires a deinterleaver corresponding to each of at least one of the multiple power layers. Then, the terminal device 200 (the reception processing unit 241) performs a reception process using the deinterleaver corresponding to each of the at least one power layer.

Meanwhile, the expression "multiplexing a power layer" has the same meaning as "multiplexing a signal of the power layer" in this specification.

(1) Multiplexing Using Power Allocation

For example, the multiple power layers are power layers that have been multiplexed using SPC.

(b) Generation of Transmission Signal Sequence

For example, a transmission signal sequence is an encoded bit sequence (that is, a bit sequence that has been encoded). The base station 100 (the first transmission processing unit 151) generates an encoded bit sequence of the multiple power layers.

Specifically, for example, the first transmission processing unit 151 performs CRC encoding, FEC encoding, rate matching or the like (as shown in FIG. 2, for example) on each of the multiple power layers to generate the encoded bit sequence of the power layer.

(c) Interleaver Corresponding to Power Layer (c-1) First Example: Interleaver Specific to User As a first example, the transmission signal sequence of the power layer is a transmission signal sequence destined for a user (i.e., the terminal device 200) and the interleaver corresponding to the power layer is an interleaver specific to the user. Two or more power layers are not allocated to one user (that is, transmission signal sequences of two or more layers are not transmission signal sequences to the same user) and only one power layer is allocated to one user.

For example, the interleaver specific to the user is generated on the basis of identification information of the user. The identification information may be a radio network temporary identifier (RNTI) of the user. The interleaver specific to the user may be a deterministic interleaver (DI) or a linear congruential interleaver (LCI). Of course, the identification information and the interleaver specific to the user are not limited to such examples.

Accordingly, for example, the terminal device 200 can acquire the interleaver without information about the power layer (e.g., a power layer index).

(c-2) Second Example: Interleaver Specific to Power Layer

As a second example, the interleaver corresponding to the power layer may be an interleaver specific to the power layer. The interleaver specific to the power layer may be generated (for example, by the user) on the basis of information about the power layer (e.g., a power layer index or an RNTI corresponding to an individual power layer).

Accordingly, for example, the terminal device 200 can easily acquire the interleaver of each power layer.

(c-3) Others

The interleaver corresponding to the layer may be decided on the basis of an ID of a cell to which the user belongs, the ID of the user, the RNTI of the user, the power layer index, a spatial layer index, a time index (e.g., a subframe number or the like) or the like.

Alternatively, the interleaver corresponding to the layer may be decided on the basis of an independent index for indicating an interleaving pattern. The base station 100 may notify the user (the terminal device 200) of the independent index.

(d) One or More Power Layers (d-1) First Example

For example, the one or more power layers (i.e., power layers which are interleaving targets) are power layers other than a predetermined number of power layers among the multiple power layers. For example, the predetermined number of power layers is a single power layer. That is, for each of the power layers other than the predetermined number of power layers (for example, the single power layer) among the multiple power layers, the base station 100 (the second transmission processing unit 153) interleaves the transmission signal sequence of the power layer using the interleaver corresponding to the power layer.

Power Allocated to Power Layer

For example, the predetermined number of power layers (e.g., the single power layer) is a power layer allocated higher transmission power than the one or more power layers. That is, the base station 100 (the third transmission processing unit 155) allocates higher transmission power to the predetermined number of power layers (e.g., the single power layer) and allocates lower transmission power to the one or more power layers. In this regard, a specific example will be described below with reference to FIG. 10.

Figure 10:
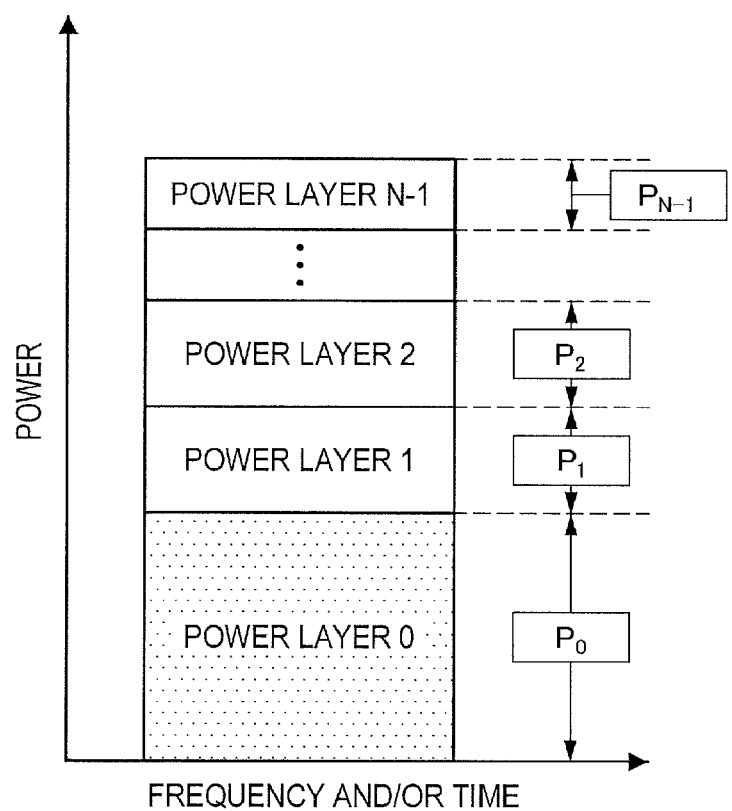
FIG. 10 is an explanatory diagram for explaining an example of power allocation to power layers.

FIG. 10 is an explanatory diagram for explaining an example of power allocation of power layers. Referring to FIG. 10, N power layers (the power layer 0 to a power layer N−1) multiplexed using SPC are illustrated. The base station 100 allocates the power $P_0$ higher than powers $P_1$ to $P_{N-1}$ of the power layers 1 to N−1 to the power layer 0. In addition, the base station 100 interleaves transmission signal sequences of the power layers 1 to N−1 but does not interleave a transmission signal sequence of the power layer 0.

For example, a transmission signal sequence of a single power layer (e.g., a single power layer) is a transmission signal sequence destined for a legacy terminal that does not support multiplexing/multiple access using power allocation (e.g., multiplexing/multiple access using SPC). In other words, the legacy terminal is a terminal device that is not capable of interference cancellation.

Accordingly, for example, the legacy terminal can decode a desired signal included in a multiplexed signal. That is, it is possible to secure backward compatibility while improving frequency utilization efficiency.

Operation of Terminal Device 200

Reception Process

As described above, the terminal device 200 acquires a deinterleaver corresponding to each of the at least one of the multiple power layers and performs a reception process using the deinterleaver corresponding to each of the at least one power layer.

For example, the at least one power layer is included in the one or more power layers (i.e., power layers which are interleaving targets) other than the predetermined number of power layers (i.e., power layers other than the interleaving targets) among the multiple power layers. The terminal device 200 (the reception processing unit 243) performs the reception process without using the deinterleaver corresponding to each of the predetermined number of power layers (i.e., the power layers other than the interleaving targets).

Meanwhile, although an example in which the predetermined number of power layers is a single power layer has been described, the predetermined number of power layers is certainly not limited to this example. The predetermined number of power layers may be two or more power layers.

Determination of Whether Interleaver is Used

For example, the terminal device 200 (the reception processing unit 243) determines a power layer of which transmission signal sequence is processed among the multiple power layers using the interleaver corresponding to the power layer (referred to as an "interleaving layer" hereinafter).

For example, the terminal device 200 (the reception processing unit 243) determines a power layer to which higher power is allocated as the interleaving layer other than a predetermined number of power layers.

Alternatively, the base station 100 may notify the terminal device 200 of whether an interleaver is used for a transmission signal sequence of a power layer, as will be described below. In this case, the terminal device 200 (the reception processing unit 243) may determine the interleaving layer on the basis of notification information from the base station 100.

(d-2) Second Example

The one or more power layers (i.e., the power layers which are interleaving targets) may be the multiple power layers. That is, for each of the multiple power layers, the base station 100 (the second transmission processing unit 153) may interleave a transmission signal sequence of a corresponding power layer using an interleaver corresponding to the power layer. In this manner, all of the power layers may be interleaving targets.

(e) Interleaving Effect

For example, it is possible to improve decoding accuracy when multiplexing/multiple access is performed using power allocation according to the aforementioned interleaving.

More specifically, for example, a burst error caused by fading generation is suppressed by interleaving an interference signal. Accordingly, accuracy of decoding of the interference signal increases and accuracy of interference cancellation also increases, and thus residual interference decreases. As a result, accuracy of decoding of a desired signal can be improved. In addition, for example, a burst error caused by fading generation is suppressed by interleaving a desired signal, and accuracy of decoding of the desired signal increases.

Furthermore, in particular, the interleaver used for the interference signal differs from the interleaver used for the desired signal, and thus residual interference is dispersed for each interference cancellation. Accordingly, accuracy of decoding of the desired signal is further improved without accumulating residual interference.

Figure 11:
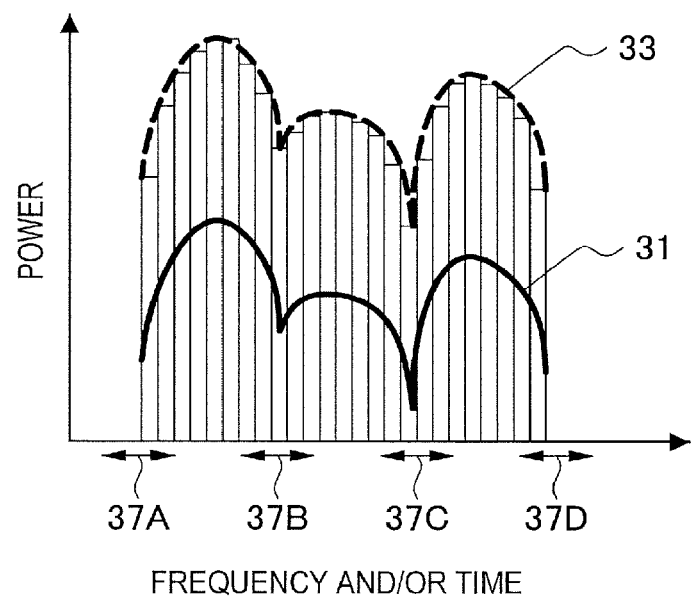
FIG. 11 is a first explanatory diagram for explaining an example of decoding a signal according to a first embodiment.
Figure 12:
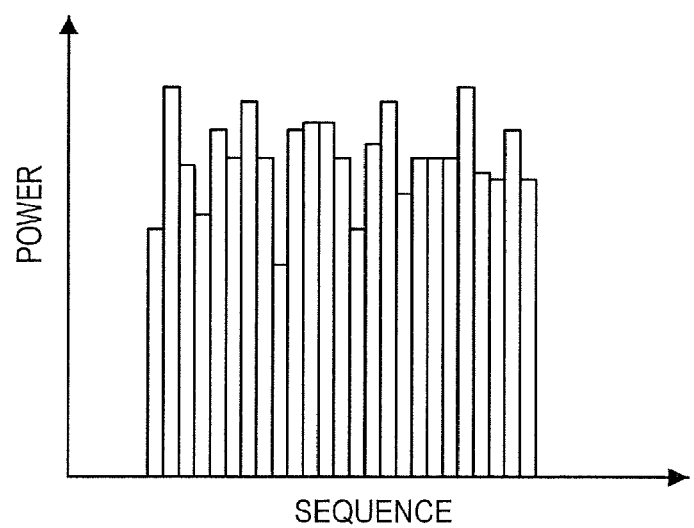
FIG. 12 is a second explanatory diagram for explaining an example of decoding a signal according to a first embodiment.
Figure 13:
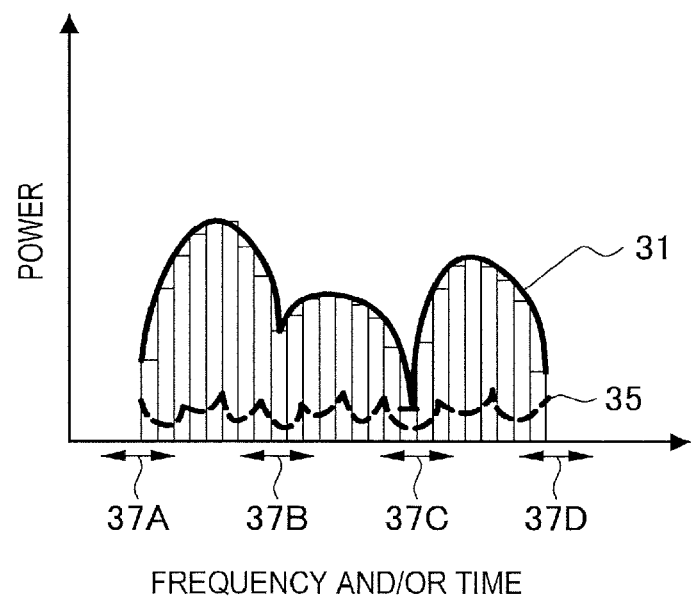
FIG. 13 is a third explanatory diagram for explaining an example of decoding a signal according to a first embodiment.
Figure 14:
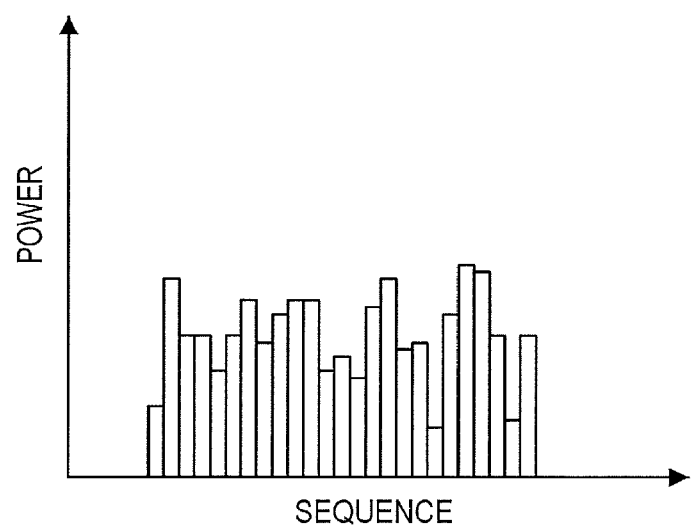
FIG. 14 is a fourth explanatory diagram for explaining an example of decoding a signal according to a first embodiment.

A specific example will be described with reference to FIGS. 11 to 14. FIGS. 11 to 14 are explanatory diagrams for explaining examples of decoding of a signal according to a first embodiment. Referring to FIG. 11, the received power 31 (i.e., received power of a desired signal) of the power layer 0 in the terminal device 200A and the received power 33 (i.e., received power of an interference signal) of the power layer 1 in the terminal device 200A are illustrated. In the power layer 0 and the power layer 1, significant fading is generated in the radio resources 37A, 37B, 37C and 37D. However, since the power layer 1 has been interleaved, influence of the fading is dispersed by performing deinterleaving, as shown in FIG. 12. Consequently, a signal of the power layer 1 (i.e., an interference signal) is decoded with high accuracy and an interference signal replica is also generated with high accuracy. In addition, the interference replica is subtracted from a received signal, and thus the residual interference 35 decreases, as shown in FIG. 13. Furthermore, since the power layer 0 has also been interleaved, influence of the fading is dispersed by performing deinterleaving, as shown in FIG. 14. In addition, since different interleavers are used in the interleaving of the power layer 0 and the interleaving of the power layer 1, the residual interference 35 is dispersed by deinterleaving.

Conversely, when the same interleaver is used for the power layers, the residual interference is accumulated at the same position instead of being dispersed for each interference cancellation, and thus decoding accuracy may decrease.

Further, examples of results of simulations related to interleaving will be described with reference to FIGS. 15 and 16.

Figure 15:
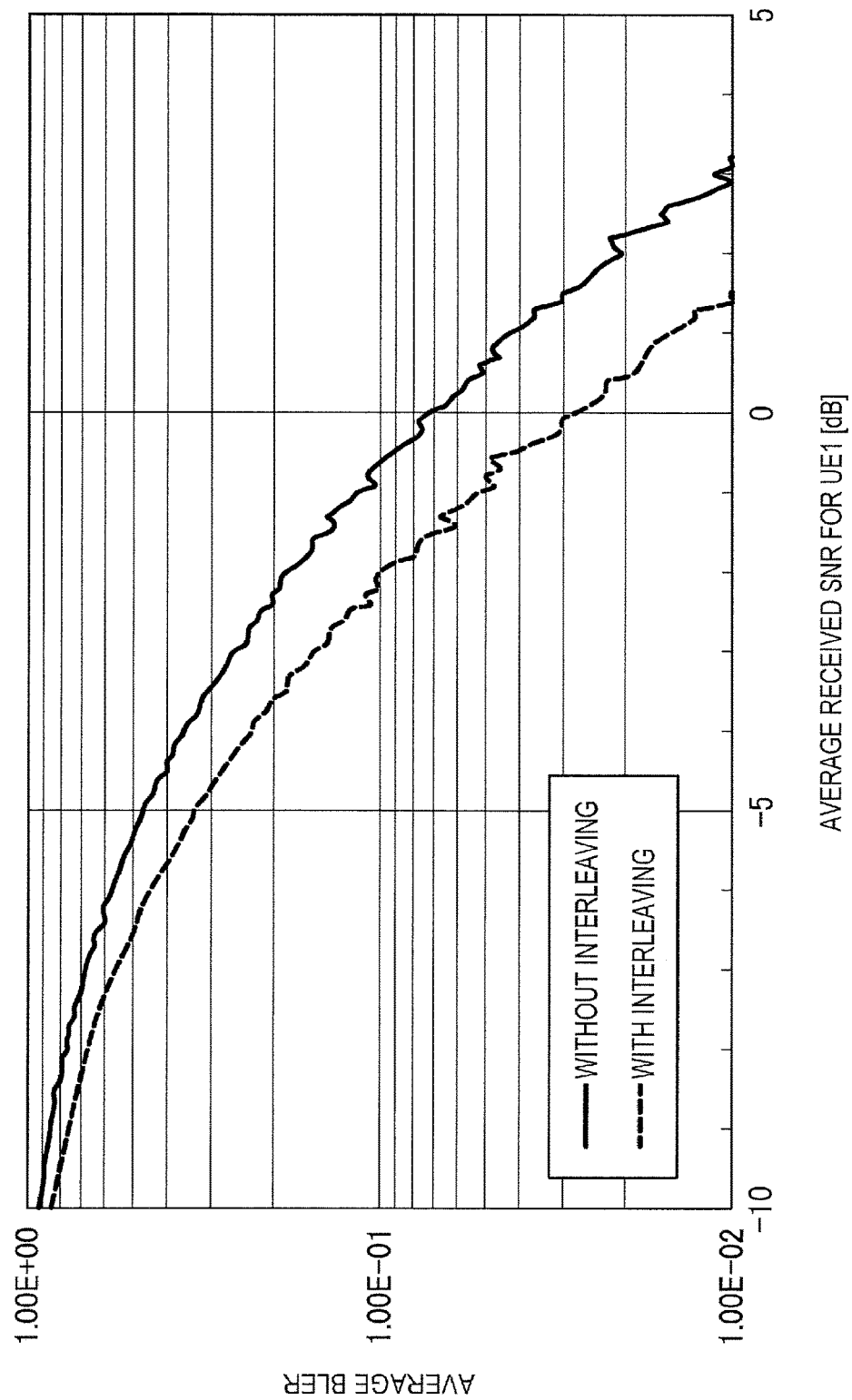
FIG. 15 is an explanatory diagram for explaining a result of a first simulation related to interleaving.

FIG. 15 is an explanatory diagram for explaining a result of a first simulation related to interleaving. In the first simulation, two power layers are multiplexed, 40% of power is allocated to one of the power layers and 60% of the power is allocated to the other power layer. FIG. 15 shows relationships 41 and 43 between an average signal-to-noise ratio (SNR) and an average block error rate (BLER) for one of the power layers as a result of the first simulation. The relationship 41 is a relationship when interleaving is not performed and the relationship 43 is a relationship when interleaving is performed. Comparing the relationship 41 when interleaving is not performed with the relationship 43 when interleaving is performed, the BLER is lower when interleaving is performed than when interleaving is not performed for the same SNR. Further, from a different point of view, a SNR that is necessary to realize the same BLER is lower when interleaving is performed than when interleaving is not performed. In this manner, decoding accuracy is further improved by performing interleaving.

Figure 16:
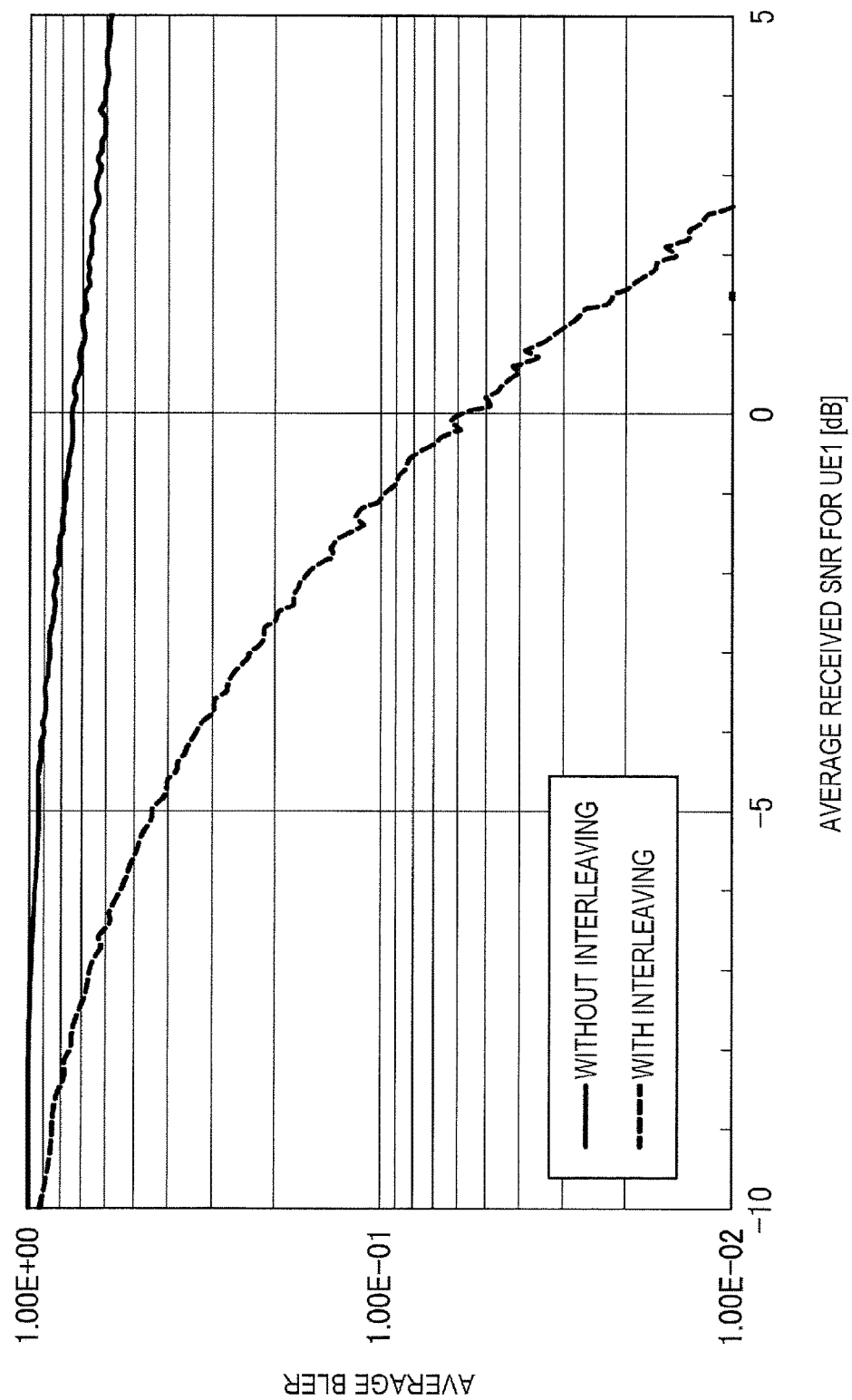
FIG. 16 is an explanatory diagram for explaining a result of a second simulation related to interleaving.

FIG. 16 is an explanatory diagram for explaining a result of a second simulation related to interleaving. In the second simulation, two power layers are multiplexed and the same amount of power (i.e., 50% of the power) is allocated to both of the power layers. FIG. 16 shows relationships 45 and 47 between an average SNR and an average BLER for one layer as a result of the second simulation. The relationship 45 is a relationship when interleaving is not performed, and the relationship 47 is a relationship when interleaving is performed. Comparing the relationship 45 when interleaving is not performed with the relationship 47 when interleaving is performed, even in this example, the BLER is lower when interleaving is performed than when interleaving is not performed for the same SNR. Further, from a different point of view, the SNR that is necessary to realize the same BLER is lower when interleaving is performed than when interleaving is not performed. In this manner, decoding accuracy is further improved by performing interleaving.

The simulation results with respect to interleaving have been explained with reference to FIGS. 15 and 16. Parameters used in the simulations are as follows.

TABLE 1

| | |
|---|---|
| Number of power layers | 2 |
| CQI | 1 (QPSK) |
| Error correction code | Turbo code (R = 1/3, 8 decoding iterations) |
| Channel estimation | Full |
| Interference cancellation method | Codeword level interference cancellation |
| Propagation path model | Extended Typical Urban |

Meanwhile, interleaving may have additional advantages. Referring to both FIGS. 15 and 16, when a power difference between the two power layers further decreases, the BLERs for the same SNR further increase. This is because interference cancellation is difficult to perform when the power difference between the two power layer decreases. In view of this, interleaving can be introduced to improve a degree of freedom for power allocation and alleviate scheduling restrictions because a certain degree of BLER is achieved even when the power difference between power layers is small due to interleaving being performed. Furthermore, it is possible to apply SPC multiplexing/multiple access even in an environment having a lower SNR by performing interleaving, and thus an area in which SPC is applicable can be extended through the introduction of interleaving.

(2) Notification to Terminal Device (a) Power Layer

As described above, for each of the one or more of the multiple power layers, the base station 100 (the second transmission processing unit 153) interleaves the transmission signal sequence of the corresponding power layer using the interleaver corresponding to the power layer.

For example, the transmission signal sequence of the power layer is a transmission signal sequence destined for a user (i.e., the terminal device 200), and the base station 100 (the notification unit 157) notifies the user of the power layer. Accordingly, for example, the user can be made aware of a power layer of which a signal is transmitted to the user.

For example, the base station 100 (the notification unit 157) notifies the user of the power layer among downlink control information (DCI) destined for the user. The base station 100 transmits the DCI over a physical downlink control channel (PDCCH). As a specific process, the notification unit 157 generates DCI which is destined for the user, and indicates the power layer. Accordingly, for example, it is possible to dynamically change a power layer for the user for each radio resource allocation.

(b) Number of Power Layers

For example, the base station 100 (the notification unit 157) notifies the user of the number of power layers with respect to the multiple power layers. That is, the base station 100 (the notification unit 157) notifies the user of the number of multiplexed layers. Accordingly, for example, the user (i.e., the terminal device 200) can perform interference cancellation.

For example, the base station 100 (the notification unit 157) notifies the user of the number of power layers through DCI destined for the user, a signaling message destined for the user, or system information. For example, the signaling message is a radio resource control (RRC) message, and the system information is a system information block (SIB). As a specific process, the notification unit 157 generates DCI which is destined for the user and represents the number of power layers, a signaling message which is destined for the user and represents the number of power layers or system information representing the number of power layers.

(c) Whether Interleaver is Used

The base station 100 (the notification unit 157) may notify the user of whether an interleaver is used for a transmission signal sequence (i.e., the transmission signal sequence of the power layer) destined for the user. Accordingly, for example, the user can be more easily made aware of whether an interleaver is used.

The base station 100 (the notification unit 157) may notify the user of whether an interleaver is used through the DCI destined for the user. As a specific process, the notification unit 157 may generate DCI which is destined for the user and represents whether an interleaver is used. Accordingly, it is possible to dynamically change whether an interleaver is used for each radio resource allocation, for example.

Further, the base station 100 (the notification unit 157) may notify the user of whether an interleaver is used for a transmission signal sequence of each of the multiple power layers including the power layer. Accordingly, the user (i.e., the terminal device 200) can easily be made aware of whether an interleaver is used for each power layer, for example. Therefore, interference cancellation can be further facilitated.

(3) Transmission Power Allocated to Power Layer

For example, a transmission signal sequence of a power layer allocated high transmission power among the one or more power layers (i.e., the power layers which are interleaving targets) is a transmission signal sequence destined for a user with low communication quality. In addition, a transmission signal sequence of a power layer allocated low transmission power among the one or more power layers is a transmission signal sequence destined for a user with high communication quality.

For example, when a transmission signal sequence of a power layer is a transmission signal sequence destined for a user with low communication quality, the base station 100 (the third transmission processing unit 155) allocates high transmission power to the power layer. In addition, when a transmission signal sequence of a power layer is a transmission signal sequence destined for a user with high communication quality, the base station 100 (the third transmission processing unit 155) allocates low transmission power to the power layer.

As an example, the low communication quality may be high path loss and the high communication quality may be low path loss. As another example, the low communication quality may be low path gain and the high communication quality may be high path gain. As yet another example, the low communication quality may be a channel quality indicator (CQI) with low frequency efficiency or a modulation and coding scheme (MCS) with low frequency efficiency and the high communication quality may be a CQI with high frequency efficiency or an MCS with high frequency efficiency. As still yet another example, the low communication quality may be a low signal-to-interference-plus-noise ratio (SINR) and the high communication quality may be a high SINR. Further, the communication qualities are certainly not limited to such examples.

Accordingly, for example, it is possible to operate a highly functional reception algorithm (e.g., SIC or the like) with high accuracy to decode a signal of a power layer to which low transmission power has been allocated.

5.2. Process Flow

Next, examples of processes according to the first embodiment will be described with reference to FIGS. 17 to 28.

(1) Transmission Process

Figure 17:
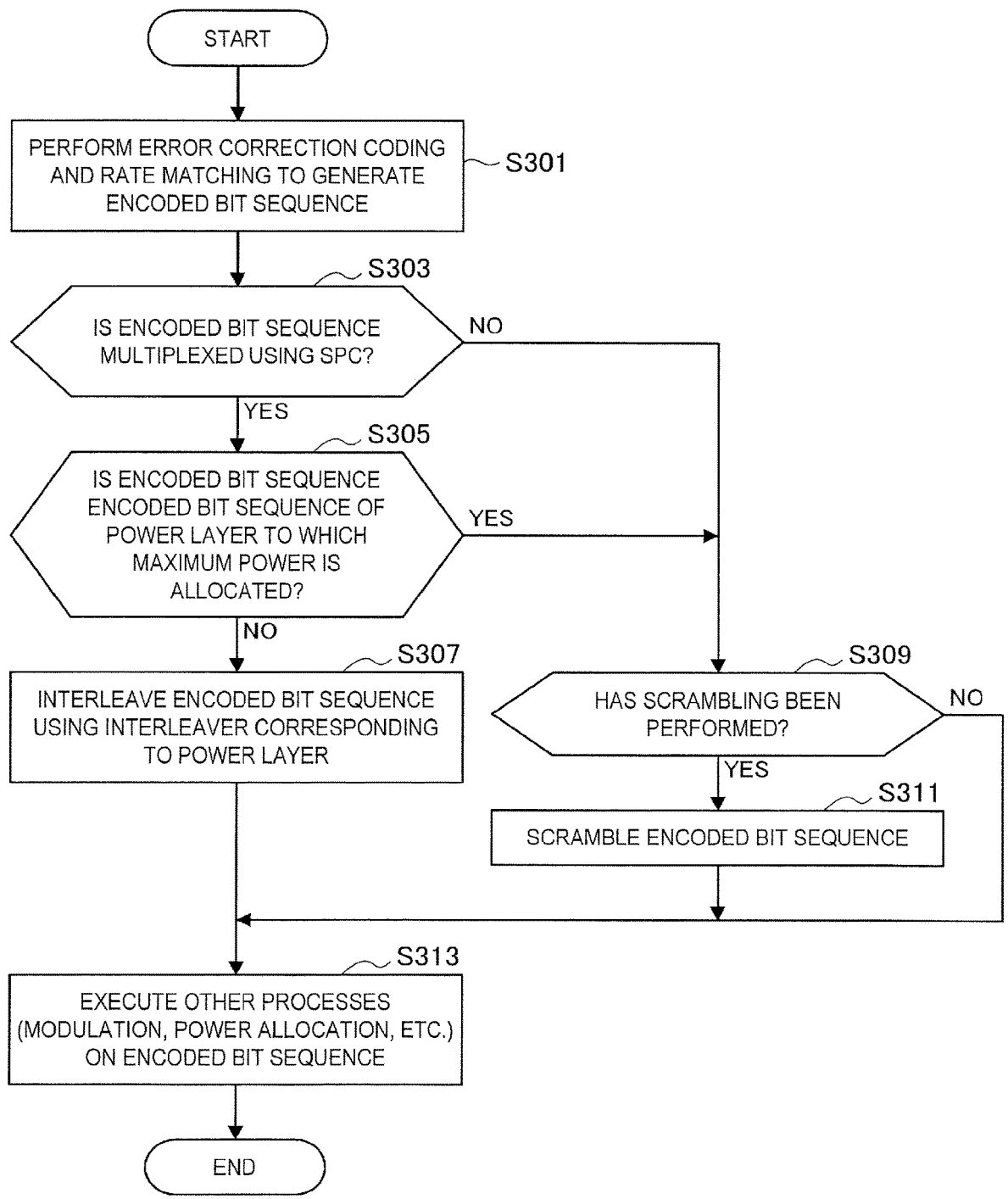
FIG. 17 is a flowchart illustrating an example of a schematic flow of a transmission process of a base station according to the first embodiment.

FIG. 17 is a flowchart illustrating an example of a schematic flow of a transmission process of the base station 100 according to the first embodiment.

The base station 100 (the first transmission processing unit 151) generates an encoded bit sequence by performing error correction coding and rate matching (S301).

When the encoded bit sequence is multiplexed using SPC (S303: YES) and the encoded bit sequence is not an encoded bit sequence of a power layer to which maximum power is allocated (S305: NO), the base station 100 (the second transmission processing unit 153) interleaves the encoded bit sequence (of the power layer) using an interleaver corresponding to the power layer (S307).

When the encoded bit sequence is not multiplexed using SPC (S303: NO) and the encoded bit sequence is an encoded bit sequence of a power layer to which maximum power is allocated (S305: YES), the base station 100 (e.g., the second transmission processing unit 153) scrambles the encoded bit sequence (S311). In this manner, scrambling may be performed when interleaving is not performed.

The base station 100 (the third transmission processing unit 155) performs other processes (e.g., modulation, power allocation, etc.) on the encoded bit sequence (which has been interleaved or scrambled) (S313). Then, the processes end.

(2) Reception Process

(a) Reception Process

Figure 18:
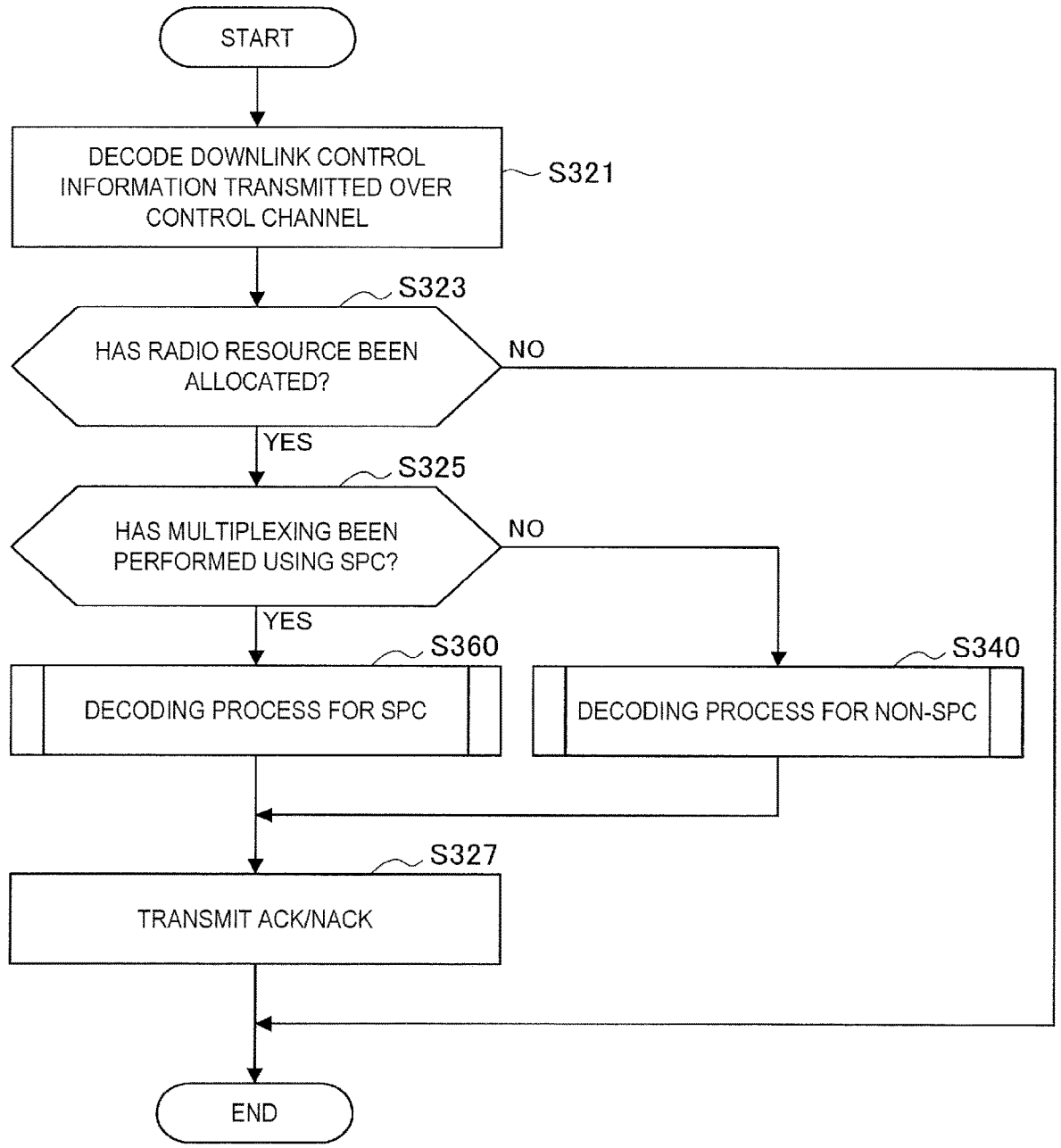
FIG. 18 is a flowchart illustrating an example of a schematic flow of a reception process of a terminal device according to the first embodiment.

FIG. 18 is a flowchart illustrating an example of a schematic flow of a reception process of the terminal device 200 according to the first embodiment. For example, the reception process is performed for each subframe.

The terminal device 200 (the reception processing unit 243) decodes downlink control information (DCI) transmitted over a control channel (S321). For example, the control channel is a PDCCH.

When radio resources have been allocated to the terminal device 200 (S323: YES) and multiplexing using SPC has been performed (S325: YES), the terminal device 200 performs a decoding process for SPC (S360). For example, the decoding process for SPC is interference cancellation (IC), interference suppression (IS), maximum likelihood decoding (MLD) or the like. Subsequently, the terminal device 200 (the processing unit 240) transmits ACK/NACK to the base station 100 (S327). Then, the process ends.

When the radio resources have been allocated to the terminal device 200 (S323: YES) and the multiplexing using SPC has not been performed (S325: NO), the terminal device 200 performs decoding process for non-SPC (S340). For example, the decoding process for non-SPC is a decoding process for orthogonal multiple access (OMA). Subsequently, the terminal device 200 (the processing unit 240) transmits ACK/NACK to the base station 100 (S327). Then, the process ends.

When the radio resources have not been allocated to the terminal device 200 (S323: NO), the process ends.

(b) Decoding Process for Non-SPC

Figure 19:
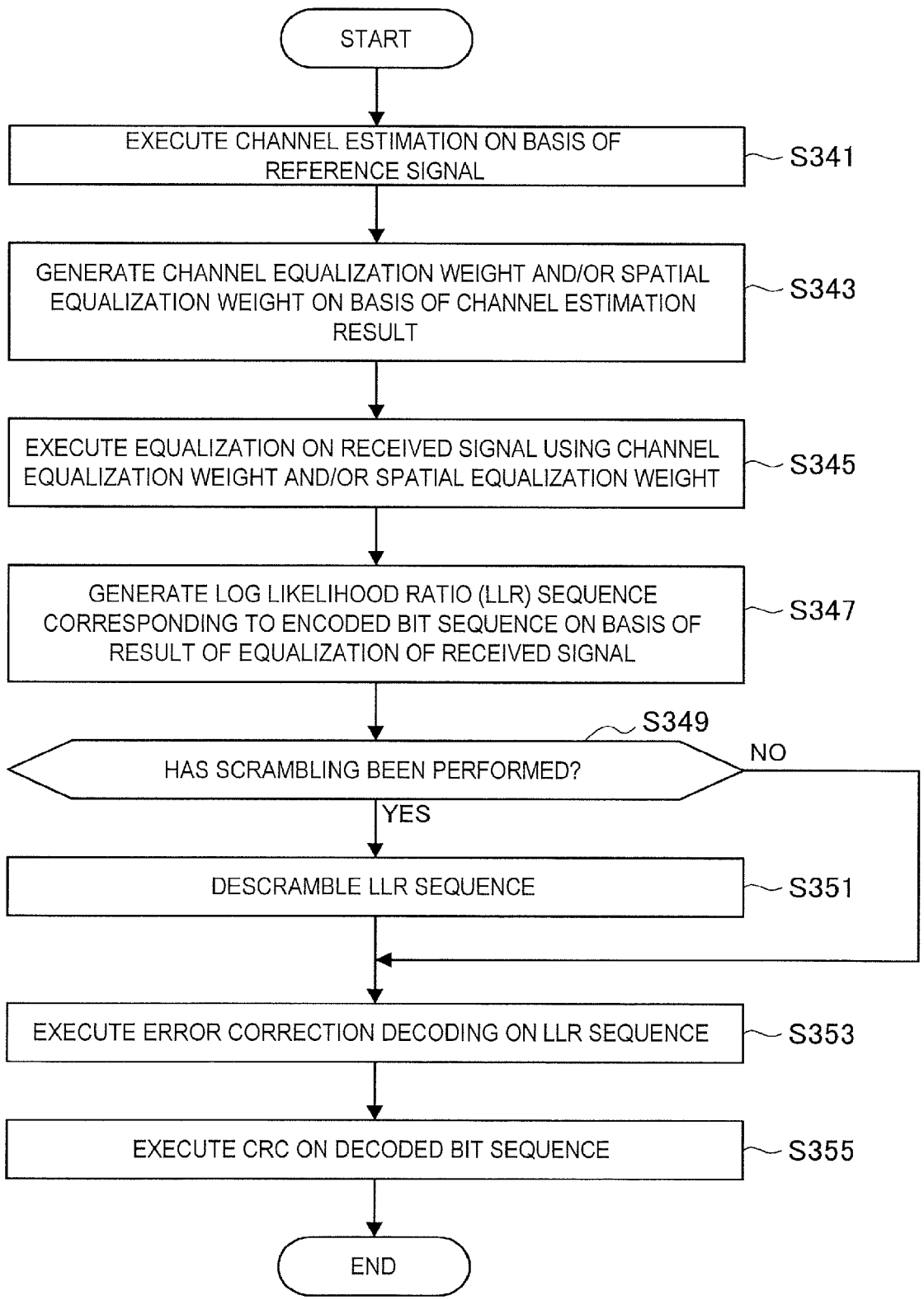
FIG. 19 is a flowchart illustrating an example of a schematic flow of a decoding process for non-SPC.

FIG. 19 is a flowchart illustrating an example of a schematic flow of a decoding process for non-SPC. The decoding process for non-SPC corresponds to step S340 illustrated in FIG. 18.

The terminal device 200 (the reception processing unit 243) performs channel estimation on the basis of a reference signal transmitted by the base station 100 (S341). For example, the reference signal is a cell-specific reference signal (CRS) or a demodulation reference signal (DM-RS). For example, when a precoding matrix is not used (or a specific matrix (e.g., a unit matrix or a diagonal matrix) is used as the precoding matrix) while transmission is performed, the terminal device 200 performs channel estimation on the basis of a CRS. Conversely, when a precoding matrix selected from a plurality of precoding matrices is used while transmission is performed, the terminal device 200 performs channel estimation on the basis of a DM-RS.

The terminal device 200 (the reception processing unit 243) generates a channel equalization weight and/or a spatial equalization weight on the basis of a channel estimation result (S343) and performs equalization on received signals using the channel equalization weight and/or the spatial equalization weight (S345). The channel equalization weight may be a linear equalization weight matrix based on a minimum mean square error (MMSE) scheme or a linear equalization weight matrix based on the zero forcing (ZF) scheme. As a technique other than linear equalization, maximum likelihood (ML) detection, ML estimation, iterative detection/iterative cancellation), turbo equalization, or the like may be used.

The terminal device 200 (the reception processing unit 243) generates a log likelihood ratio (LLR) sequence of a reception side which corresponds to the encoded bit sequence on the basis of the result of the equalization of the received signals (S347).

When scrambling has been performed on the transmission side (S349: YES), the terminal device 200 (the reception processing unit (243) descrambles the LLR sequence (S351).

The terminal device 200 (the reception processing unit 243) executes error correction coding on the LLR sequence (which has been scrambled) (S353). For example, the error correction coding is Viterbi decoding, turbo decoding, message passing algorithm decoding or the like.

The terminal device 200 (the reception processing unit 243) performs CRC on the decoded bit sequence (S355). That is, the terminal device 200 checks whether decoding has been correctly performed. Then, the process ends.

(c) Decoding Process for SPC (First Example: SIC)

(c-1) Whole Process

Figure 20:
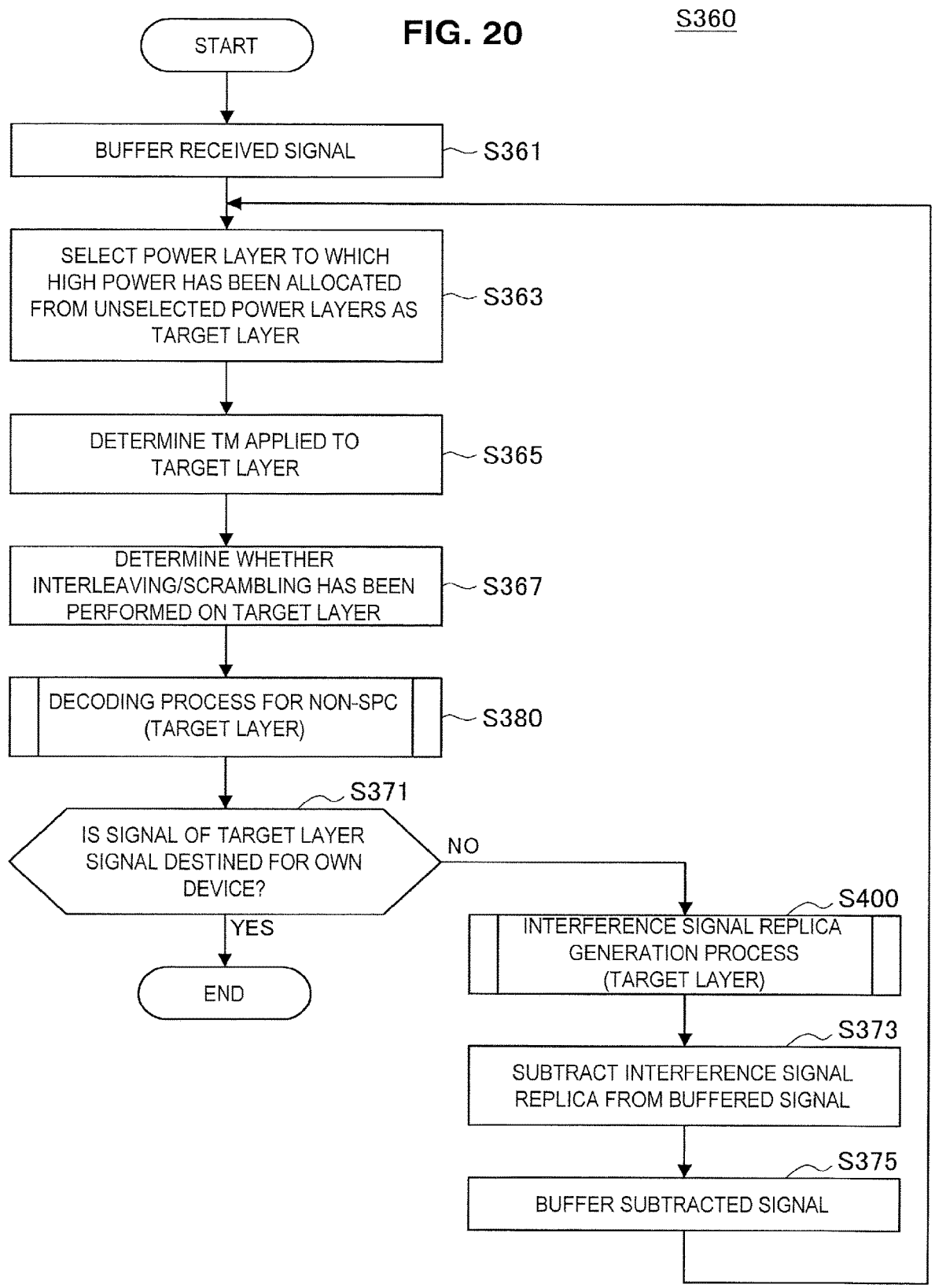
FIG. 20 is a flowchart illustrating a first example of a schematic flow of a decoding process for SPC.

FIG. 20 is a flowchart illustrating a first example of a schematic flow of a decoding process for SPC. The decoding process for SPC corresponds to step S360 illustrated in FIG. 18. In particular, the first example is an example of a process based on successive interference cancellation (SIC).

The terminal device 200 (the reception processing unit 243) buffers a received signal (S361).

The terminal device 200 (the reception processing unit 243) selects a power layer to which high power has been allocated from unselected power layers as a target layer (S363).

The terminal device 200 (the reception processing unit 243) determines a transmission mode (TM) that has been applied to the target layer (S365). In addition, the terminal device 200 (the reception processing unit 243) determines whether interleaving/scrambling has been performed on the target layer (S367). Then, the terminal device 200 performs a decoding process for non-SPC on the target layer (S380).

When a signal of the target layer is destined for the terminal device 200 (S371: YES), the process ends.

When the signal of the target layer is not destined for the terminal device 200 (S371: NO), the terminal device 200 (the reception processing unit 243) performs an interference signal replica generation process on the target layer (S400). The terminal device 200 (the reception processing unit 243) generates an interference signal replica by performing the interference signal replica generation process. Then, the terminal device 200 (the reception processing unit 243) subtracts the interference signal replica from the buffered signal (S373) and buffers the subtracted signal (S375) again. Then, the process returns to step S363.

Meanwhile, although only one layer is allocated to one user in the above-described example, the first embodiment is not limited to this example. For example, two or more layers may be allocated to one user. In this case, even when the signal of the target layer is a signal destined for the terminal device 200 in step S371, the process may proceed to step S400 instead of ending In addition, determination of whether interleaving has been performed in step S367 may be performed on the basis of whether the target layer is a power layer with maximum power or whether an interleaver indicated via DCI is used.

(c-2) Decoding Process for Non-SPC for Target Layer

Figure 21:
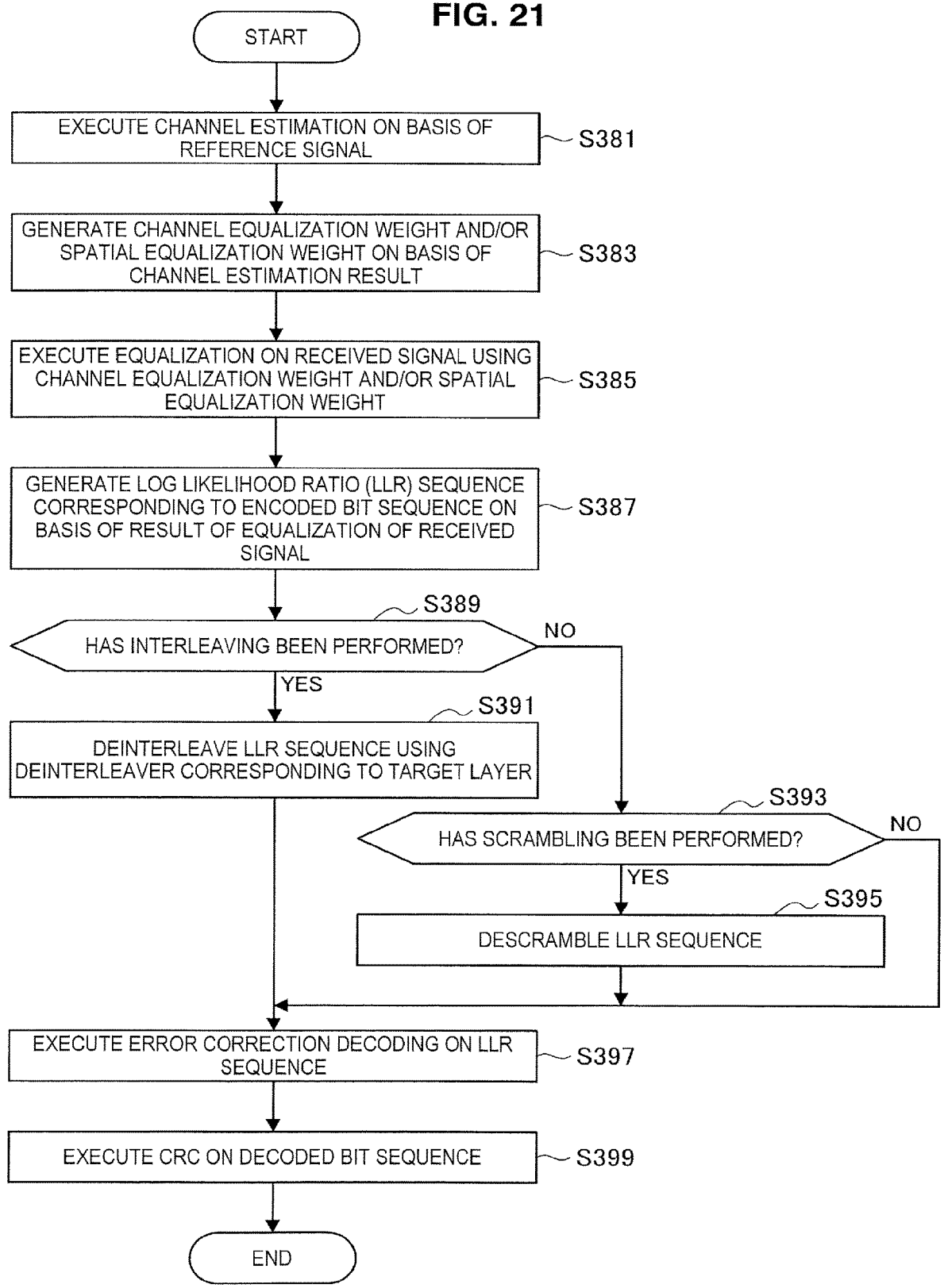
FIG. 21 is a flowchart illustrating an example of a schematic flow of a decoding process for non-SPC for a target layer.

FIG. 21 is a flowchart illustrating an example of a schematic flow of a decoding process for non-SPC for a target layer. The decoding process for non-SPC corresponds to step S380 illustrated in FIG. 20.

Meanwhile, no particular difference exists between a description of steps S381 to S387 and the description of steps S341 to S347 illustrated in FIG. 19. Accordingly, only steps S389 to S399 will be described.

When interleaving has been performed at a transmission side (S389: YES), the terminal device 200 (the reception processing unit 243) deinterleaves the LLR sequence using a deinterleaver corresponding to the target layer (S391).

When interleaving has not been performed at the transmission side (S389: NO) but scrambling has been performed at the transmission side (S393: YES), the terminal device 200 (the reception processing unit 243) descrambles the LLR sequence (S395).

The terminal device 200 (the reception processing unit 243) executes error correction decoding on the LLR sequence (which has been deinterleaved/descrambled) (S397). For example, the error correction coding is Viterbi decoding, turbo decoding, MPA decoding or the like.

The terminal device 200 (the reception processing unit 243) performs CRC on the decoded bit sequence (S399). That is, the terminal device 200 checks whether decoding has been correctly performed. Then, the process ends.

(c-3) Interference Signal Replica Generation Process for Target Layer

Figure 22:
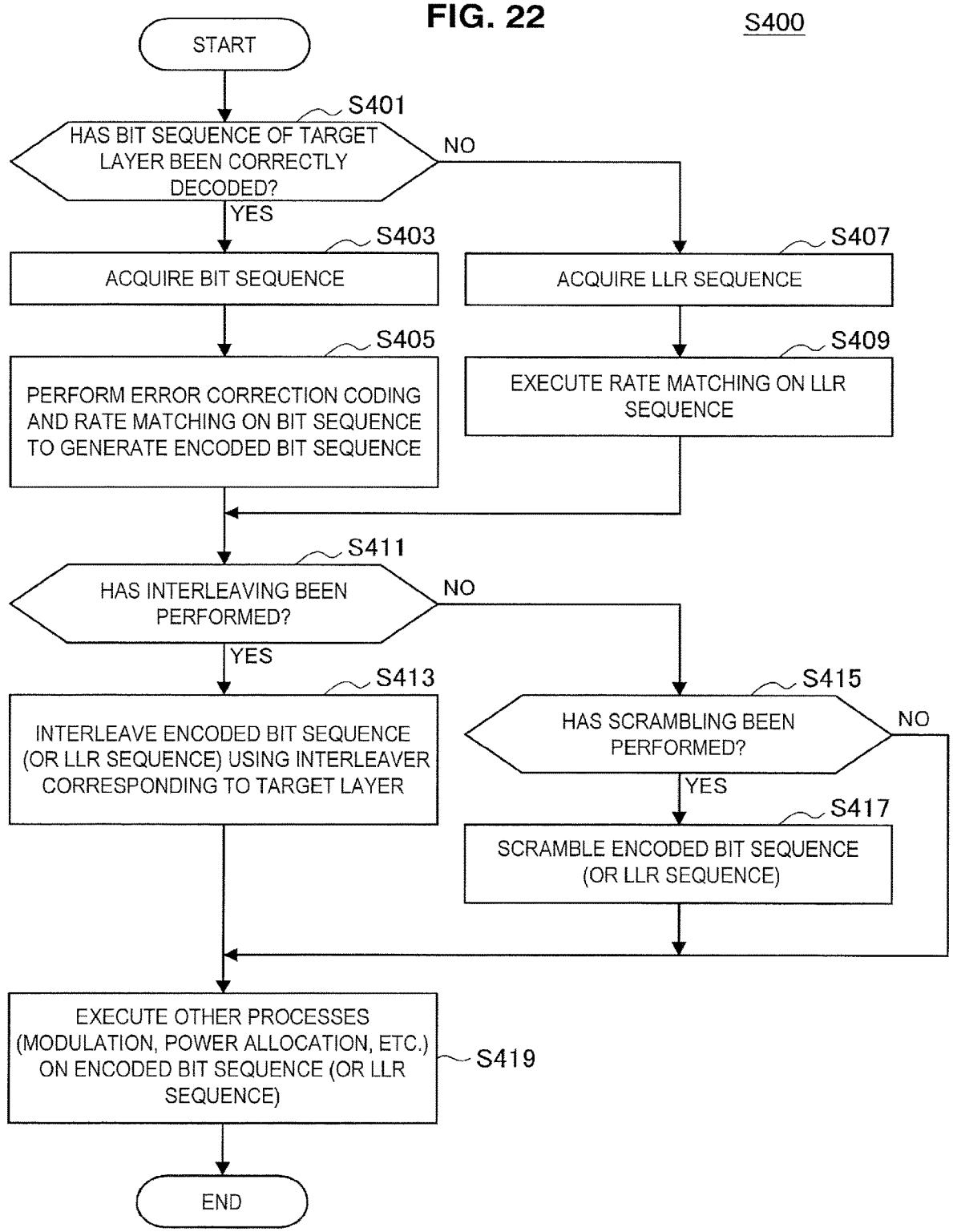
FIG. 22 is a flowchart illustrating an example of a schematic flow of an interference signal replica generation process for a target layer.

FIG. 22 is a flowchart illustrating an example of a schematic flow of an interference signal replica generation process for a target layer. The interference signal replica generation process corresponds to step S400 illustrated in FIG. 20.

When the bit sequence of the target layer has been correctly decoded (S401: YES), the terminal device 200 (the reception processing unit 243) acquires the bit sequence (S403) and generates an encoded bit sequence by performing error correction coding and rate matching on the bit sequence (S405).

Conversely, when the bit sequence of the target layer has not been correctly decoded (S401: NO), the terminal device 200 (the reception processing unit 243) acquires an LLR sequence (S407) and performs rate matching on the LLR sequence (S409). The LLR sequence is a sequence generated in an error correction decoding process.

Whether the bit sequence of the target layer has been correctly decoded (S401) may be determined on the basis of a result of CRC.

When interleaving has been performed at the transmission side (S411: YES), the terminal device 200 (the reception processing unit 243) interleaves the encoded bit sequence (or the LLR sequence) using the interleaver corresponding to the target layer (S413).

Conversely, when interleaving has not been performed at the transmission side (S411: NO) but scrambling has been performed at the transmission side (S415: YES), the terminal device 200 (the reception processing unit 243) scrambles the encoded bit sequence (or the LLR sequence) (S417).

The terminal device 200 (the reception processing unit 243) performs other processes (e.g., modulation, power allocation, and the like) on the encoded bit sequence (or the LLR sequence) (which has been interleaved or scrambled) (S419). Then, the process ends.

Further, for example, soft modulation is performed on the LLR sequence as another process for the LLR sequence. In the soft modulation, a likelihood of generation of signal point candidates of a modulation symbol (e.g., BPSK, QPSK, 8PSK, 16PSK, 16QAM, 256QAM or the like) are calculated using the LLR sequence, and thus expectations of signal points of the modulation symbol can be generated. Accordingly, influence of a bit decoding error in the generation of the interference signal replica can be reduced.

(d) Decoding Process for SPC (Second Example: PIC)

(d-1) Whole Process

Figure 23:
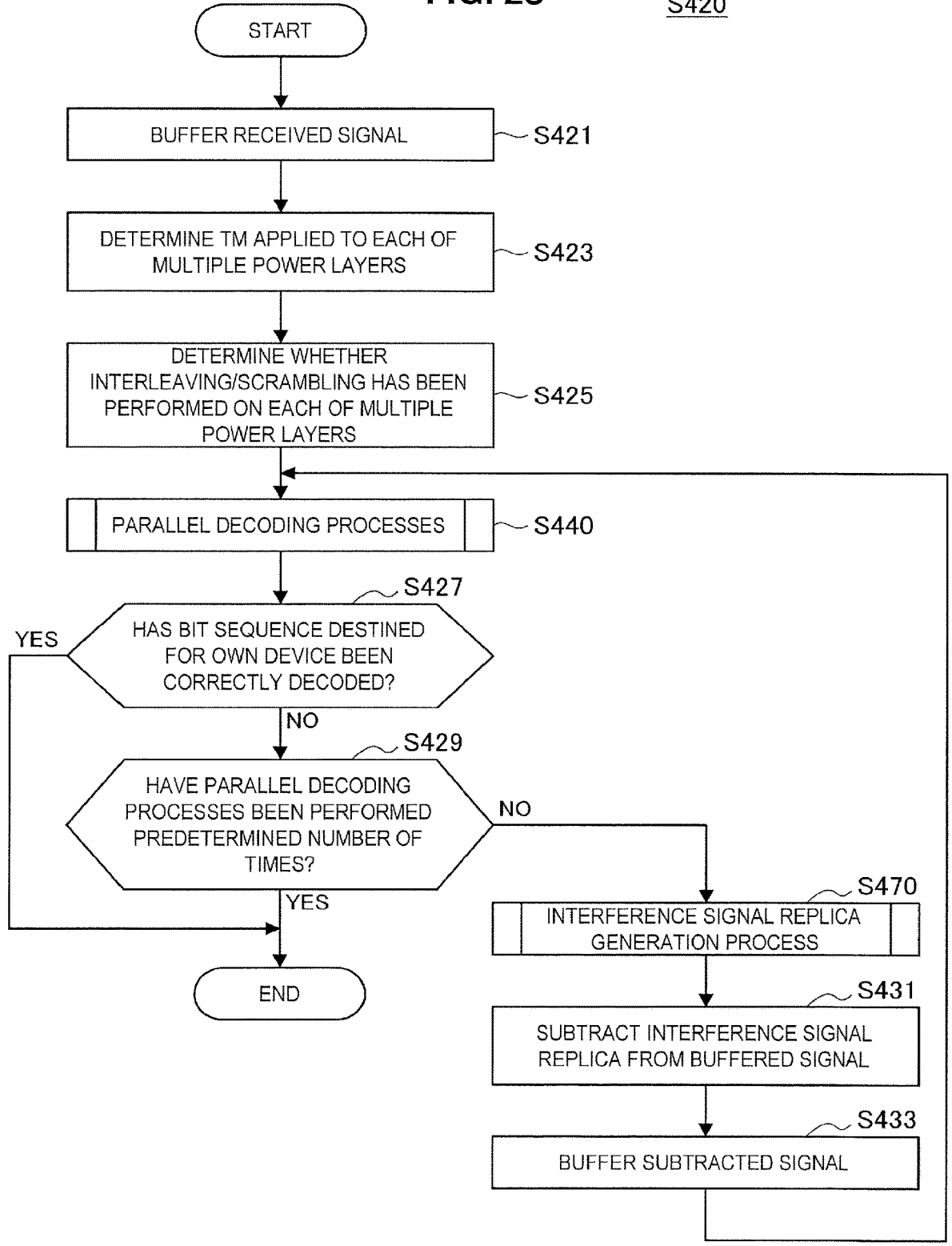
FIG. 23 is a flowchart illustrating a second example of a schematic flow of a decoding process for SPC.

FIG. 23 is a flowchart illustrating an example of a second example of a schematic flow of a decoding process for SPC. The decoding process for SPC corresponds to step S360 illustrated in FIG. 18. Above all, the second example is an example of a process based on parallel interference cancellation (PIC).

The terminal device 200 (the reception processing unit 243) buffers a received signal (S421).

The terminal device 200 (the reception processing unit 243) determines a transmission mode (TM) that has been applied to each of multiple power layers (S423). In addition, the terminal device 200 (the reception processing unit 243) determines whether interleaving/scrambling has been performed on each of the multiple power layers (S425). Then, the terminal device 200 performs parallel decoding processes on the multiple power layers (S440).

When the bit sequence destined for the own device (the terminal device 200) has been correctly decoded (S427: YES), the process ends. In addition, the bit sequence destined for the own device (the terminal device 200) has not been correctly decoded (S427: NO), but the process ends even when parallel decoding processes have been performed multiple times (S429: YES).

When the parallel decoding processes have not been performed multiple times (S429: NO), the terminal device 200 (the reception processing unit 243) performs an interference signal replica generation process (S470). The terminal device 200 (the reception processing unit 243) generates an interference signal replica by performing the interference signal replica generation process. Then, the terminal device 200 (the reception processing unit 243) subtracts the interference signal replica from the buffered signal (S431) and buffers the subtracted signal (S433) again. Then, the process returns to step S440.

Meanwhile, determination of whether interleaving has been performed in step S425 may be performed on the basis of whether the power layer is a power layer with maximum power or whether an interleaver indicated via DCI is used.

(d-2) Decoding Process

Figure 24:
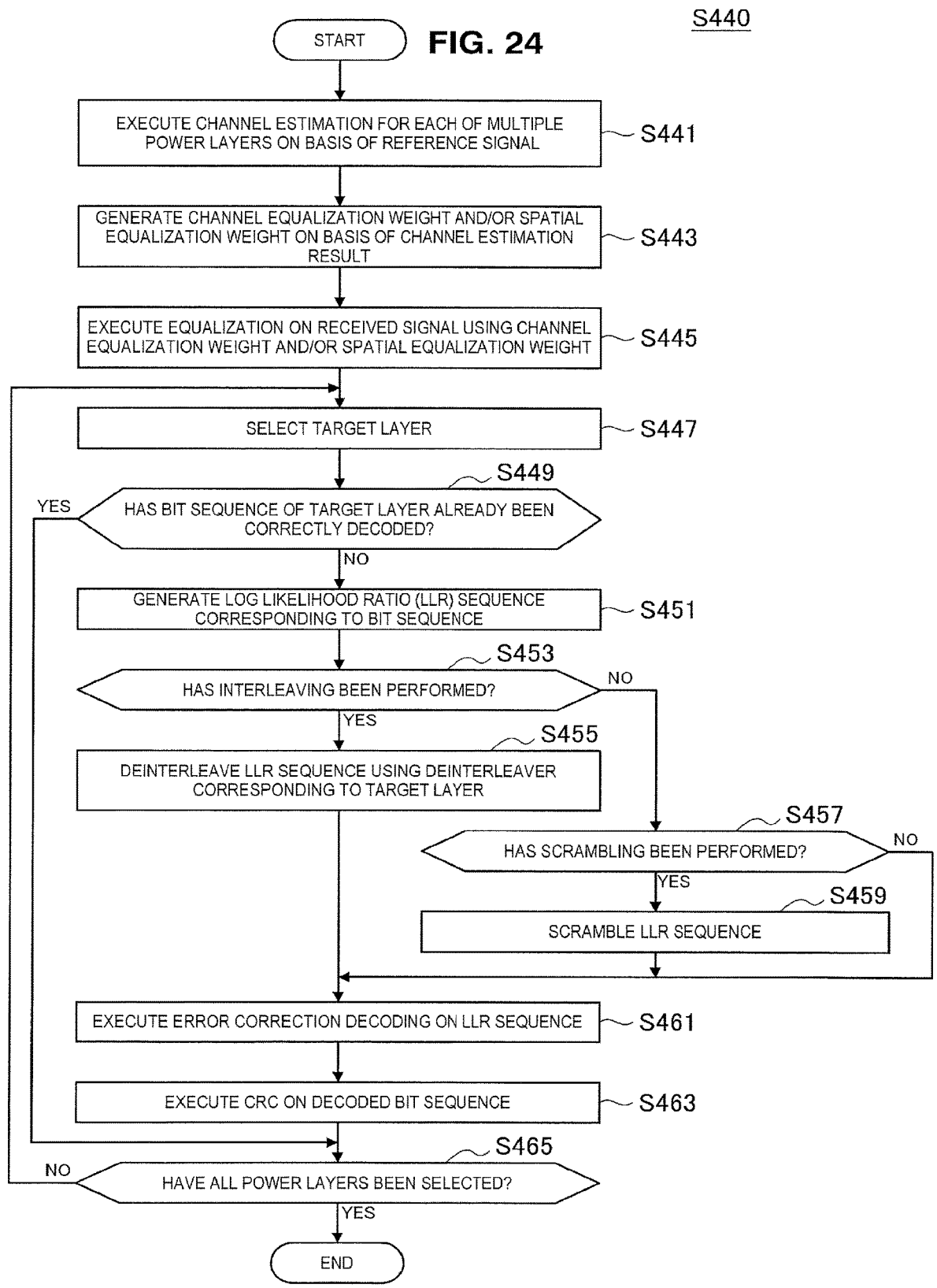
FIG. 24 is a flowchart illustrating an example of a schematic flow of a parallel decoding process.

FIG. 24 is a flowchart illustrating an example of a schematic flow of parallel decoding processes. The parallel decoding processes correspond to step S440 illustrated in FIG. 20.

The terminal device 200 (the reception processing unit 243) performs channel estimation on the basis of a reference signal transmitted by the base station 100 for each of multiple layers (S441). For example, the reference signal is a CRS or a DM-RS. For example, when a precoding matrix is not used (or a specific matrix (e.g., a unit matrix or a diagonal matrix) is used as a precoding matrix) while transmission is performed, the terminal device 200 performs channel estimation on the basis of the CRS. Conversely, when a precoding matrix selected from a plurality of precoding matrices is used while transmission is performed, the terminal device 200 performs channel estimation on the basis of the DM-RS.

The terminal device 200 (the reception processing unit 243) generates a channel equalization weight and/or a spatial equalization weight on the basis of a channel estimation result (S443) and performs equalization on a received signal using the channel equalization weight and/or the spatial equalization weight (S445). The channel equalization weight may be a linear equalization weight matrix based on the MMSE scheme or a linear equalization weight matrix based on the ZF scheme. As a technique other than linear equalization, ML detection, ML estimation, iterative interference cancellation, turbo equalization or the like may be used.

The terminal device 200 (the reception processing unit 243) selects a target layer from the multiple layers (S449).

When the bit sequence of the target layer is already correctly decoded (S449: YES), the process ends when all of the power layers are selected (S465: YES), whereas the process returns to step S447 when all of the power layers are not selected (S465: NO).

When the bit sequence of the target layer is not yet correctly decoded (S449: NO), the terminal device 200 (the reception processing unit 243) generates an LLR sequence of the reception side which corresponds to the encoded bit sequence on the basis of the result of the equalization of the received signal (S451).

When interleaving has been performed at the transmission side (S453: YES), the terminal device 200 (the reception processing unit 243) deinterleaves the LLR sequence using a deinterleaver corresponding to the target layer (S455).

Conversely, when interleaving has not been performed at the transmission side (S453: NO) but scrambling has been performed at the transmission side (S457: YES), the terminal device 200 (the reception processing unit 243) descrambles the LLR sequence (S459).

The terminal device 200 (the reception processing unit 243) executes error correction decoding on the LLR sequence (which has been deinterleaved/scrambled) (S461). For example, the error correction decoding is Viterbi decoding, turbo decoding, MPA decoding or the like.

The terminal device 200 (the reception processing unit 243) performs CRS on the decoded bit sequence (S463). That is, the terminal device 200 checks whether decoding has been correctly performed. Then, the process is ended when all the power layers have been selected (S465: YES) whereas the process returns to step S447 when all of the power layers are not selected (S465: NO).

Meanwhile, although steps S447 to S465 are shown as iterative processes to represent the flowchart, steps S447 to S465 may certainly be executed in parallel for each of the multiple power layers.

(d-3) Generation of Interference Replica

Figure 25:
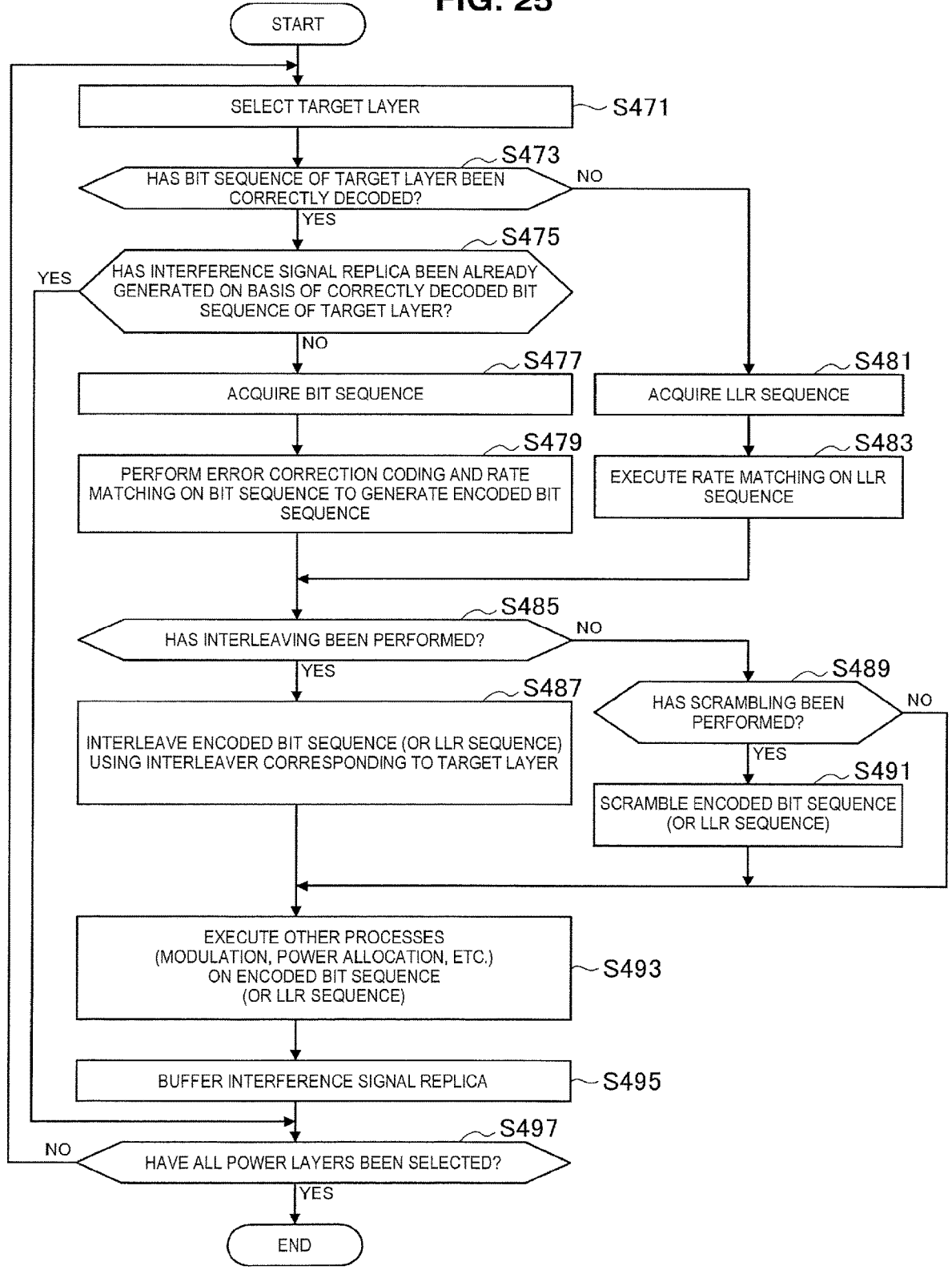
FIG. 25 is a flowchart illustrating an example of a schematic flow of an interference signal replica generation process.

FIG. 25 is a flowchart illustrating an example of a schematic flow of an interference signal replica generation process. The interference signal replica generation process corresponds to step S400 illustrated in FIG. 20.

The terminal device 200 (the reception processing unit 243) selects a target layer from multiple power layers (S471).

When a bit sequence of the target layer has been correctly decoded (S473: YES) but an interference signal replica has not been generated on the basis of the correctly decoded bit sequence of the target layer (S475: NO), the terminal device 200 (the reception processing unit 243) acquires the bit sequence (S477). Then, the terminal device 200 (the reception processing unit 243) performs error correction coding and rate matching on the bit sequence to generate an encoded bit sequence (S449).

When the interference signal replica is already generated on the basis of the correctly decoded bit sequence of the target layer (S475: YES), the process ends when all of the power layers are selected (S497: YES), whereas the process returns to step S471 when all of the power layers are not selected (S497: NO).

When the bit sequence of the target layer has not been correctly decoded (S473: NO), the terminal device 200 (the reception processing unit 243) acquires an LLR sequence (S481) and performs rate matching on the LLR sequence (S483). The LLR sequence is a sequence generated in the error correction decoding process.

Whether the bit sequence of the target layer has been correctly decoded (S473) may be determined on the basis of a result of CRC.

When interleaving has been performed at the transmission side (S485: YES), the terminal device 200 (the reception processing unit 243) interleaves the encoded bit sequence (or the LLR sequence) using an interleaver corresponding to the target layer (S487)

Conversely, when interleaving has not been performed at the transmission side (S485: NO) but scrambling has been performed at the transmission side (S489: YES), the terminal device 200 (the reception processing unit 243) scrambles the encoded bit sequence (or the LLR sequence) (S491).

The terminal device 200 (the reception processing unit 243) performs other processes (e.g., modulation, power allocation and the like) on the encoded bit sequence (or the LLR sequence) (which has been interleaved or scrambled) (S493). Then, the terminal device 200 (the reception processing unit 243) buffers the generated interference signal replica (S495). Subsequently, the process ends when all of the power layer are selected (S497: YES), whereas the process retunes to step S471 when all of the power layers are not selected (S497: NO).

(3) Notification

(a) First Example

Figure 26:
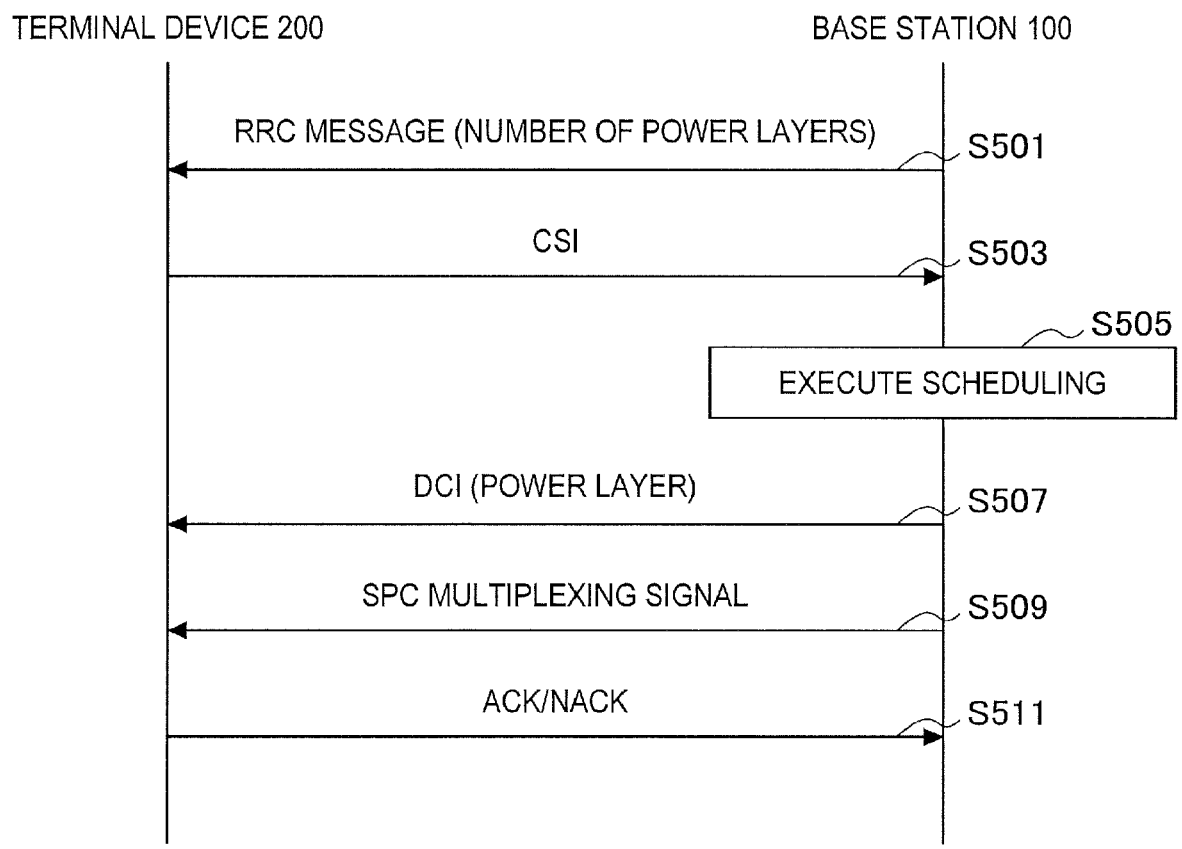
FIG. 26 is a sequence diagram illustrating a first example of a schematic flow of a process including a notification from a base station to a terminal device.

FIG. 26 is a sequence diagram illustrating a first example of a schematic flow of a process including notification from the base station 100 to the terminal device 200.

The base station 100 notifies the terminal device 200 of the number of power layers through a signaling message destined for the terminal device 200 (S501). For example, the base station 100 transmits an RRC message which is destined for the terminal device 200 and includes the number of power layers. As a specific example, the base station 100 transmits the RRC message during or after a random access procedure or a handover procedure.

The terminal device 200 reports channel state information (CSI) to the base station 100 (S503).

The base station 100 performs scheduling (S505).

The base station 100 notifies the terminal device 200 of a power layer (i.e., a power layer for transmitting a signal destined for the terminal device 200) for the terminal device 200 through DCI destined for the terminal device 200 (S507). For example, the base station 100 transmits DCI which is destined for the terminal device 200 and indicates the power layer over a PDCCH.

The base station 100 multiplexes signals destined for a plurality of terminal devices 200 using SPC (i.e., multiplexes a plurality of power layers) to transmit SPC multiplexed signals. For example, the base station 100 transmits the SPC multiplexed signals over a physical downlink shared channel (PDSCH) (S509).

The terminal device 200 performs a reception process and transmits ACK/NACL to the base station 100 (S511).

(b) Second Example

Figure 27:
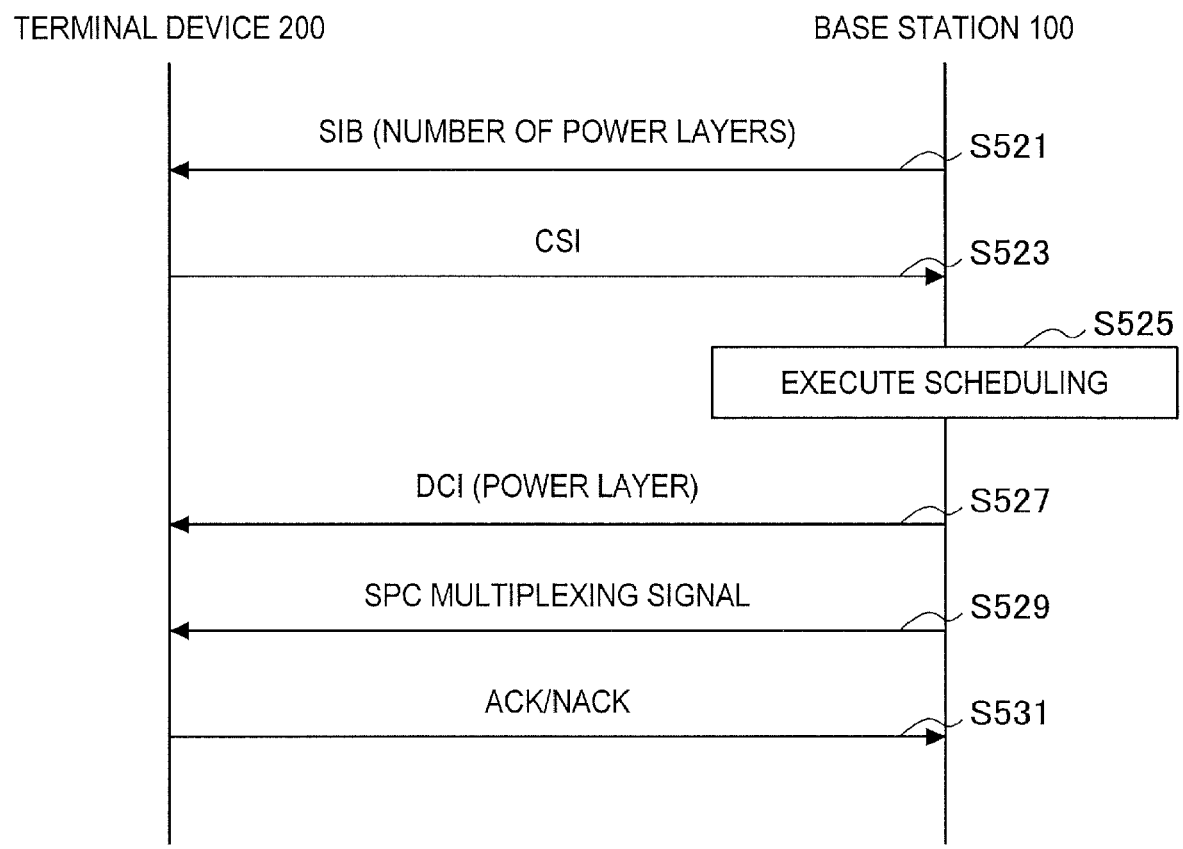
FIG. 27 is a sequence diagram illustrating a second example of a schematic flow of a process including a notification from a base station to a terminal device.

FIG. 27 is a sequence diagram illustrating a second example of a schematic flow of a process including notification from the base station 100 to the terminal device 200.

Figure 28:
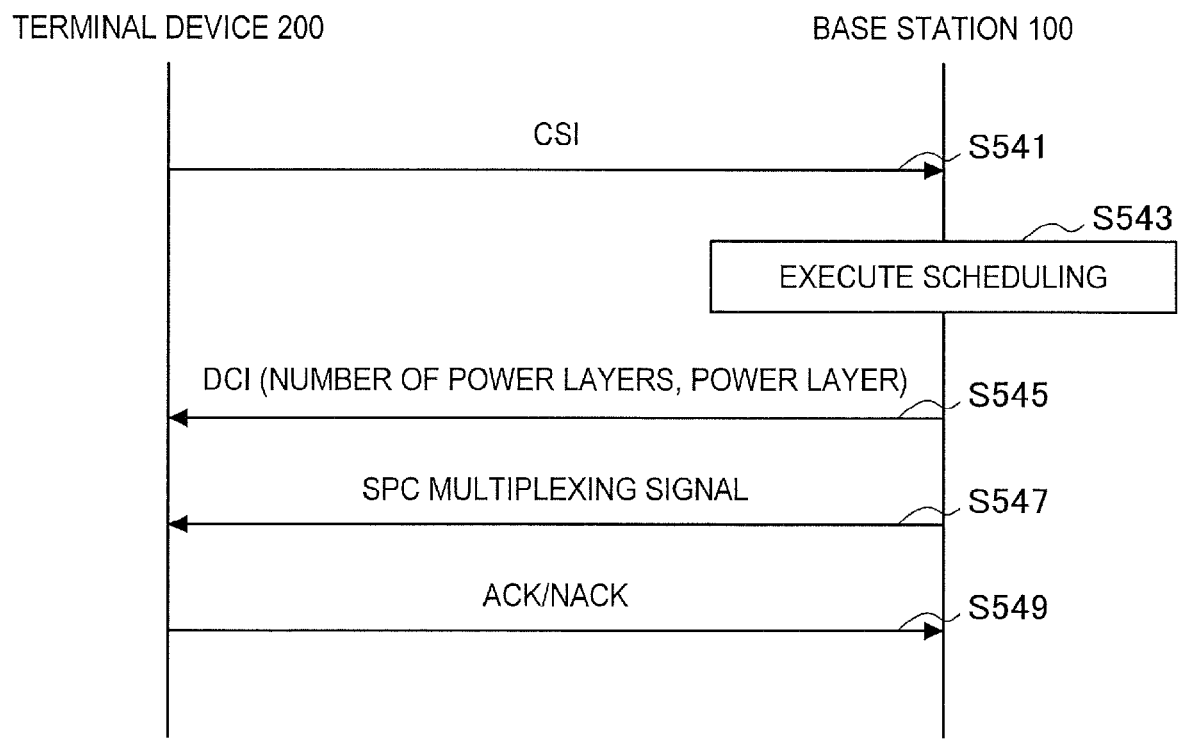
FIG. 28 is a sequence diagram illustrating a third example of a schematic flow of a process including a notification from a base station to a terminal device.

A description of steps 523 to S531 illustrated in FIG. 27 is the same as a description of S503 to S511 illustrated in FIG. 28. Accordingly, redundant descriptions will be omitted and only step S521 will be described herein.

The base station 100 notifies the terminal device 200 of the number of power layers through an SIB (S521). For example, the base station 100 transmits an SIB indicating the number of power layers.

(c) Third Example

FIG. 28 is a sequence diagram illustrating an example of a third example of a schematic flow of a process including notification from the base station 100 to the terminal device 200.

The terminal device 200 reports channel state information (CSI) to the base station 100 (S541).

The base station 100 performs scheduling (S543).

The base station 100 notifies the terminal device 200 of the number of power layers and a power layer for the terminal device 200 (i.e., a power layer for transmitting a signal destined for the terminal device 200) through DCI destined for the terminal device 200 (S507). For example, the base station 100 transmits DCI which is destined for the terminal device 200 and indicates the number of power layers and the power layer over a PDCCH.

The base station 100 multiplexes signals destined for a plurality of terminal devices 200 using SPC (i.e., multiplexes a plurality of power layers) to transmit SPC multiplexed signals. For example, the base station 100 transmits the SPC multiplexed signals over a PDSCH (S547).

The terminal device 200 performs a reception process and transmits ACK/NACL to the base station 100 (S549).

5.3. First Modified Example

Next, a first modified example of the first embodiment will be described with reference to FIGS. 29 to 34.

(1) Technical Feature

As described above, the base station 100 multiplexes power layers using SPC. Particularly, in the first modified example of the first embodiment, spatial layers are also multiplexed while power layers are multiplexed using SPC.

For example, the base station 100 generates transmission signal sequences of multiple power layers multiplexed using power allocation for each of one or more spatial layers and interleaves the transmission signal sequence of the power layer using an interleaver corresponding to the power layer for each of one or more of the multiple power layers. That is, multiplexing using power allocation is performed in spatial layers.

(a) Multiplexing Based on Propagation Characteristics

For example, the base station 100 multiplexes spatial layers and power layers in consideration of propagation characteristics for a user (the terminal apparatus 200).

(a-1) Precoding Matrix

For example, the base station 100 multiplexes spatial layers and power layers in consideration of a precoding matrix used by the user (the terminal device 200).

For example, the transmission signal sequences of the multiple power layers are transmission signal sequences destined for multiple users, and the multiple users use the same precoding matrix. That is, the transmission signal sequences destined for the multiple users (e.g., multiple terminal devices 200) using the same precoding matrix are transmitted through different power layers of the same spatial layer.

(a-2) Communication Quality

For example, the base station 100 multiplexes spatial layers and power layers in consideration of communication quality of the user (the terminal device 200).

For example, the transmission signal sequences of the multiple power layers are transmission signal sequences destined for multiple users, and the multiple users have different communication qualities. That is, the transmission signal sequences destined for the multiple users (e.g., multiple terminal devices 200) having different communication qualities are transmitted through different power layers of the same spatial layer.

As an example, the different communication qualities may be different path losses or different path gains. As another example, the different communication qualities may be different CQIs or different MCSs. As yet another example, different communication qualities may be different SINRs. Further, the different communication qualities are certainly not limited to such examples.

Accordingly, for example, it is possible to prevent allocated transmission powers from being equalized in power layers. That is, a power difference between power layers can be obtained and interference cancellation can be further facilitated.

(a-3) Others

The base station 100 may multiplex spatial layers and power layers in consideration of other pieces of information. As a specific example, the other pieces of information may be a channel response, an RI or the like between the base station 100 and the terminal device 200.

(b) Example of Multiplexing (b-1) First Example

Figure 29:
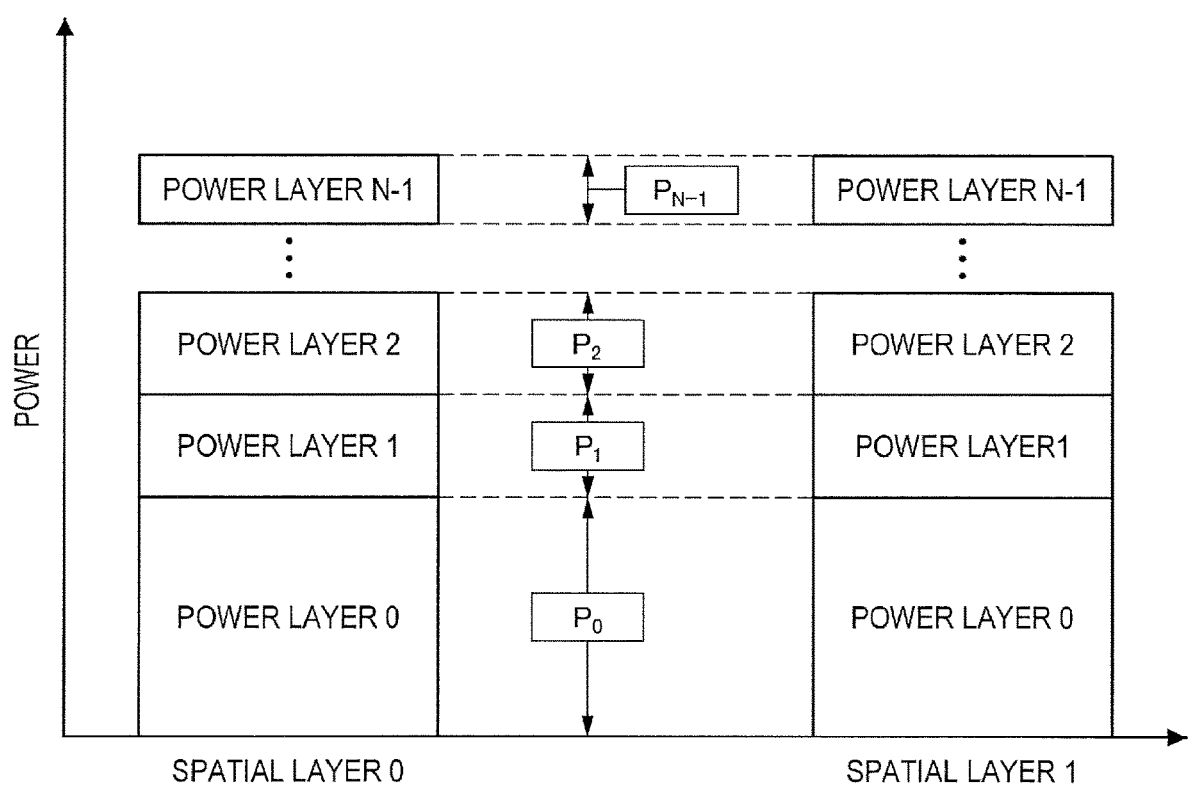
FIG. 29 is an explanatory diagram for explaining a first example of multiplexing spatial layers and power layers.

FIG. 29 is an explanatory diagram for explaining a first example of multiplexing spatial layers and power layers. Referring to FIG. 29, a multiplexed spatial layer 0 and a spatial layer 1 and power layers 0 to N−1 multiplexed in each of the spatial layers are illustrated. In this example, the same transmission power is allocated to each of the power layers 0 to N−1 in the spatial layer 0 and the spatial layer 1. For example, in both the spatial layer 0 and the spatial layer 1, transmission power allocated to the power layer 0 is power $P_0$, transmission power allocated to the power layer 1 is power $P_1$, and transmission power allocated to the power layer N−1 is power $P_{N-1}$.

(b) Example of Multiplexing (b-2) Second Example

Figure 30:
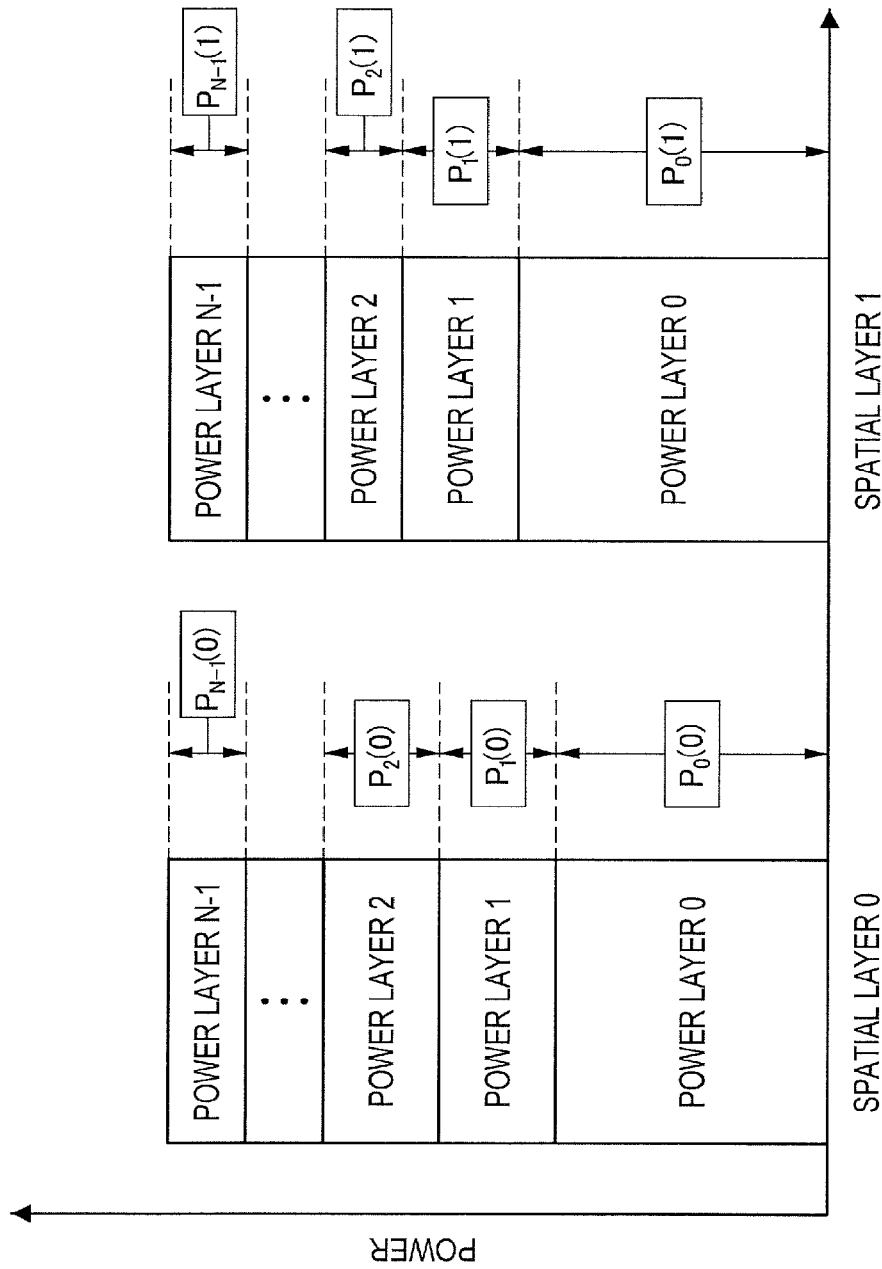
FIG. 30 is an explanatory diagram for explaining a second example of multiplexing spatial layers and power layers.

FIG. 30 is an explanatory diagram for explaining a second example of multiplexing spatial layers and power layers. Referring to FIG. 30, the multiplexed spatial layer 0, the spatial layer 1, and transmission power allocated to the power layers 0 to N−1 multiplexed in each of the spatial layers are illustrated. In this example, transmission powers allocated to each of the power layers 0 to N−1 in the spatial layer 0 and the spatial layer 1 are not limited to the same transmission power and may be different. For example, transmission power allocated to the power layer 0 in the spatial layer 0 is power $P_0(0)$, whereas transmission power allocated to the power layer 0 in the spatial layer 1 is power $P_0(1)$ ($>P_0(0)$). In addition, for example, transmission power allocated to the power layer N−1 in the spatial layer 0 is power $P_{N-1}(0)$ whereas transmission power allocated to the power layer N−1 in the spatial layer 1 is power $P_{N-1}(1)$ ($<P_{N-1}(0)$).

(2) Process Flow (a) Selection for Multiplexing

Figure 31:
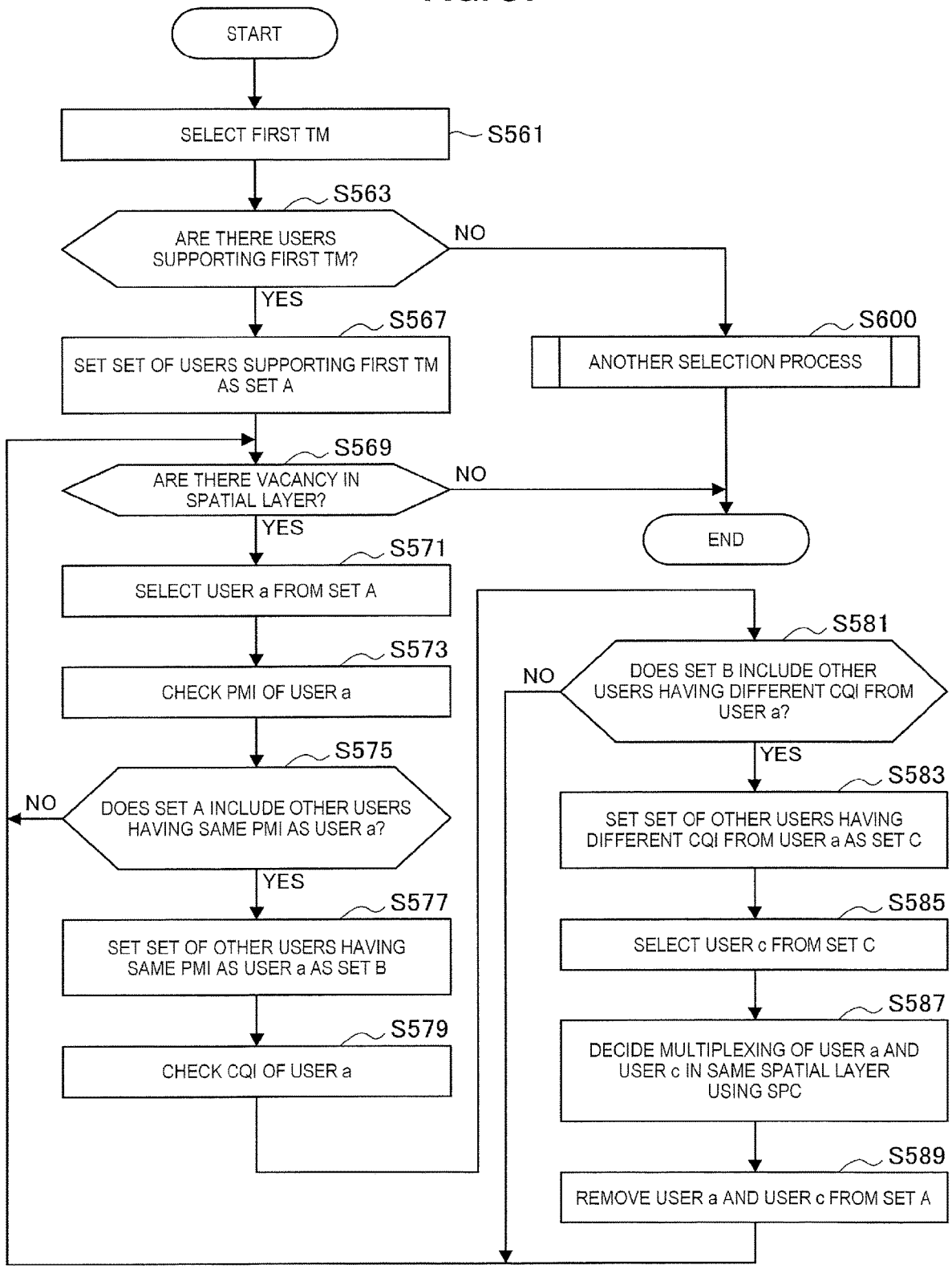
FIG. 31 is a flowchart illustrating an example of a schematic flow of a multiplexing determination process according to a first modified example of the first embodiment.

FIG. 31 is a flowchart illustrating an example of a schematic flow of a multiplexing decision process according to the first modified example of the first embodiment. For example, each step of the multiplexing decision process is performed by the processing unit 150 of the base station 100.

The base station 100 selects a first transmission mode (TM) (S561). The first TM is a TM in which both spatial multiplexing and SPC multiplexing are performed.

When there are no users (the terminal device 200) supporting the first TM (S563: NO), the base station 100 performs another selection process (S600). Then, the process ends.

When there are users (the terminal device 200) supporting the first TM (S563: YES), the base station 100 sets a set of users supporting the first TM as a set A.

When there are no vacancies in spatial layers (S569: NO), the process ends. When a vacancy exists in the spatial layers (S569: YES), the base station 100 select a user a from the set A (S571). Meanwhile, a PMI of the user a differs from a PMI of another spatial layer that has been already decided.

The base station 100 checks the precoding matrix indicator (PMI) of the user a (S573). When the set A does not include other users having the same PMI as the user a (S575: NO), the process returns to step S569. When the set A includes other users having the same PMI as the user a (S575: YES), the base station 100 sets a set of the other users having the same PMI as the user a as a set B.

The base station 100 checks a CQI of the user a (S579). When the set B does not include other users having different CQIs from the user a (S581: NO), the process returns to step S569. When the set B includes other users having different CQIs from the user a (S581: YES), the base station 100 sets a set of the other users having different CQIs from the user a as a set C (S583).

The base station 100 selects a user c from the set C (S585) and decides multiplexing of the user a and the user c using SPC in the same spatial layer (S587). Then, the base station 100 removes the user a and the user c from the set A (S589) and the process returns to step S569.

As described above, steps S569 to 589 are repeated as long as a vacancy exists in the spatial layers (and as long as a candidate user exists).

Meanwhile, although the CQI is used as communication quality in the above-described example, an MCS, path loss, path gain, or the like may be used instead of the CQI.

(b) Other Selection

Figure 32:
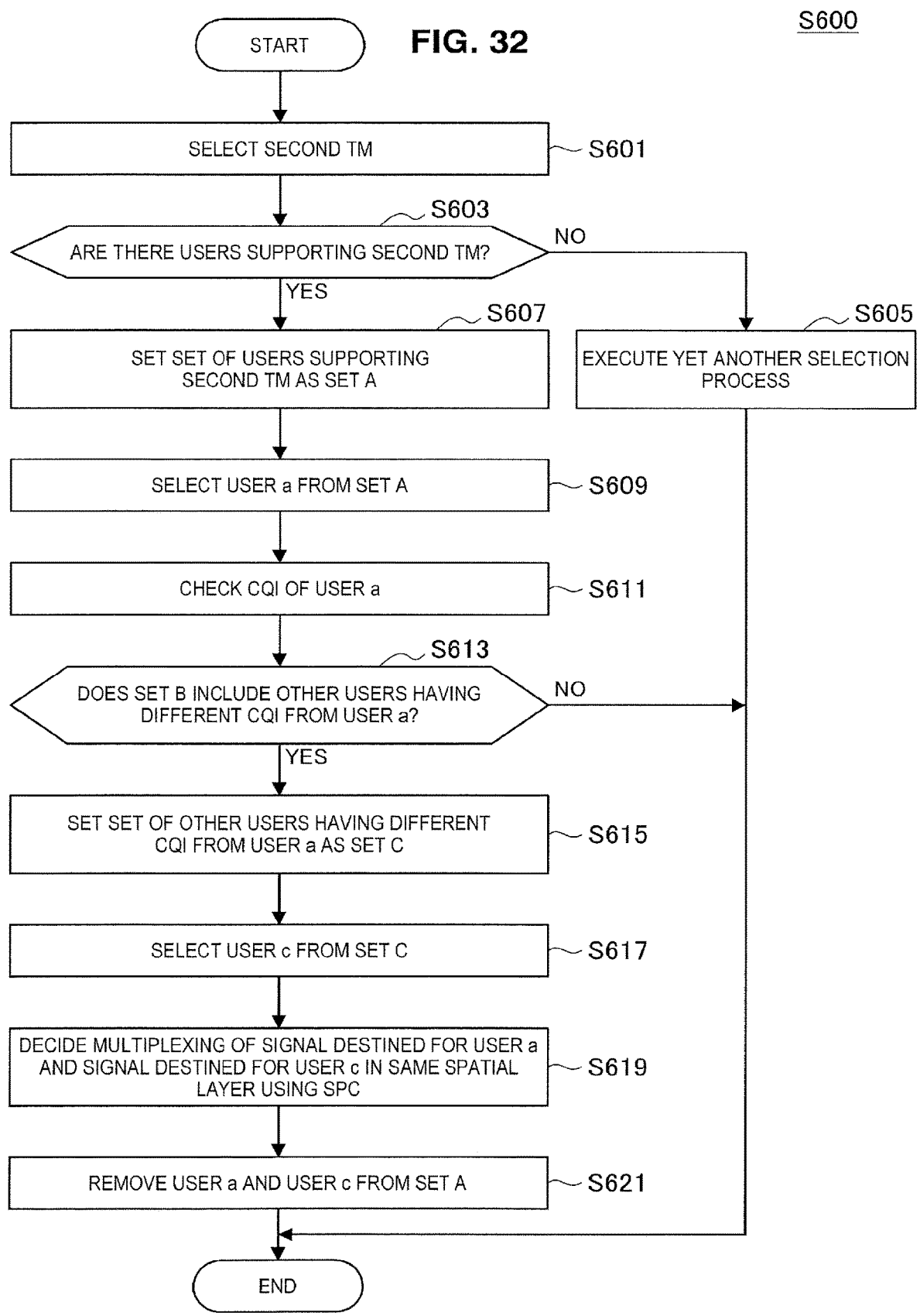
FIG. 32 is a flowchart illustrating an example of a schematic flow of another selection process.

FIG. 32 is a flowchart illustrating an example of a schematic flow of another selection process. The other selection process corresponds to step S600 illustrated in FIG. 30. For example, each step of the other selection process is performed by the processing unit 150 of the base station 100.

The base station 100 selects a second transmission mode (TM) (S601). The second TM is a TM in which spatial multiplexing is not performed while SPC multiplexing is performed.

When there are no users (the terminal device 200) supporting the second TM (S603: NO), the base station 100 performs yet another selection process (S605). Then, the process ends.

When there are users (the terminal device 200) supporting the second TM (S603: YES), the base station 100 sets a set of users supporting the second TM as a set A (S607). Then the base station 100 selects a user a from the set A (S609).

The base station 100 checks a CQI of the user a (S611). When a set B does not include any other users having different CQIs from the user a (S613: NO), the process ends. When the set B includes other users having different CQIs from the user a (S613: YES), the base station 100 sets a set of the other users having different CQIs from the user a as a set C (S615).

The base station 100 selects a user c from the set C (S617) and decides multiplexing of the user a and the user c using SPC in the same spatial layer (S619). Then, the base station 100 removes the user a and the user c from the set A (S621) and the process ends.

Meanwhile, although the CQI is used as communication quality in the above-described example, an MCS, path loss, path gain or the like may be used instead of the CQI.

(c) Decision of Transmission Power

Figure 33:
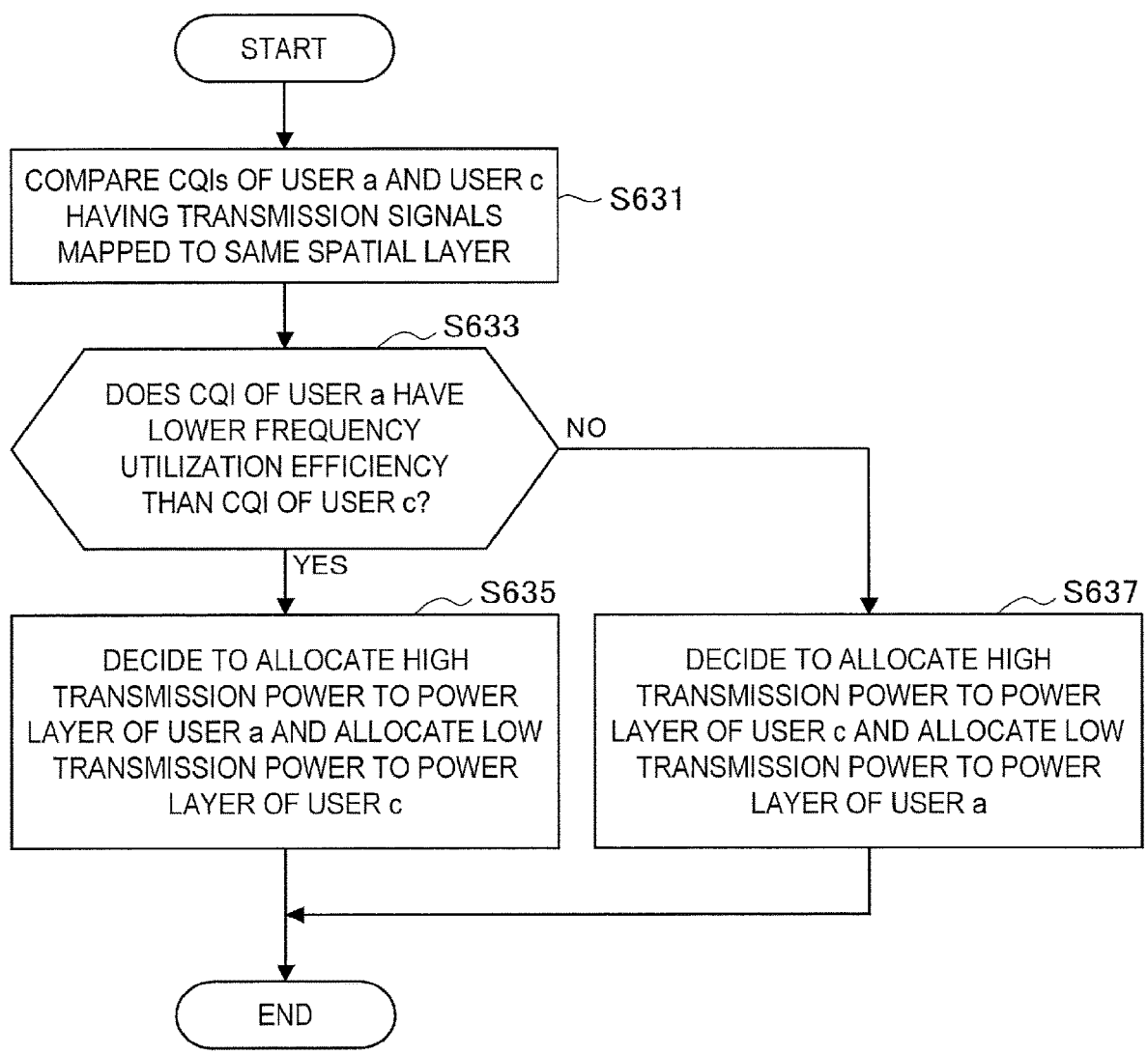
FIG. 33 is a flowchart illustrating an example of a schematic flow of a transmission power determination process according to the first modified example of the first embodiment.

FIG. 33 is a flowchart illustrating an example of a schematic flow of a transmission power decision process according to the first modified example of the first embodiment. For example, each step of the transmission power decision process is performed by the processing unit 150 of the base station 100.

The base station 100 compares CQIs of a user a and a user c having transmission signals mapped to the same spatial layer (S631).

When the CQI of the user a has lower frequency utilization efficiency than the CQI of the user c (S636: YES), the base station 100 (the processing unit 150) decides to allocate high transmission power to a power layer of the user a and allocate low transmission power to a power layer of the user c (S635). Then, the process ends. Thereafter, the base station 100 (the third transmission processing unit 155) allocates the high transmission power to a power layer through which a signal destined for the user a is transmitted and allocates the low transmission power to a power layer though which a signal destined for the user c is transmitted.

When the CQI of the user a has higher frequency utilization efficiency than the CQI of the user c (S636: NO), the base station 100 (the processing unit 150) decides to allocate low transmission power to the power layer of the user a and allocate high transmission power to the power layer of the user c (S637). Thereafter, the base station 100 (the third transmission processing unit 155) allocates the low transmission power to the power layer through which the signal destined for the user a is transmitted and allocates the high transmission power to the power layer through which the signal destined for the user c is transmitted.

Meanwhile, although the CQI is used as communication quality in the above-described example, an MCS, path loss, path gain or the like may be used instead of the CQI.

(d) Transmission Process

Figure 34:
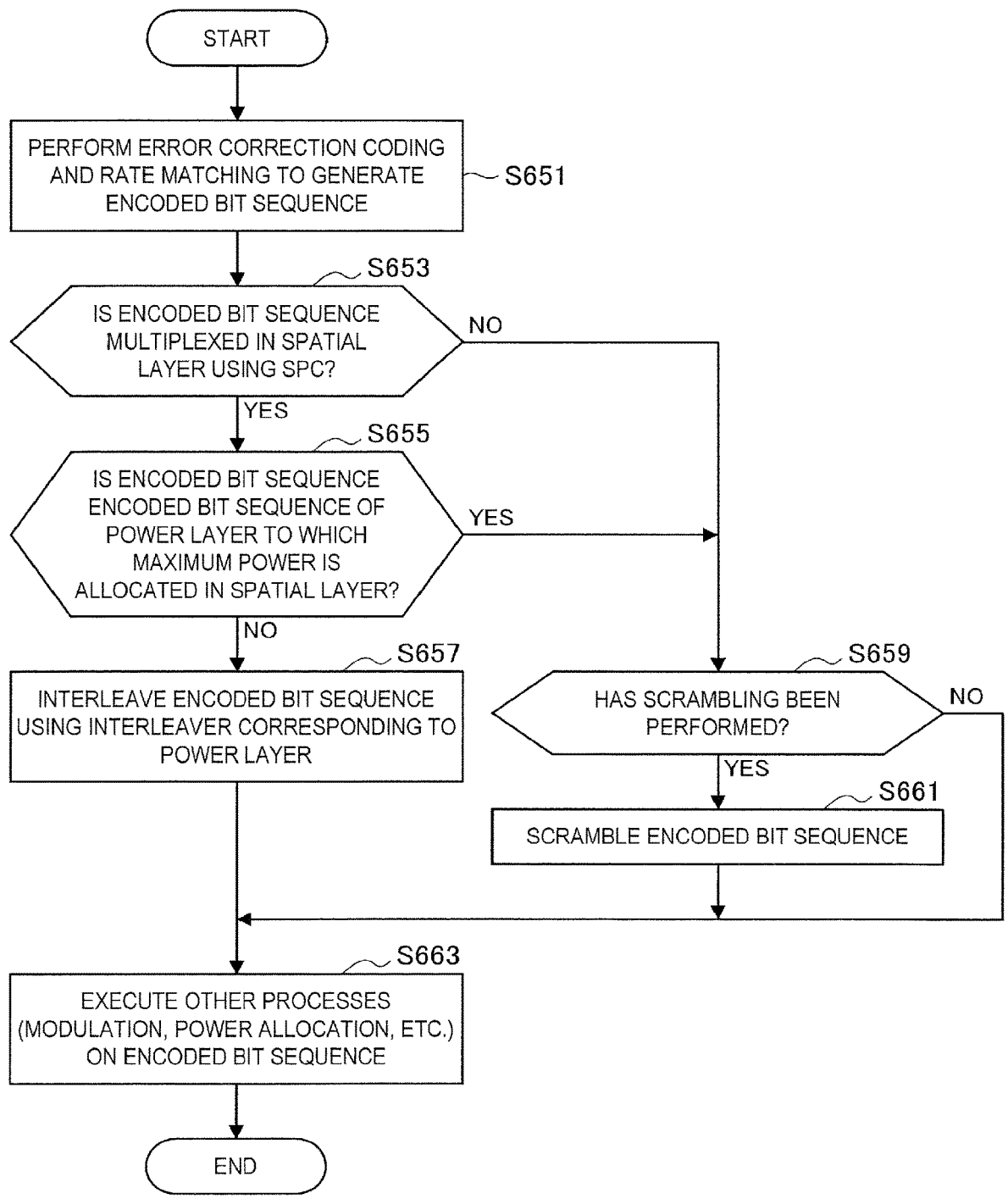
FIG. 34 is a flowchart illustrating an example of a schematic flow of a transmission process of a base station according to the first modified example of the first embodiment.

FIG. 34 is a flowchart illustrating an example of a schematic flow of a transmission process of the base station 100 according to the first modified example of the first embodiment.

The base station 100 (the first transmission processing unit 151) performs error correction coding and rate matching to generate an encoded bit sequence (S651).

When the encoded bit sequence is multiplexed using SPC in a spatial layer (S653: YES) and the encoded bit sequence is not an encoded bit sequence of a power layer to which maximum power is allocated in the spatial layer (S655: NO), the base station 100 (the second transmission processing unit 153) interleaves the encoded bit sequence (of a power layer) using an interleaver corresponding to the power layer (S657).

If the encoded bit sequence is not multiplexed using SPC in a spatial layer (S653: NO) and the encoded bit sequence is the encoded bit sequence of the power layer to which the maximum power is allocated in the spatial layer (S655: YES), when scrambling is performed (S59: YES), the base station 100 (e.g., the second transmission processing unit 153) scrambles the encoded bit sequence (S661). In this manner, scrambling may be performed when interleaving is not performed.

The base station 100 (e.g., the second transmission processing unit 153) performs other processes (e.g., modulation, power allocation and the like) on the encoded bit sequence (which has been interleaved or scrambled) (S663). Then, the process ends.

Meanwhile, although the CQI is used as communication quality in the above-described example, an MCS, path loss, path gain, or the like may be used instead of the CQI.

5.4. Second Modified Example

Next, a second modified example of the first embodiment will be described.

In the aforementioned example of the first embodiment, for each of one or more of the multiple power layers, the base station 100 (the second transmission processing unit 153) processes the transmission signal sequence of the power layer using the interleaver corresponding to the power layer. In addition, the terminal device 200 (the information acquisition unit 241) performs a reception process using the deinterleaver corresponding to each of at least one of the multiple power layers.

Meanwhile, in the second modified example, particularly, a scrambler and a descrambler corresponding to a power layer are used instead of an interleaver and a deinterleaver corresponding to the power layer. That is, for each of one or more of multiple power layers, the base station 100 (the second transmission processing unit 153) processes a transmission signal sequence of the power layer using a scrambler corresponding to the power layer. In addition, the terminal device 200 (the information acquisition unit 241) performs a reception process using a scrambler corresponding to each of the at least one of the multiple power layers.

Accordingly, for example, effects equal or similar to those obtained when an interleaver and a deinterleaver corresponding to the power layer are used are achieved. That is, decoding accuracy when multiplexing/multiple access using power allocation is performed can be further improved.

Meanwhile, there are no special differences between a description of the second modified example and the description of the aforementioned examples (including the first modified example) of the first embodiment except that "interleaver" is replaced by "scrambler," "interleave" is replaced by "scramble," "interleaving" is replaced by "scrambling," "deinterleaver" is replaced by "descrambler," "deinterleave" is replaced by "descramble," and "deinterleaving" is replaced by "descrambling." Accordingly, redundant descriptions will be omitted herein.

As an example, when an $i^{-th}$ bit of a scrambled input bit sequence of a user u (or power layer u) is set to $b_u(i)$ and an $i^{-th}$ bit of a sequence for scrambling is set to $c_u(i)$, an $i^{-th}$ bit $b_{\tilde{u}}(i)$ of a scrambled output bit sequence is expressed as follows.

$$\tilde{b}_u(i) = (b_u(i) + c_u(i)) \bmod 2 \qquad \text{[Math. 22]}$$

That is, if the bit $c_u(i)$ is 0, the $i^{-th}$ bit $b_{\tilde{u}}(i)$ of the output bit sequence is the same as the $i^{-th}$ bit $b_u(i)$ of the input bit sequence. Conversely, if the bit $c_u(i)$ is 1, the $i^{-th}$ bit $b_{\tilde{u}}(i)$ of the output bit sequence is a bit obtained by reversing (0 to 1 or 1 to 0) the $i^{-th}$ bit $b_u(i)$ of the input bit sequence.

The sequence for scrambling may be said to be a scrambling pattern. Further, the input bit sequence and the output bit sequence may be said to be an input bit sequence and an output bit sequence of a scrambler.

Although a specific example of scrambling has been described, a reverse process of scrambling is obviously performed as descrambling.

6. SECOND EMBODIMENT

Next, a second embodiment will be described with reference to FIGS. 35 to 38.

1. Technical Features

Figure 35:
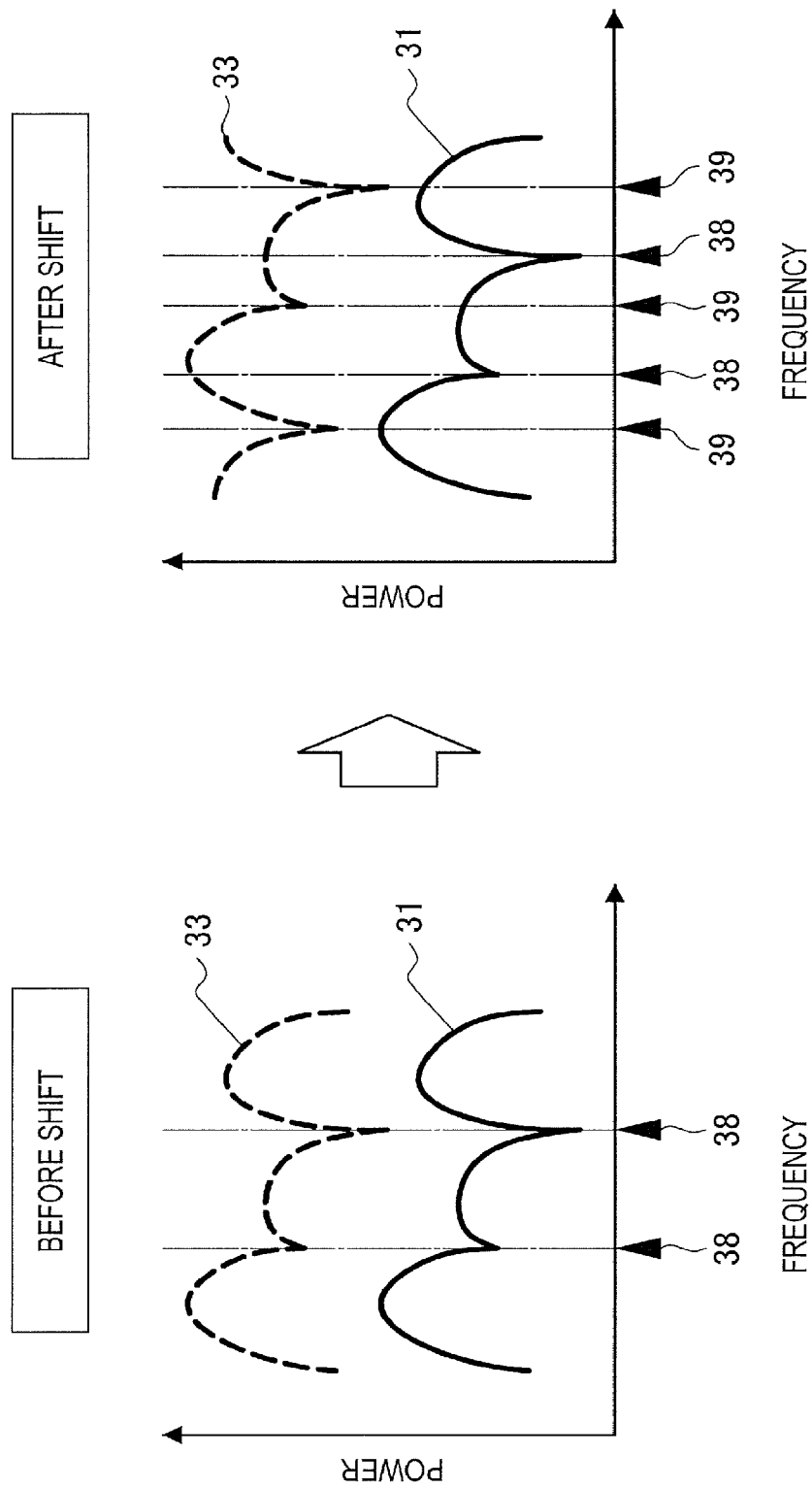
FIG. 35 is an explanatory diagram for explaining an example of shift of channel variation in a frequency direction.

First, technical features of the second embodiment will be described with reference to FIG. 35.

(1) Layer Phase Rotation

The base station 100 (the first transmission processing unit 151) generates transmission signal sequences of multiple power layers multiplexed using power allocation. Then, for each of one or more of the multiple power layer, the base station 100 (the second transmission processing unit 153) processes the transmission signal sequence of the power layer using a phase coefficient corresponding to the power layer. More specifically, the base station 100 (the second transmission processing unit 153) rotates a phase of the transmission signal sequence of the power layer using the phase coefficient corresponding to the power layer.

The terminal device 200 (the information acquisition unit 241) acquires a phase coefficient corresponding to each of at least one of the multiple power layers. Then, the terminal device 200 (the reception processing unit 241) performs a reception process using the phase coefficient corresponding to each of the at least one power layer.

Meanwhile, for example, the transmission signal sequence is a transmitted data signal sequence, and the base station 100 (the second transmission processing unit 153) does not rotate a phase of a reference signal using a phase coefficient corresponding to a power layer.

(a) Multiplexing Using Power Allocation

For example, the multiple power layers are power layers multiplexed using SPC.

(b) Generation of Transmission Signal Sequence

For example, the transmission signal sequences are symbol sequences. The base station 100 (the first transmission processing unit 151) generates symbol sequences of the multiple power layers.

Specifically, for example, the first transmission processing unit 151 performs CRC coding, FEC coding, rate matching, scrambling/interleaving, modulation, layer mapping, power allocation or the like (as illustrated in FIGS. 1 and 2, for example) for each of the multiple power layers to generate a symbol sequence of the power layer.

(c) Phase Coefficient Corresponding to Layer

(c-2) First Example: Phase Coefficient Specific to Power Layer

As a first example, a phase coefficient corresponding to a power layer is a phase coefficient specific to the power layer. In this case, for example, the phase coefficient specific to the power layer is generated (for example, by the user) on the basis of information about the power layer (e.g., an index of the power layer).

Accordingly, for example, the terminal device 200 can easily acquire a phase coefficient of each power layer.

(c-2) Second Example: Phase Coefficient Specific to User

As a second example, the transmission signal sequence of the power layer is a transmission signal sequence destined for a user (i.e., the terminal device 200), and the phase coefficient corresponding to the power layer may be a phase coefficient specific to the user. Two or more power layers are not allocated to one user (i.e., transmission signal sequences of two or more layers are not transmission signal sequences of the same user) and only one power layer may be allocated to one user.

The phase coefficient specific to the user may be generated (for example, by the user) on the basis of identification information of the user. The identification information may be an RNTI of the user.

Accordingly, for example, the terminal device 200 can acquire a phase coefficient without information about a power layer (e.g., an index of the power layer).

(c-3) Example of Phase Coefficient

Transmission Side

For example, a phase coefficient of a transmission side (i.e., a phase coefficient used by the base station 100) is a coefficient as follows.

$$\exp\left(j\frac{2\pi p}{N_P}\right)\exp\left(j\frac{2\pi l}{N_{SL}}\right)\exp\left(j\frac{2\pi k}{N_{SC}}\right)\exp\left(j\frac{2\pi t}{N_{SYM}}\right) \qquad \text{[Math. 23]}$$

$N_P$ is the number of power layers, $N_L$ is the number of spatial layers, $N_{SC}$ is the number of subcarriers, $N_{SYM}$ is the number of symbols per subframe or slot, p is a power layer index, l is a spatial layer index, k is a subcarrier index, and t is a symbol index.

Reception Side

For example, a phase coefficient of a reception side (i.e., a phase coefficient used by the terminal device 200) is a coefficient as follows.

$$\exp\left(-j\frac{2\pi p}{N_P}\right)\exp\left(-j\frac{2\pi l}{N_{SL}}\right)\exp\left(-j\frac{2\pi k}{N_{SC}}\right)\exp\left(-j\frac{2\pi t}{N_{SYM}}\right) \quad \text{[Math. 24]}$$

Accordingly, phase rotation (i.e., rotation for returning to an original phase) which is reverse of phase rotation of the transmission side is executed.

(d) One or More Layers

There are no special differences in the description of the one or more layers between the first embodiment and the second embodiment. Accordingly, redundant descriptions will be omitted herein.

(e) Example of Phase Rotation

(e-1) First Example

As a first example, the phase coefficient corresponding to the power layer is a frequency shift amount corresponding to the power layer.

More specifically, for example, the phase of a signal (symbol) of a power layer is rotated (i.e., the signal of the power layer is shifted in a frequency direction) as follows.

$$\hat{s}_{i,u}(t)=s_{i,u}(t)\exp(-j2\pi t\Delta_T F_{shift,i,u}) \quad \text{[Math. 25]}$$

$S_{i,u}(t)$ is a signal sample (symbol) destined for a user u in a cell i at a time t before phase rotation, and $\hat{s}_{i,u}(t)$ is a signal sample after phase rotation. In addition, $\Delta_T$ is a sample spacing. Further, $F_{shift,i,u}$ is a phase coefficient and, more specifically, a frequency shift amount.

(e-2) Second Example

As a second example, the phase coefficient corresponding to the power layer may be a time shift amount corresponding to the power layer.

More specifically, the phase of a signal (symbol) of the power layer may be rotated (i.e., a signal of the power layer may be shifted in a time direction) as follows.

$$\hat{S}_{i,u}(k)=S_{i,u}(k)\exp(-j2\pi\Delta_F T_{shift,i,u}) \quad \text{[Math. 26]}$$

$S_{i,u}(k)$ is a symbol of a frequency k (e.g., subcarrier k) before phase rotation (while being symbol destined for the user u in the cell i) and $\hat{s}_{i,u}(k)$ is a sample after phase rotation. In addition, $\Delta_F$ is a frequency spacing (e.g., subcarrier spacing). Further, $T_{shift,i,u}$ is a phase coefficient and, more specifically, a time shift amount.

Meanwhile, when the base station 100 performs an inverse Fourier transform, the phase of the signal (symbol) of the power layer may be rotated (i.e., the signal of the power layer may be shifted in the time direction) as follows.

$$\hat{s}_{i,u}(t) = \frac{1}{\sqrt{K}}\sum_{k=0}^{K-1} S_{i,u}(k)\exp\{j2\pi k\Delta_F(t - T_{shift,i,u})\} \quad \text{[Math. 27]}$$

$\hat{s}_{i,u}(t)$ is a signal sample (symbol) destined for the user u in the cell i at a time t after phase rotation.

(f) Effect of Phase Rotation

According to the aforementioned phase rotation, for example, decoding accuracy can be further improved when multiplexing/multiple access using power allocation is performed.

More specifically, for example, fading (e.g., fading of frequency selectivity and/or time selectivity) is equally generated in multiple power layers multiplexed using SPC, as described above. That is, channels identically change in the multiple power layers. Accordingly, it is possible to pseudo-delay a channel variation for each of the power layers by differently performing phase rotation for the power layers. For example, channel variation can be shifted in the frequency direction in a frequency region through linear shifting in the time direction. Accordingly, for example, significant fading is generated at different positions in each of the power layers, and thus a pseudo spatial diversity effect can be obtained and interference cancellation and decoding accuracy can be improved.

A specific example will be described with reference to FIG. 35. FIG. 35 is an explanatory diagram for explaining an example of a channel variation shift in the frequency direction. Referring to FIG. 35, received power 31 of the power layer 0 and received power 33 of the power layer 1 before a shift with respect to the power layer 1 in the frequency direction, and the received power 31 of the power layer 0 and the received power 33 of the power layer 1 after the shift are illustrated. Although significant fading occurs at a frequency 38 for the power layer 0 and the power layer 1 before the shift, a position at which the significant fading occurs for the power layer 1 is pseudo-shifted from the frequency 38 to a position 39 after the shift. Consequently, the significant fading occurs at different positions for the power layer 0 and the power layer 1, and thus interference cancellation and decoding accuracy can be improved.

(2) Notification to Terminal Device

(a) Power Layer

As described above, for each of the one or more of the multiple power layers, the base station 100 (the second transmission processing unit 153) rotates a phase of a transmission signal sequence of a power layer using a phase coefficient corresponding to the power layer.

For example, the transmission signal sequence of the power layer is a transmission signal sequence destined for a user (i.e., the terminal device 200) and the base station 100 (the notification unit 157) notifies the user of the power layer. Accordingly, for example, the user can be made aware of a power layer through which a signal destined for the user is transmitted.

For example, the base station 100 (the notification unit 157) notifies the user of the power layer through DCI destined for the user. The base station 100 transmits the DCI over a PDCCH. As a specific process, the notification unit 157 generates DCI which is destined for the user and indicates the power layer. Accordingly, for example, it is possible to dynamically change the power layer for the user for each radio resource allocation.

(b) Number of Power Layers

There are no special differences in the description of notification of the number of power layers between the first embodiment and the second embodiment. Accordingly, redundant descriptions will be omitted herein.

(c) Whether Phase Coefficient is Used

The base station 100 (the notification unit 157) may notify the user of whether a phase coefficient is used for the transmission signal sequence (i.e., the transmission signal sequence of the power layer) destined for the user. Accordingly, for example, the user can be easily made aware of whether a phase coefficient is used.

The base station 100 (the notification unit 157) may notify the user of whether a phase coefficient is used through the DCI destined for the user. As a specific process, the notification unit 157 may generate DCI which is destined for the user and indicates whether a phase coefficient is used. Accordingly, for example, it is possible to dynamically change whether to use a phase coefficient for each radio resource allocation.

Further, the base station 100 (the notification unit 157) may notify the user of whether phase coefficients are used for transmission signal sequences of each of the multiple power layers including the power layer. Accordingly, for example, the user (i.e., the terminal device 200) can be easily made aware of whether a phase coefficient is used for each of the power layers. Accordingly, interference cancellation can be further facilitated.

(3) Transmission Power Allocated to Power Layer

There are no special differences in the description of power allocated to a power layer between the first embodiment and the second embodiment.

Accordingly, redundant descriptions will be omitted herein.

6.2. Process Flow

Next, an example of a process according to the second embodiment will be described with reference to FIGS. 36 and 37.

(1) Transmission Process

Figure 36:
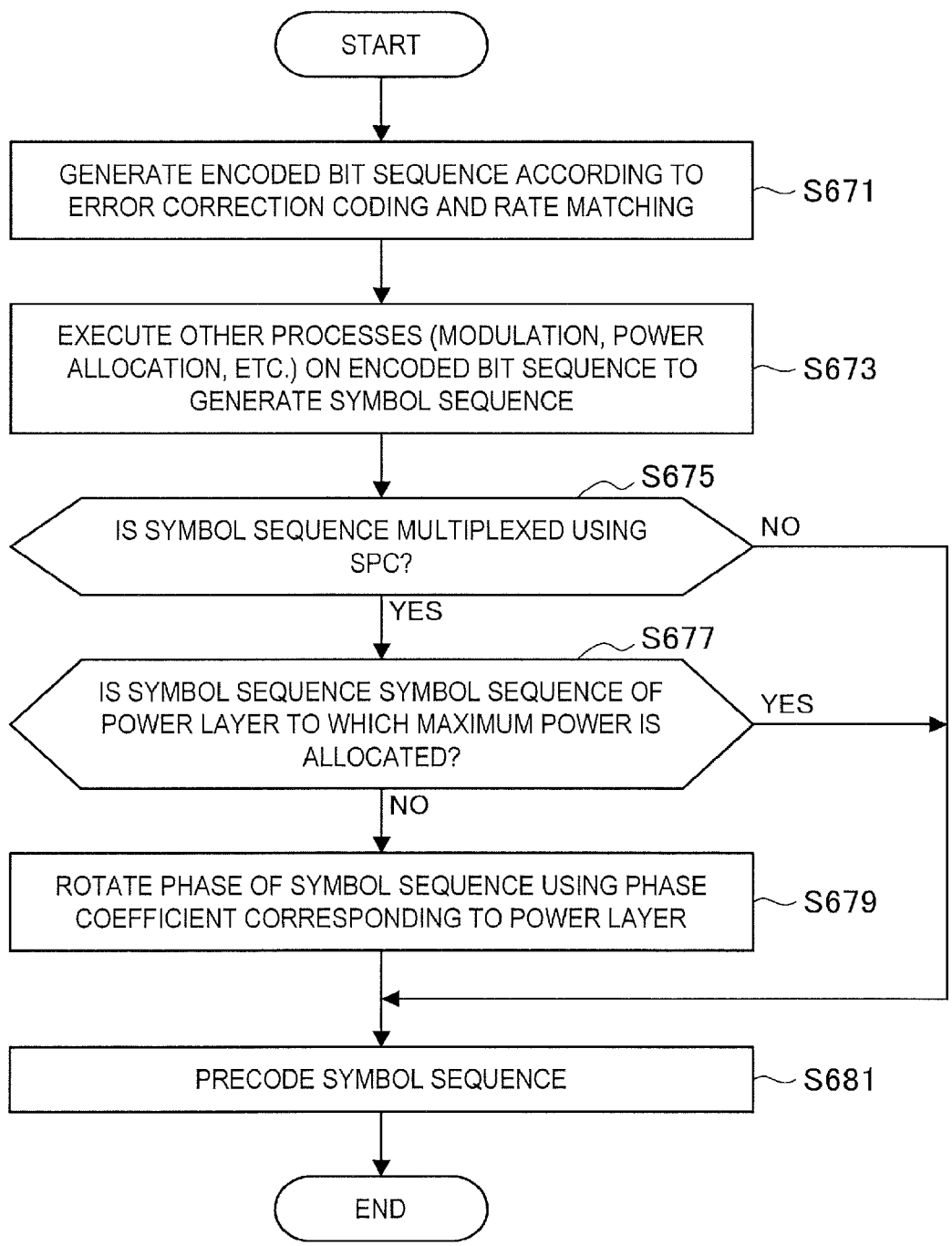
FIG. 36 is a flowchart illustrating an example of a schematic flow of a transmission process of a base station according to a second embodiment.

FIG. 36 is a flowchart illustrating an example of a schematic flow of a transmission process of the base station 100 according to the second embodiment.

The base station 100 (the first transmission processing unit 151) performs error correction coding and rate matching to generate an encoded bit sequence (S671). Further, the base station 100 (the first transmission processing unit 151) executes other processes (modulation, power allocation, and the like) on the encoded bit sequence to generate a symbol sequence (S673).

When the symbol sequence is multiplexed using SPC (S675: YES) and the symbol sequence is not a symbol sequence of a power layer to which maximum power is allocated (S677: NO), the base station 100 (the second transmission processing unit 153) rotates a phase of the symbol sequence (of a power layer) using a phase coefficient corresponding to the power layer (S679).

The base station 100 (the third transmission processing unit 155) precodes the symbol sequence (after phase rotation) (S681). Then, the process ends.

(2) Reception Process

Figure 37:
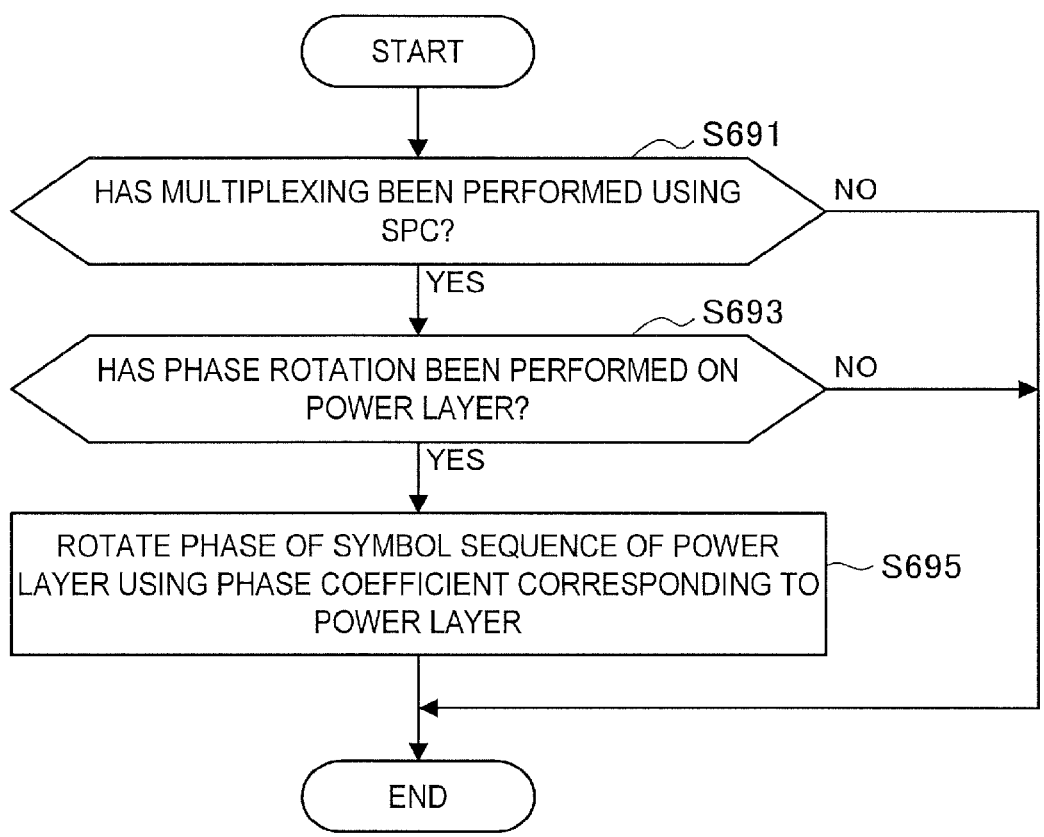
FIG. 37 is a flowchart illustrating an example of a schematic flow of a reception process of a terminal device according to the second embodiment.

FIG. 37 is a flowchart illustrating an example of a schematic flow of a reception process of the terminal device 200 according to the second embodiment.

When multiplexing using SPC has been performed (S691: YES) and phase rotation has been performed for a power layer while transmission is performed (S693: YES), the terminal device 200 rotates the phase of the symbol sequence of the power layer using the phase coefficient corresponding to the power layer (S695). This rotation is a reverse of the rotation performed when transmission is performed. Then, the process ends.

When multiplexing using SPC has not been performed (S691: NO) and phase rotation has not been performed (S693: NO), the process ends without phase rotation.

6.3. Modified Example

Next, a modified example of the second embodiment will be described with reference to FIG. 38.

As described above, the base station 100 multiplexes power layers using SPC. Particularly, in the modified example of the second embodiment, spatial layers are multiplexed while power layers are multiplexed using SPC.

For example, the base station 100 generates transmission signal sequences of multiple power layers multiplexed using power allocation for each of one or more spatial layers and rotates a phase of a transmission signal sequence of a power layer using a phase coefficient corresponding to the power layer for each of one or more of the multiple power layers. That is, multiplexing using power allocation is performed in spatial layers. A specific example will be described with reference to FIG. 38.

Figure 38:
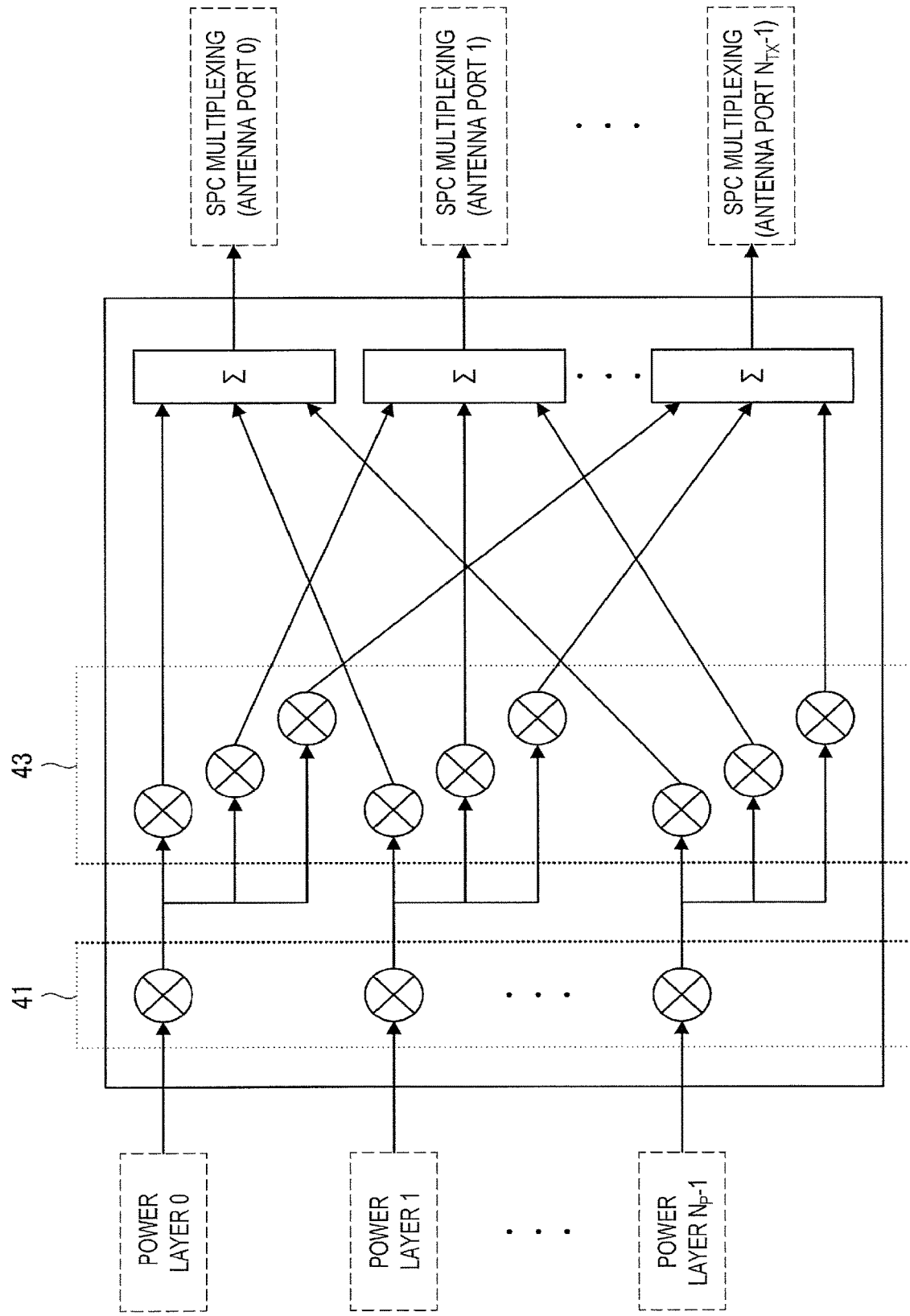
FIG. 38 is an explanatory diagram for explaining an example of a process in a case of a combination of spatial multiplexing and multiplexing using power allocation.

FIG. 38 is an explanatory diagram for explaining an example of a process in a case of a combination of spatial multiplexing and multiplexing using power allocation. Referring to FIG. 38, a process 41 and a process 43 in one spatial layer are illustrated. The process 41 is phase rotation, and the process 43 is precoding. More specifically, in the process 41, for each of power layers 0 to $N_P-1$, a phase of a symbol sequence of the power layer is rotated using a phase coefficient corresponding to the power layer. That is, phase rotation is performed differently for the power layers. In addition, in the process 43, precoding for a symbol sequence is performed using a precoding matrix corresponding to the spatial layer. That is, common precoding is performed in the spatial layer. Further, different precoding matrices are used in two or more spatial layers. In addition, for example, a symbol of each power layer is a data signal symbol.

(a) Multiplexing Based on Propagation Characteristics

For example, the base station 100 multiplexes spatial layers and power layers in consideration of propagation characteristics for the user (the terminal device 200). There are no special differences in the description of this fact between the first modified example of the first embodiment and the modified example of the second embodiment. Accordingly, redundant descriptions will be omitted herein.

(b) Example of Multiplexing

There are no special differences in the description of an example of multiplexing between the first modified example and the first embodiment of the modified example of the second embodiment. Accordingly, redundant descriptions will be omitted herein.

7. APPLICATION EXAMPLE

The technology of the present disclosure can be applied to various products. The base station 100 may be realized as any type of evolved node B (eNB), for example, a macro eNB, a small eNB, or the like. A small eNB may be an eNB that covers a smaller cell than a macro cell, such as a pico eNB, a micro eNB, or a home (femto) eNB. Alternatively, the base station 100 may be realized as another type of base station such as a node B or a base transceiver station (BTS). The base station 100 may include a main body that controls radio communication (also referred to as a base station device) and one or more remote radio heads (RRHs) disposed in a different place from the main body. In addition, various types of terminals to be described below may operate as the base station 100 by temporarily or semi-permanently executing the base station function. Furthermore, at least some of constituent elements of the base station 100 may be realized in a base station device or a module for a base station device.

In addition, the terminal device 200 may be realized as, for example, a mobile terminal such as a smartphone, a tablet personal computer (PC), a notebook PC, a portable game terminal, a portable/dongle type mobile router, or a digital camera, or an in-vehicle terminal such as a car navigation device. In addition, the terminal device 200 may be realized as a terminal that performs machine-to-machine (M2M) communication (also referred to as a machine type communication (MTC) terminal). Furthermore, at least some of constituent elements of the terminal device 200 may be realized in a module mounted in such a terminal (for example, an integrated circuit module configured in one die).

7.1. Application Example with Regard to Base Station

First Application Example

Figure 39:
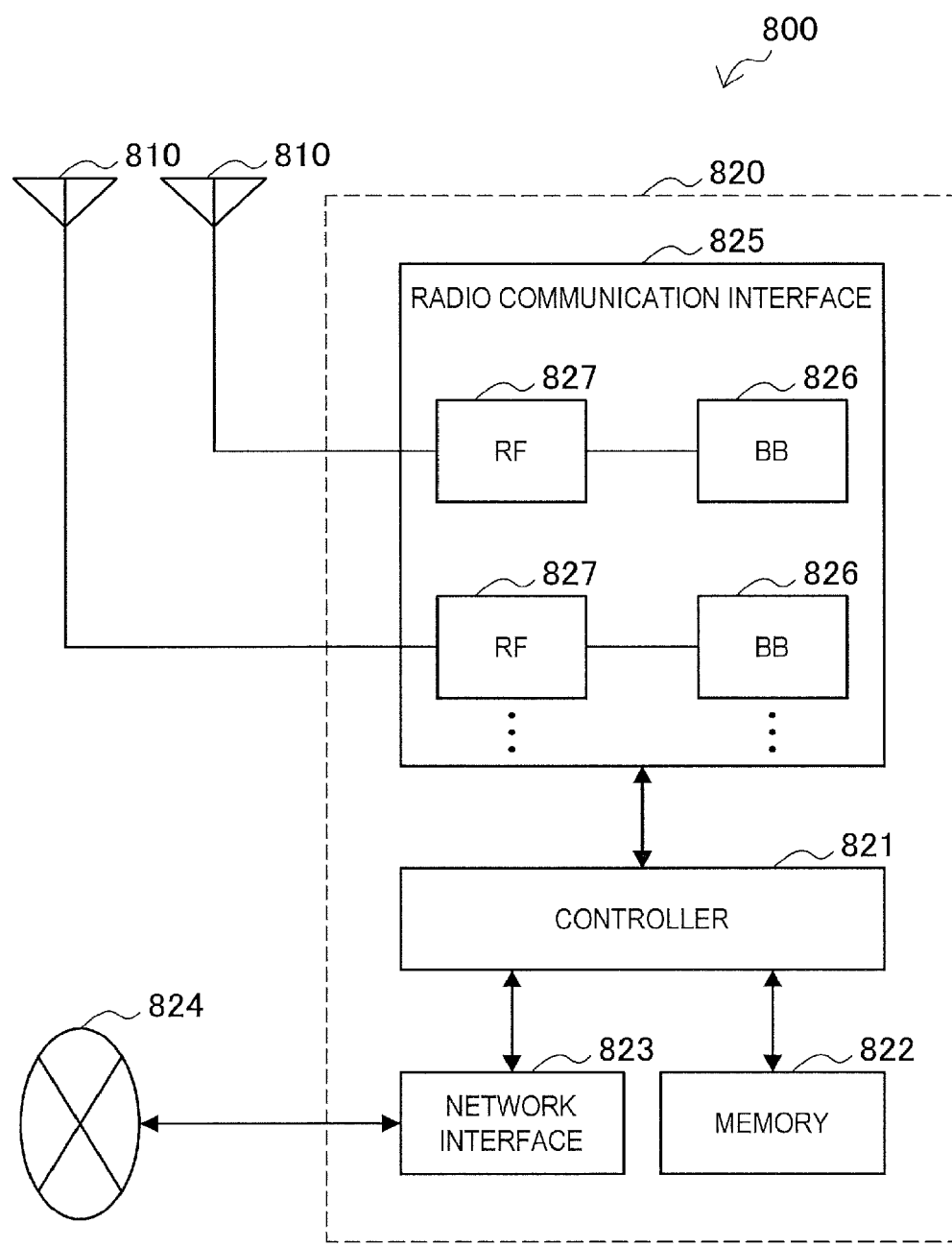
FIG. 39 is a block diagram illustrating a first example of a schematic configuration of an eNB.

FIG. 39 is a block diagram illustrating a first example of a schematic configuration of an eNB to which the technology of the present disclosure may be applied. An eNB 800 includes one or more antennas 810 and a base station device 820. Each antenna 810 and the base station device 820 may be connected to each other via an RF cable.

Each of the antennas 810 includes a single or multiple antenna elements (such as multiple antenna elements included in an MIMO antenna), and is used for the base station device 820 to transmit and receive radio signals. The eNB 800 may include the multiple antennas 810, as illustrated in FIG. 39. For example, the multiple antennas 810 may be compatible with multiple frequency bands used by the eNB 800. Although FIG. 39 illustrates the example in which the eNB 800 includes the multiple antennas 810, the eNB 800 may also include a single antenna 810.

The base station device 820 includes a controller 821, a memory 822, a network interface 823, and a radio communication interface 825.

The controller 821 may be, for example, a CPU or a DSP, and operates various functions of a higher layer of the base station device 820. For example, the controller 821 generates a data packet from data in signals processed by the radio communication interface 825, and transfers the generated packet via the network interface 823. The controller 821 may bundle data from multiple base band processors to generate the bundled packet, and transfer the generated bundled packet. The controller 821 may have logical functions of performing control such as radio resource control, radio bearer control, mobility management, admission control, and scheduling. The control may be performed in corporation with an eNB or a core network node in the vicinity. The memory 822 includes RAM and ROM, and stores a program that is executed by the controller 821, and various types of control data (such as a terminal list, transmission power data, and scheduling data).

The network interface 823 is a communication interface for connecting the base station device 820 to a core network 824. The controller 821 may communicate with a core network node or another eNB via the network interface 823. In this case, the eNB 800 may be connected to a core network node or another eNB through a logical interface (e.g. S1 interface or X2 interface). The network interface 823 may also be a wired communication interface or a radio communication interface for radio backhaul. If the network interface 823 is a radio communication interface, the network interface 823 may use a higher frequency band for radio communication than a frequency band used by the radio communication interface 825.

The radio communication interface 825 supports any cellular communication scheme such as Long Term Evolution (LTE) and LTE-Advanced, and provides radio connection to a terminal positioned in a cell of the eNB 800 via the antenna 810. The radio communication interface 825 may typically include, for example, a baseband (BB) processor 826 and an RF circuit 827. The BB processor 826 may perform, for example, encoding/decoding, modulating/demodulating, and multiplexing/demultiplexing, and performs various types of signal processing of layers (such as L1, medium access control (MAC), radio link control (RLC), and a packet data convergence protocol (PDCP)). The BB processor 826 may have a part or all of the above-described logical functions instead of the controller 821. The BB processor 826 may be a memory that stores a communication control program, or a module that includes a processor and a related circuit configured to execute the program. Updating the program may allow the functions of the BB processor 826 to be changed. The module may be a card or a blade that is inserted into a slot of the base station device 820. Alternatively, the module may also be a chip that is mounted on the card or the blade. Meanwhile, the RF circuit 827 may include, for example, a mixer, a filter, and an amplifier, and transmits and receives radio signals via the antenna 810.

The radio communication interface 825 may include the multiple BB processors 826, as illustrated in FIG. 39. For example, the multiple BB processors 826 may be compatible with multiple frequency bands used by the eNB 800. The radio communication interface 825 may include the multiple RF circuits 827, as illustrated in FIG. 39. For example, the multiple RF circuits 827 may be compatible with multiple antenna elements. Although FIG. 39 illustrates the example in which the radio communication interface 825 includes the multiple BB processors 826 and the multiple RF circuits 827, the radio communication interface 825 may also include a single BB processor 826 or a single RF circuit 827.

In the eNB 800 shown in FIG. 39, one or more structural elements included in the processing unit 150 (the first transmission processing unit 151, the second transmission processing unit 153, the third transmission processing unit 155 and/or the reporting unit 157) described with reference to FIG. 8 may be implemented by the radio communication interface 825. Alternatively, at least some of these constituent elements may be implemented by the controller 821. As an example, a module which includes a part (for example, the BB processor 826) or all of the radio communication interface 825 and/or the controller 821 may be mounted in eNB 800, and the one or more structural elements may be implemented by the module. In this case, the module may store a program for causing the processor to function as the one or more structural elements (i.e., a program for causing the processor to execute operations of the one or more structural elements) and may execute the program. As another example, the program for causing the processor to function as the one or more structural elements may be installed in the eNB 800, and the radio communication interface 825 (for example, the BB processor 826) and/or the controller 821 may execute the program. As described above, the eNB 800, the base station device 820, or the module may be provided as a device which includes the one or more structural elements, and the program for causing the processor to function as the one or more structural elements may be provided. In addition, a readable recording medium in which the program is recorded may be provided.

In addition, in the eNB 800 shown in FIG. 39, the radio communication unit 120 described with reference to FIG. 8 may be implemented by the radio communication interface 825 (for example, the RF circuit 827). Moreover, the antenna unit 110 may be implemented by the antenna 810. In addition, the network communication unit 130 may be implemented by the controller 821 and/or the network interface 823.

Second Application Example

Figure 40:
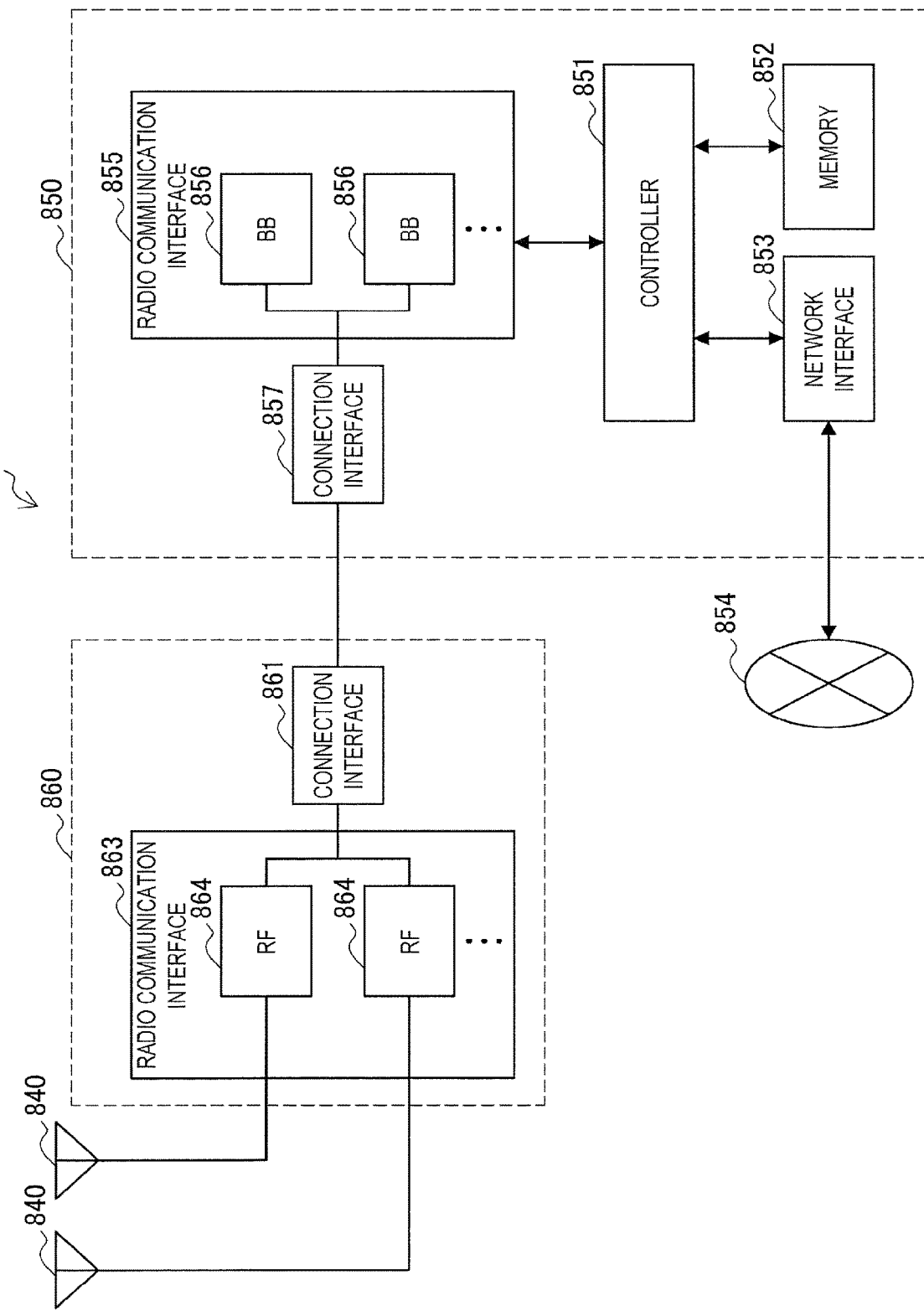
FIG. 40 is a block diagram illustrating a second example of the schematic configuration of the eNB.

FIG. 40 is a block diagram illustrating a second example of a schematic configuration of an eNB to which the technology of the present disclosure may be applied. An eNB 830 includes one or more antennas 840, a base station device 850, and an RRH 860. Each antenna 840 and the RRH 860 may be connected to each other via an RF cable. The base station device 850 and the RRH 860 may be connected to each other via a high speed line such as an optical fiber cable.

Each of the antennas 840 includes a single or multiple antenna elements (such as multiple antenna elements included in an MIMO antenna), and is used for the RRH 860 to transmit and receive radio signals. The eNB 830 may include the multiple antennas 840, as illustrated in FIG. 40. For example, the multiple antennas 840 may be compatible with multiple frequency bands used by the eNB 830. Although FIG. 40 illustrates the example in which the eNB 830 includes the multiple antennas 840, the eNB 830 may also include a single antenna 840.

The base station device 850 includes a controller 851, a memory 852, a network interface 853, a radio communication interface 855, and a connection interface 857. The controller 851, the memory 852, and the network interface 853 are the same as the controller 821, the memory 822, and the network interface 823 described with reference to FIG. 39.

The radio communication interface 855 supports any cellular communication scheme such as LTE and LTE-Advanced, and provides radio communication to a terminal positioned in a sector corresponding to the RRH 860 via the RRH 860 and the antenna 840. The radio communication interface 855 may typically include, for example, a BB processor 856. The BB processor 856 is the same as the BB processor 826 described with reference to FIG. 39, except the BB processor 856 is connected to the RF circuit 864 of the RRH 860 via the connection interface 857. The radio communication interface 855 may include the multiple BB processors 856, as illustrated in FIG. 40. For example, the multiple BB processors 856 may be compatible with multiple frequency bands used by the eNB 830. Although FIG. 40 illustrates the example in which the radio communication interface 855 includes the multiple BB processors 856, the radio communication interface 855 may also include a single BB processor 856.

The connection interface 857 is an interface for connecting the base station device 850 (radio communication interface 855) to the RRH 860. The connection interface 857 may also be a communication module for communication in the above-described high speed line that connects the base station device 850 (radio communication interface 855) to the RRH 860.

The RRH 860 includes a connection interface 861 and a radio communication interface 863.

The connection interface 861 is an interface for connecting the RRH 860 (radio communication interface 863) to the base station device 850. The connection interface 861 may also be a communication module for communication in the above-described high speed line.

The radio communication interface 863 transmits and receives radio signals via the antenna 840. The radio communication interface 863 may typically include, for example, the RF circuit 864. The RF circuit 864 may include, for example, a mixer, a filter, and an amplifier, and transmits and receives radio signals via the antenna 840. The radio communication interface 863 may include multiple RF circuits 864, as illustrated in FIG. 40. For example, the multiple RF circuits 864 may support multiple antenna elements. Although FIG. 40 illustrates the example in which the radio communication interface 863 includes the multiple RF circuits 864, the radio communication interface 863 may also include a single RF circuit 864.

In the eNB 830 shown in FIG. 40, one or more structural elements included in the processing unit 150 (the first transmission processing unit 151, the second transmission processing unit 153, the third transmission processing unit 155 and/or the reporting unit 157) described with reference to FIG. 8 may be implemented by the radio communication interface 855 and/or the radio communication interface 863. Alternatively, at least some of these constituent elements may be implemented by the controller 851. As an example, a module which includes a part (for example, the BB processor 856) or all of the radio communication interface 855 and/or the controller 851 may be mounted in eNB 830, and the one or more structural elements may be implemented by the module. In this case, the module may store a program for causing the processor to function as the one or more structural elements (i.e., a program for causing the processor to execute operations of the one or more structural elements) and may execute the program. As another example, the program for causing the processor to function as the one or more structural elements may be installed in the eNB 830, and the radio communication interface 855 (for example, the BB processor 856) and/or the controller 851 may execute the program. As described above, the eNB 830, the base station device 850, or the module may be provided as a device which includes the one or more structural elements, and the program for causing the processor to function as the one or more structural elements may be provided. In addition, a readable recording medium in which the program is recorded may be provided.

Figure 8:
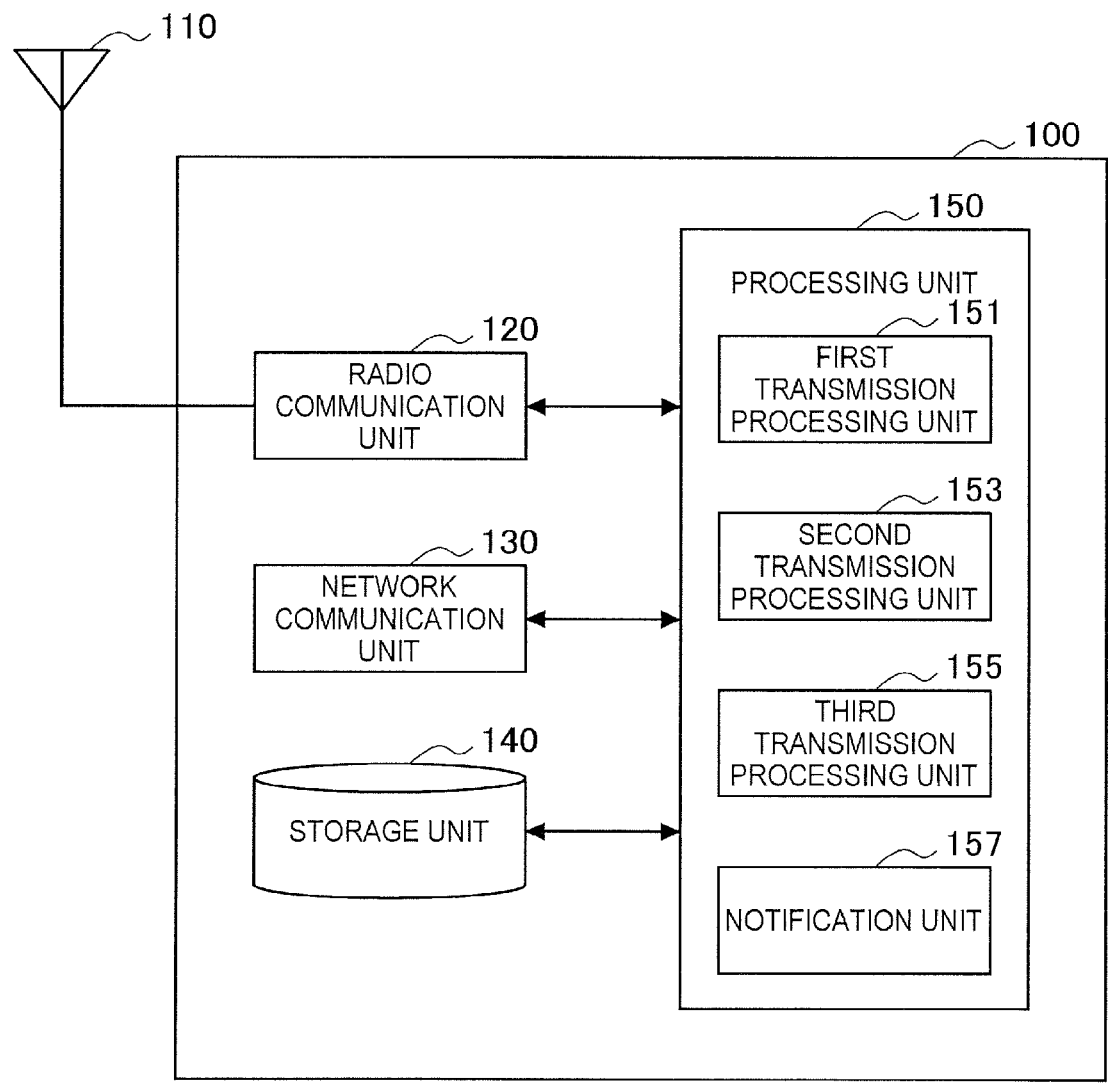
FIG. 8 is a block diagram illustrating an example of a configuration of a base station according to the embodiment.

In addition, in the eNB 830 shown in FIG. 40, the radio communication unit 120 described, for example, with reference to FIG. 8 may be implemented by the radio communication interface 863 (for example, the RF circuit 864). Moreover, the antenna unit 110 may be implemented by the antenna 840. In addition, the network communication unit 130 may be implemented by the controller 851 and/or the network interface 853.

7.2. Application Example with Regard to Terminal Device

First Application Example

Figure 41:
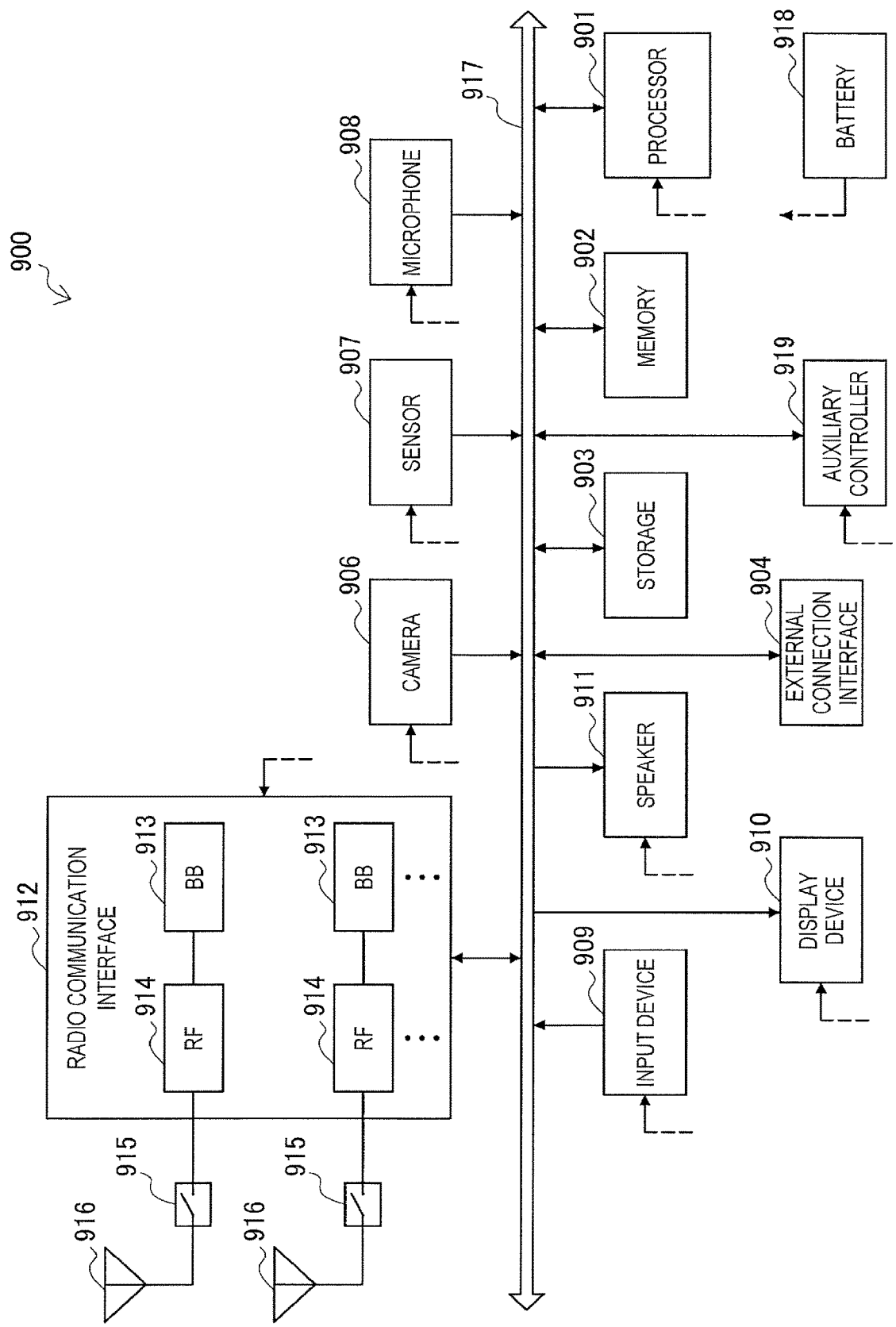
FIG. 41 is a block diagram illustrating an example of a schematic configuration of a smartphone.

FIG. 41 is a block diagram illustrating an example of a schematic configuration of a smartphone 900 to which the technology of the present disclosure may be applied. The smartphone 900 includes a processor 901, a memory 902, a storage 903, an external connection interface 904, a camera 906, a sensor 907, a microphone 908, an input device 909, a display device 910, a speaker 911, a radio communication interface 912, one or more antenna switches 915, one or more antennas 916, a bus 917, a battery 918, and an auxiliary controller 919.

The processor 901 may be, for example, a CPU or a system on a chip (SoC), and controls functions of an application layer and another layer of the smartphone 900. The memory 902 includes RAM and ROM, and stores a program that is executed by the processor 901, and data. The storage 903 may include a storage medium such as a semiconductor memory and a hard disk. The external connection interface 904 is an interface for connecting an external device such as a memory card and a universal serial bus (USB) device to the smartphone 900.

The camera 906 includes an image sensor such as a charge coupled device (CCD) and a complementary metal oxide semiconductor (CMOS), and generates a captured image. The sensor 907 may include a group of sensors such as a measurement sensor, a gyro sensor, a geomagnetic sensor, and an acceleration sensor. The microphone 908 converts sounds that are input to the smartphone 900 to audio signals. The input device 909 includes, for example, a touch sensor configured to detect touch onto a screen of the display device 910, a keypad, a keyboard, a button, or a switch, and receives an operation or an information input from a user. The display device 910 includes a screen such as a liquid crystal display (LCD) and an organic light-emitting diode (OLED) display, and displays an output image of the smartphone 900. The speaker 911 converts audio signals that are output from the smartphone 900 to sounds.

The radio communication interface 912 supports any cellular communication scheme such as LTE and LTE-Advanced, and performs radio communication. The radio communication interface 912 may typically include, for example, a BB processor 913 and an RF circuit 914. The BB processor 913 may perform, for example, encoding/decoding, modulating/demodulating, and multiplexing/demultiplexing, and performs various types of signal processing for radio communication. Meanwhile, the RF circuit 914 may include, for example, a mixer, a filter, and an amplifier, and transmits and receives radio signals via the antenna 916. The radio communication interface 912 may also be a one chip module that has the BB processor 913 and the RF circuit 914 integrated thereon. The radio communication interface 912 may include the multiple BB processors 913 and the multiple RF circuits 914, as illustrated in FIG. 41. Although FIG. 41 illustrates the example in which the radio communication interface 912 includes the multiple BB processors 913 and the multiple RF circuits 914, the radio communication interface 912 may also include a single BB processor 913 or a single RF circuit 914.

Furthermore, in addition to a cellular communication scheme, the radio communication interface 912 may support another type of radio communication scheme such as a short-distance wireless communication scheme, a near field communication scheme, and a radio local area network (LAN) scheme. In that case, the radio communication interface 912 may include the BB processor 913 and the RF circuit 914 for each radio communication scheme.

Each of the antenna switches 915 switches connection destinations of the antennas 916 among multiple circuits (such as circuits for different radio communication schemes) included in the radio communication interface 912.

Each of the antennas 916 includes a single or multiple antenna elements (such as multiple antenna elements included in an MIMO antenna), and is used for the radio communication interface 912 to transmit and receive radio signals. The smartphone 900 may include the multiple antennas 916, as illustrated in FIG. 41. Although FIG. 41 illustrates the example in which the smartphone 900 includes the multiple antennas 916, the smartphone 900 may also include a single antenna 916.

Furthermore, the smartphone 900 may include the antenna 916 for each radio communication scheme. In that case, the antenna switches 915 may be omitted from the configuration of the smartphone 900.

The bus 917 connects the processor 901, the memory 902, the storage 903, the external connection interface 904, the camera 906, the sensor 907, the microphone 908, the input device 909, the display device 910, the speaker 911, the radio communication interface 912, and the auxiliary controller 919 to each other. The battery 918 supplies power to blocks of the smartphone 900 illustrated in FIG. 41 via feeder lines, which are partially shown as dashed lines in the figure. The auxiliary controller 919 operates a minimum necessary function of the smartphone 900, for example, in a sleep mode.

In the smartphone 900 shown in FIG. 41, the information acquisition unit 241 and/or the reception processing unit 243 described with reference to FIG. 9 may be implemented by the radio communication interface 912. Alternatively, at least some of these constituent elements may be implemented by the processor 901 or the auxiliary controller 919. As an example, a module which includes a part (for example, the BB processor 913) or all of the radio communication interface 912, the processor 901 and/or the auxiliary controller 919 may be mounted in the smartphone 900, and the information acquisition unit 241 and/or the reception processing unit 243 may be implemented by the module. In this case, the module may store a program for causing the processor to function as the information acquisition unit 241 and/or the reception processing unit 243 (i.e., a program for causing the processor to execute operations of the information acquisition unit 241 and/or the reception processing unit 243) and may execute the program. As another example, the program for causing the processor to function as the information acquisition unit 241 and/or the reception processing unit 243 may be installed in the smartphone 900, and the radio communication interface 912 (for example, the BB processor 913), the processor 901 and/or the auxiliary controller 919 may execute the program. As described above, the smartphone 900 or the module may be provided as a device which includes the information acquisition unit 241 and/or the reception processing unit 243, and the program for causing the processor to function as the information acquisition unit 241 and/or the reception processing unit 243 may be provided. In addition, a readable recording medium in which the program is recorded may be provided.

Figure 9:
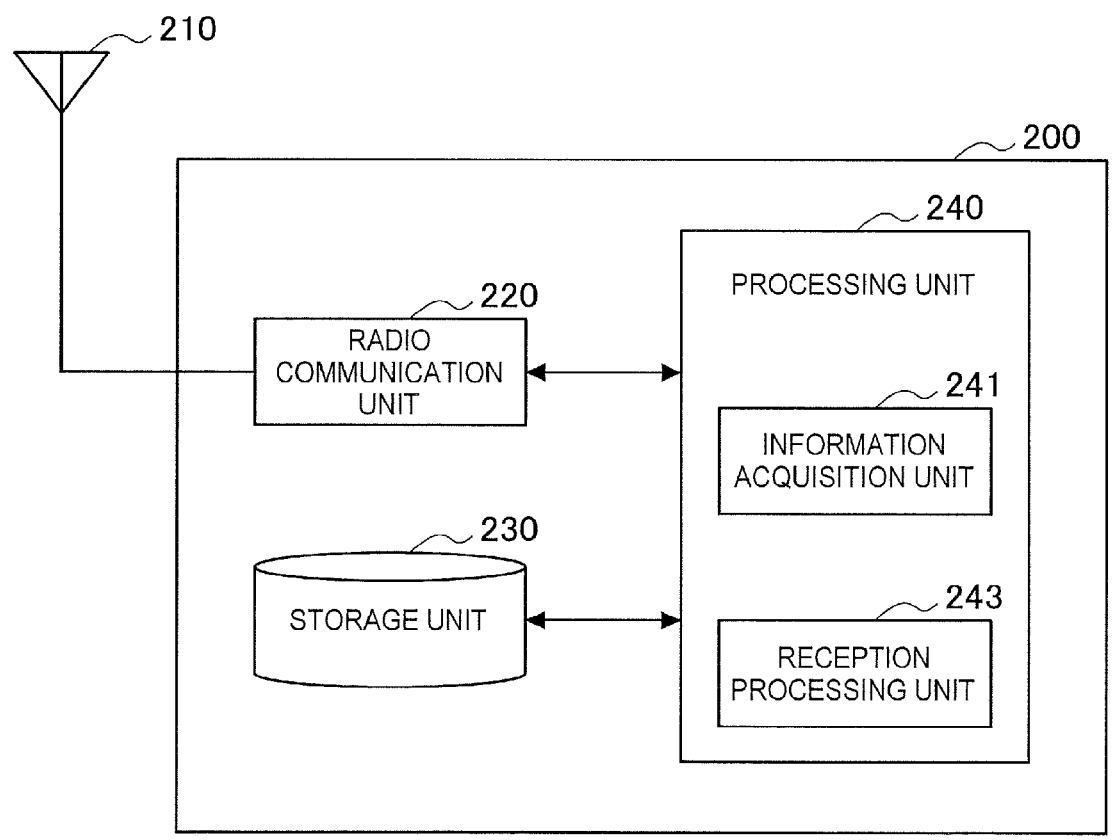
FIG. 9 is a block diagram illustrating an example of a configuration of a terminal device according to the embodiment.

In addition, in the smartphone 900 shown in FIG. 41, the radio communication unit 220 described, for example, with reference to FIG. 9 may be implemented by the radio communication interface 912 (for example, the RF circuit 914). Moreover, the antenna unit 210 may be implemented by the antenna 916.

Second Application Example

Figure 42:
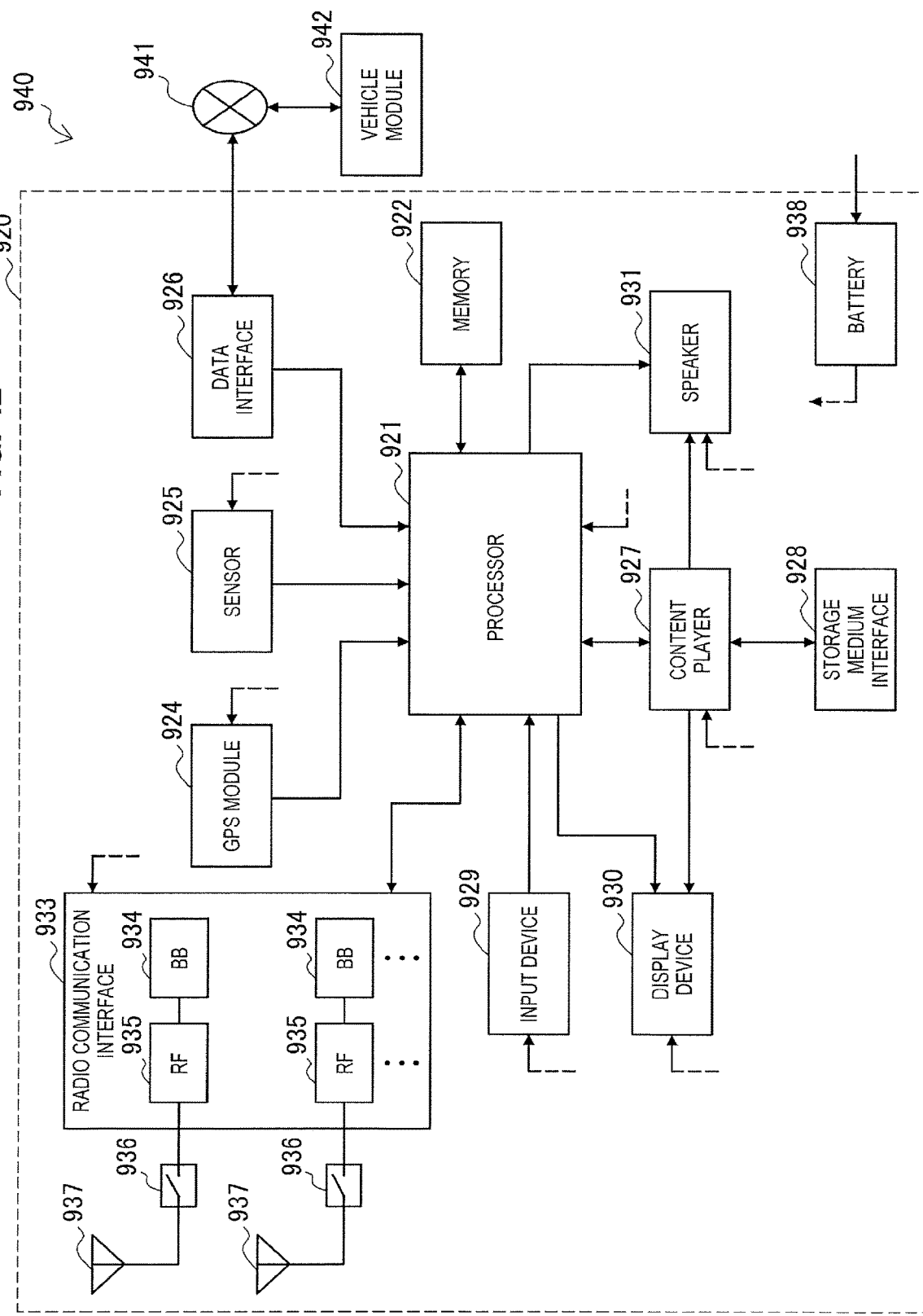
FIG. 42 is a block diagram illustrating an example of a schematic configuration of a car navigation device.

FIG. 42 is a block diagram illustrating an example of a schematic configuration of a car navigation device 920 to which the technology of the present disclosure may be applied. The car navigation device 920 includes a processor 921, a memory 922, a global positioning system (GPS) module 924, a sensor 925, a data interface 926, a content player 927, a storage medium interface 928, an input device 929, a display device 930, a speaker 931, a radio communication interface 933, one or more antenna switches 936, one or more antennas 937, and a battery 938.

The processor 921 may be, for example, a CPU or a SoC, and controls a navigation function and another function of the car navigation device 920. The memory 922 includes RAM and ROM, and stores a program that is executed by the processor 921, and data.

The GPS module 924 uses GPS signals received from a GPS satellite to measure a position (such as latitude, longitude, and altitude) of the car navigation device 920. The sensor 925 may include a group of sensors such as a gyro sensor, a geomagnetic sensor, and a barometric sensor. The data interface 926 is connected to, for example, an in-vehicle network 941 via a terminal that is not shown, and acquires data generated by the vehicle, such as vehicle speed data.

The content player 927 reproduces content stored in a storage medium (such as a CD and a DVD) that is inserted into the storage medium interface 928. The input device 929 includes, for example, a touch sensor configured to detect touch onto a screen of the display device 930, a button, or a switch, and receives an operation or an information input from a user. The display device 930 includes a screen such as a LCD or an OLED display, and displays an image of the navigation function or content that is reproduced. The speaker 931 outputs sounds of the navigation function or the content that is reproduced.

The radio communication interface 933 supports any cellular communication scheme such as LET and LTE-Advanced, and performs radio communication. The radio communication interface 933 may typically include, for example, a BB processor 934 and an RF circuit 935. The BB processor 934 may perform, for example, encoding/decoding, modulating/demodulating, and multiplexing/demultiplexing, and performs various types of signal processing for radio communication. Meanwhile, the RF circuit 935 may include, for example, a mixer, a filter, and an amplifier, and transmits and receives radio signals via the antenna 937. The radio communication interface 933 may be a one chip module having the BB processor 934 and the RF circuit 935 integrated thereon. The radio communication interface 933 may include the multiple BB processors 934 and the multiple RF circuits 935, as illustrated in FIG. 42. Although FIG. 42 illustrates the example in which the radio communication interface 933 includes the multiple BB processors 934 and the multiple RF circuits 935, the radio communication interface 933 may also include a single BB processor 934 or a single RF circuit 935.

Furthermore, in addition to a cellular communication scheme, the radio communication interface 933 may support another type of radio communication scheme such as a short-distance wireless communication scheme, a near field communication scheme, and a radio LAN scheme. In that case, the radio communication interface 933 may include the BB processor 934 and the RF circuit 935 for each radio communication scheme.

Each of the antenna switches 936 switches connection destinations of the antennas 937 among multiple circuits (such as circuits for different radio communication schemes) included in the radio communication interface 933.

Each of the antennas 937 includes a single or multiple antenna elements (such as multiple antenna elements included in an MIMO antenna), and is used for the radio communication interface 933 to transmit and receive radio signals. The car navigation device 920 may include the multiple antennas 937, as illustrated in FIG. 42. Although FIG. 42 illustrates the example in which the car navigation device 920 includes the multiple antennas 937, the car navigation device 920 may also include a single antenna 937.

Furthermore, the car navigation device 920 may include the antenna 937 for each radio communication scheme. In that case, the antenna switches 936 may be omitted from the configuration of the car navigation device 920.

The battery 938 supplies power to blocks of the car navigation device 920 illustrated in FIG. 42 via feeder lines that are partially shown as dashed lines in the figure. The battery 938 accumulates power supplied form the vehicle.

In the car navigation device 920 shown in FIG. 42, the information acquisition unit 241 and/or the reception processing unit 243 described with reference to FIG. 9 may be implemented by the radio communication interface 933. Alternatively, at least some of these constituent elements may be implemented by the processor 921. As an example, a module which includes a part (for example, the BB processor 934) or all of the radio communication interface 933 and/or the processor 921 may be mounted in the car navigation device 920, and the information acquisition unit 241 and/or the reception processing unit 243 may be implemented by the module. In this case, the module may store a program for causing the processor to function as the information acquisition unit 241 and/or the reception processing unit 243 (i.e., a program for causing the processor to execute operations of the information acquisition unit 241 and/or the reception processing unit 243) and may execute the program. As another example, the program for causing the processor to function as the information acquisition unit 241 and/or the reception processing unit 243 may be installed in the car navigation device 920, and the radio communication interface 933 (for example, the BB processor 934) and/or the processor 921 may execute the program. As described above, the car navigation device 920 or the module may be provided as a device which includes the information acquisition unit 241 and/or the reception processing unit 243, and the program for causing the processor to function as the information acquisition unit 241 and/or the reception processing unit 243 may be provided. In addition, a readable recording medium in which the program is recorded may be provided.

In addition, in the car navigation device 920 shown in FIG. 42, the radio communication unit 220 described, for example, with reference to FIG. 9 may be implemented by the radio communication interface 933 (for example, the RF circuit 935). Moreover, the antenna unit 210 may be implemented by the antenna 937.

The technology of the present disclosure may also be realized as an in-vehicle system (or a vehicle) 940 including one or more blocks of the car navigation device 920, the in-vehicle network 941, and a vehicle module 942. In other words, the in-vehicle system (or a vehicle) 940 may be provided as a device which includes the information acquisition unit 241 and/or the reception processing unit 243. The vehicle module 942 generates vehicle data such as vehicle speed, engine speed, and trouble information, and outputs the generated data to the in-vehicle network 941.

8. CONCLUSION

So far, devices and processes according to embodiments of the present disclosure have been described with reference to FIGS. 1 to 42.

According to an embodiment of the present disclosure, the base station 100 includes the first transmission processing unit 151, which generates transmission signal sequences of multiple power layers multiplexed using power allocation, and the second transmission processing unit 153, which processes a transmission signal sequence of a corresponding power layer for each of one or more of the multiple power layers using an interleaver or a phase coefficient corresponding to the power layer.

According to an embodiment of the present disclosure, the terminal device 200 includes the information acquisition unit 241, which acquires a deinterleaver or a phase coefficient corresponding to each of at least one of multiple power layers multiplexed using power allocation, and the reception processing unit 243, which performs a reception process using the deinterleaver or the phase coefficient corresponding to each of the at least one power layer.

Accordingly, for example, it is possible to further improve decoding accuracy when multiplexing/multiple access using power allocation is performed.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, although examples using techniques of existing systems such as LTE, LTE-A, and the like have been described with respect to communication of the base station and the terminal device, the present disclosure is certainly not limited to such examples. A technique of a new system may be used. As an example, generation of a transmission signal sequence by the first transmission processing unit of the base station may be performed by a technique of a new system.

In addition, for example, although the base station is a transmission device and the terminal device is a reception device with respect to multiplexing using power allocation, the present disclosure is not limited to such an example. The transmission device and the reception device may be other devices.

In addition, processing steps in processes of the present specification may not necessarily be executed in, for example, a time series manner in the order described in the flowcharts or sequence diagrams. The processing steps in the processes may also be executed in, for example, a different order from the order described in the flowcharts or sequence diagrams, or may be executed in parallel.

In addition, a computer program for causing a processor (for example, a CPU, a DSP, or the like) provided in a device of the present specification (for example, a base station, a base station device or a module for a base station device, or a terminal device or a module for a terminal device) to function as a constituent element of the device (for example, the first transmission processing unit and the second transmission processing unit, or the information acquisition unit 241 and the reception processing unit 243, or the like) (in other words, a computer program for causing the processor to execute operations of the constituent element of the device) can also be created. In addition, a recording medium in which the computer program is recorded may also be provided. Further, a device that includes a memory in which the computer program is stored and one or more processors that can execute the computer program (a base station, a base station device or a module for a base station device, or a terminal device or a module for a terminal device) may also be provided. In addition, a method including an operation of the constituent element of the device (for example, the first transmission processing unit and the second transmission processing unit, or the information acquisition unit 241 and the reception processing unit 243, or the like) is also included in the technology of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

An apparatus including:

a first transmission processing unit that generates transmission signal sequences of multiple power layers that are to be multiplexed using power allocation; and a second transmission processing unit that processes a transmission signal sequence of a power layer using an interleaver, a scrambler, or a phase coefficient corresponding to the power layer for each of one or more of the multiple power layers.

(2)

The apparatus according to (1), in which the second transmission processing unit interleaves the transmission signal sequence of the power layer using the interleaver corresponding to the power layer.

(3)

The apparatus according to (2), in which the transmission signal sequence of the power layer is a transmission signal sequence destined for a user, and the interleaver corresponding to the power layer is an interleaver specific to the user.

(4)

The apparatus according to (2), in which the interleaver corresponding to the power layer is an interleaver specific to the power layer.

(5)

The apparatus according to (1), in which the second transmission processing unit rotates a phase of the transmission signal sequence of the power layer using the phase coefficient corresponding to the power layer.

(6)

The apparatus according to (5), in which the transmission signal sequence is a sequence of data signals to be transmitted, and the second transmission processing unit does not rotate a phase of a reference signal using the phase coefficient corresponding to the power layer.

(7)

The apparatus according to any one of (1) to (6), in which the one or more of the power layers are power layers other than a predetermined number of power layers among the multiple power layers.

(8)

The apparatus according to (7), in which the predetermined number of power layers are power layers to which higher transmission power is allocated than the one or more power layers.

(9)

The apparatus according to (7) or (8), in which the predetermined number of power layers is a single power layer.

(10)

The apparatus according to any one of (1) to (6), in which the one or more power layers are the multiple power layers.

(11)

The apparatus according to any one of (1) to (10), in which a transmission signal sequence of a power layer to which higher transmission power is allocated among the one or more power layers is a transmission signal sequence destined for a user having lower communication quality, and a transmission signal sequence of a power layer to which lower transmission power is allocated among the one or more power layers is a transmission signal sequence destined for a user having higher communication quality.

(12)

The apparatus according to any one of (1) to (11), in which the transmission signal sequence of the power layer is a transmission signal sequence destined for a user, and the apparatus further includes a notification unit that notifies the user of the power layer.

(13)

The apparatus according to (12), in which the notification unit notifies the user of the power layer through downlink control information destined for the user.

(14)

The apparatus according to (12) or (13), in which the notification unit notifies the user of the number of power layers with respect to the multiple power layers.

(15)

The apparatus according to (14), in which the notification unit notifies the user of the number of power layers through downlink control information destined for the user, a signaling message destined for the user, or system information.

(16)

The apparatus according to any one of (12) to (15), in which the notification unit notifies the user of whether the interleaver, the scrambler, or the phase coefficient is used for the transmission signal sequence destined for the user.

(17)

The apparatus according to (16), in which the notification unit notifies the user of whether the interleaver, the scrambler, or the phase coefficient is used through downlink control information destined for the user.

(18)

An apparatus including:

an acquisition unit that acquires a deinterleaver, a descrambler or a phase coefficient corresponding to each of at least one power layer among multiple power layers that are to be multiplexed using power allocation; and a reception processing unit that performs a reception process using the deinterleaver, the descrambler or the phase coefficient corresponding to each of the at least one power layer.

(19)

The apparatus according to (18), in which the at least one power layer is included in one or more power layers other than a predetermined number of power layers among the multiple power layers, and the reception processing unit performs a reception process without using a deinterleaver, a descrambler or a phase coefficient corresponding to each of the predetermined number of power layers.

(20)

The apparatus according to (18) or (19), in which the reception processing unit determines a power layer of which transmission signal sequence is to be processed using an interleaver, a scrambler or a phase coefficient corresponding to the power layer among the multiple power layers.

(21)

The apparatus according to (1), in which the second transmission processing unit scrambles the transmission signal sequence of the power layer using the scrambler corresponding to the power layer.

(22)

The apparatus according to (21), in which the transmission signal sequence of the power layer is a transmission signal sequence destined for a user, and the scrambler corresponding to the power layer is a scrambler specific to the user.

(23)

The apparatus according to (21), in which the scrambler corresponding to the power layer is a scrambler specific to the power layer.

(24)

The apparatus according to any one of (1) to (17), in which the apparatus is a base station, a base station apparatus for the base station, or a module for the base station apparatus.

(25)

The apparatus according to any one of (18) to (20), in which the apparatus is a terminal device or a module for the terminal device.

(26)

The apparatus according to any one of (1) to (25), in which the multiple power layers are layers that are to be multiplexed using SPC.

(27)

A method that is performed by a processor, the method including:

generating transmission signal sequences of multiple power layers that are to be multiplexed using power allocation; and processing a transmission signal sequence of a power layer using an interleaver, a scrambler, or a phase coefficient corresponding to the power layer for each of one or more of the multiple power layers.

(28)

A program causing a processor to execute:

generating transmission signal sequences of multiple power layers that are to be multiplexed using power allocation; and processing a transmission signal sequence of a power layer using an interleaver, a scrambler, or a phase coefficient corresponding to the power layer for each of one or more of the multiple power layers.

(29)

A readable storage medium having a program stored therein, the program causing a processor to execute:

generating transmission signal sequences of multiple power layers that are to be multiplexed using power allocation; and processing a transmission signal sequence of a power layer using an interleaver, a scrambler, or a phase coefficient corresponding to the power layer for each of one or more of the multiple power layers.

(30)

A method that is performed by a processor, the method including:

acquiring a deinterleaver, a descrambler or a phase coefficient corresponding to each of at least one power layer among multiple power layers that are to be multiplexed using power allocation; and performing a reception process using the deinterleaver, the descrambler or the phase coefficient corresponding to each of the at least one power layer.

(31)

A program causing a processor to execute:

acquiring a deinterleaver, a descrambler or a phase coefficient corresponding to each of at least one power layer among multiple power layers that are to be multiplexed using power allocation; and performing a reception process using the deinterleaver, the descrambler or the phase coefficient corresponding to each of the at least one power layer.

(32)

A readable storage medium having a program stored therein, the program causing a processor to execute:

acquiring a deinterleaver, a descrambler or a phase coefficient corresponding to each of at least one power layer among multiple power layers that are to be multiplexed using power allocation; and performing a reception process using the deinterleaver, the descrambler or the phase coefficient corresponding to each of the at least one power layer.

REFERENCE SIGNS LIST 1 system
100 base station
101 cell
151 first transmission processing unit
153 second transmission processing unit
155 third transmission processing unit
157 notification unit
200 terminal device
241 information acquisition unit
243 reception processing unit

The invention claimed is:

1. A base station, comprising:
a first transmission processor of the base station that generates transmission signal sequences of multiple power layers that are to be multiplexed using power allocation, wherein the multiple power layers are all different levels of power; and
a second transmission processor of the base station that processes a transmission signal sequence of a power layer using a unique scrambler corresponding to a user for which the transmission signal sequence of the power layer is destinated,
wherein the base station further comprises a notificator that notifies the user of the power layer, and
wherein the notificator notifies the user of the power layer through downlink control information destined for the user.

2. The base station according to claim 1, wherein the second transmission processor interleaves the transmission signal sequence of the power layer using the interleaver corresponding to the power layer.

3. The base station according to claim 2, wherein the transmission signal sequence of the power layer is a transmission signal sequence destined for a user, and the interleaver corresponding to the power layer is an interleaver specific to the user.

4. The base station according to claim 2, wherein the interleaver corresponding to the power layer is an interleaver specific to the power layer.

5. The base station according to claim 1, wherein one or more of the power layers are power layers other than a predetermined number of power layers among the multiple power layers.

6. The base station according to claim 5, wherein the predetermined number of power layers are power layers to which higher transmission power is allocated than the one or more power layers.

7. The base station according to claim 5, wherein the predetermined number of power layers is a single power layer.

8. The base station according to claim 1, wherein a transmission signal sequence of a power layer to which higher transmission power is allocated among one or more power layers is a transmission signal sequence destined for a user having lower communication quality, and
a transmission signal sequence of a power layer to which lower transmission power is allocated among the one or more power layers is a transmission signal sequence destined for a user having higher communication quality.

9. The base station according to claim 1, wherein the transmission signal sequence of the power layer is a transmission signal sequence destined for a user, and
the notificator notifies the user of the power layer.

10. The base station according to claim 9, wherein the notificator notifies the user of the power layer through downlink control information destined for the user.

11. The base station according to claim 9, wherein the notificator notifies the user of the number of power layers with respect to the multiple power layers.

12. The base station according to claim 11, wherein the notificator notifies the user of the number of power layers through downlink control information destined for the user, a signaling message destined for the user, or system information.

13. The base station according to claim 9, wherein the notificator notifies the user of whether the interleaver, the scrambler, or the phase coefficient is used for the transmission signal sequence destined for the user.

14. The base station according to claim 13, wherein the notificator notifies the user of whether the interleaver, the scrambler, or the phase coefficient is used through downlink control information destined for the user.

15. The base station according to claim 1, wherein all of the multiple power layers are different from each other.

16. An apparatus, comprising:
an acquirer that acquires a unique descrambler corresponding to the apparatus for which a transmission signal sequence of a power layer is destinated, wherein each power layer among multiple power layers that are to be multiplexed using power allocation, and wherein the multiple power layers are all different levels of power; and
a reception processor that performs a reception process using the descrambler corresponding to the apparatus for which the transmission signal sequence of the power layer is destinated, wherein all of the multiple power layers are different from each other, wherein the reception processor receives the signal sequence of the multiple power layers, wherein the reception processor determines a power layer of which the transmission signal sequence is to be processed using a scrambler corresponding to the apparatus for which the transmission signal sequence of the power layer is destinated, wherein the apparatus further comprises a notificator that receives a notification of the power layer of which the transmission signal sequence is destinated for the apparatus, and wherein the notificator receives the notification of the power layer through downlink control information destined for the apparatus.

17. The apparatus according to claim 16, wherein at least one power layer is included in one or more power layers other than a predetermined number of power layers among the multiple power layers, and the reception processor performs a reception process without using a deinterleaver, a descrambler or a phase coefficient corresponding to each of the predetermined number of power layers.

18. The apparatus according to claim 16, wherein the reception processor determines a power layer of which transmission signal sequence is to be processed using an interleaver, a scrambler or a phase coefficient corresponding to the power layer among the multiple power layers.

* * * * *